United States Patent
Okada et al.

(10) Patent No.: US 6,855,405 B2
(45) Date of Patent: Feb. 15, 2005

(54) SURFACE-COATED CARBIDE ALLOY TOOL

(75) Inventors: Koki Okada, Saitama (JP); Yasuhiko Tashiro, Naka-gun (JP); Eiji Nakamura, Naka-gun (JP)

(73) Assignee: Mitsubishi Materials Corporation, Tokyo (JP)

(*) Notice: Subject to any disclaimer, the term of this patent is extended or adjusted under 35 U.S.C. 154(b) by 110 days.

(21) Appl. No.: 10/108,390

(22) Filed: Mar. 29, 2002

(65) Prior Publication Data

US 2003/0108778 A1 Jun. 12, 2003

(30) Foreign Application Priority Data

| Jun. 11, 2001 | (JP) | P2001-175217 |
| Jun. 26, 2001 | (JP) | P2001-192496 |
| Jul. 4, 2001 | (JP) | P2001-203180 |
| Jul. 26, 2001 | (JP) | P2001-225566 |
| Aug. 29, 2001 | (JP) | P2001-259276 |
| Sep. 3, 2001 | (JP) | P2001-265449 |
| Jan. 31, 2002 | (JP) | P2002-023095 |
| Jan. 31, 2002 | (JP) | P2002-023096 |
| Jan. 31, 2002 | (JP) | P2002-023097 |
| Jan. 31, 2002 | (JP) | P2002-023098 |
| Jan. 31, 2002 | (JP) | P2002-023099 |

(51) Int. Cl.$^7$ ............................................. B23B 27/14
(52) U.S. Cl. ......................... 428/216; 51/307; 51/309; 407/119; 428/336; 428/472; 428/697; 428/698; 428/699; 428/701; 428/702
(58) Field of Search ..................... 428/336, 216, 428/472, 698, 699, 697, 701, 702; 51/307, 309; 407/119

(56) References Cited

U.S. PATENT DOCUMENTS

| 4,474,849 A | 10/1984 | Fujimori et al. |
| 5,549,975 A | * 8/1996 | Schulz et al. |
| 5,656,383 A | * 8/1997 | Tanake et al. |
| 6,103,357 A | 8/2000 | Selinder et al. |
| 6,254,984 B1 | * 7/2001 | Iyori et al. |
| 6,565,957 B2 | * 5/2003 | Nakamura et al. |

FOREIGN PATENT DOCUMENTS

| DE | 3724626 | * 2/1988 |
| DE | 198 15 677 | 10/1999 |
| EP | 0448720 | * 10/1991 |
| JP | 58-107482 | 6/1983 |
| JP | 1-295702 | 11/1989 |
| JP | 02194159 | * 7/1990 |
| JP | 4-308075 | 10/1992 |
| JP | 5-140729 | 6/1993 |
| JP | 5-222551 | 8/1993 |
| JP | 08-039317 | * 2/1996 |
| JP | 10130821 | * 5/1998 |

* cited by examiner

*Primary Examiner*—Archene Turner
(74) *Attorney, Agent, or Firm*—Oblon, Spivak, McClelland, Maier & Neustadt, P.C.

(57) ABSTRACT

A cutting tool has a surface-coated carbide alloy and a wear-resistant coating layer which has excellent adhesion and chipping resistance. The cutting tool has a surface-coated carbide alloy comprising: a tungsten carbide-based carbide alloy substrate having an amorphous layer formed by an arc ion plating surface treatment to an average depth of 1 to 50 nm from the surface; and a wear-resistant coating layer deposited physically and/or chemically on the surface of the tungsten carbide-based carbide alloy substrate, the wear-resistant coating layer comprising: (a) a lower tough layer made of a titanium nitride layer and having an average thickness of 0.1 to 5 μm; and a single-layered or multi-layered surface hard layer which is made of a composite nitride layer of Ti and Al and a composite carbonitride layer of Ti and Al, which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm.

8 Claims, 4 Drawing Sheets

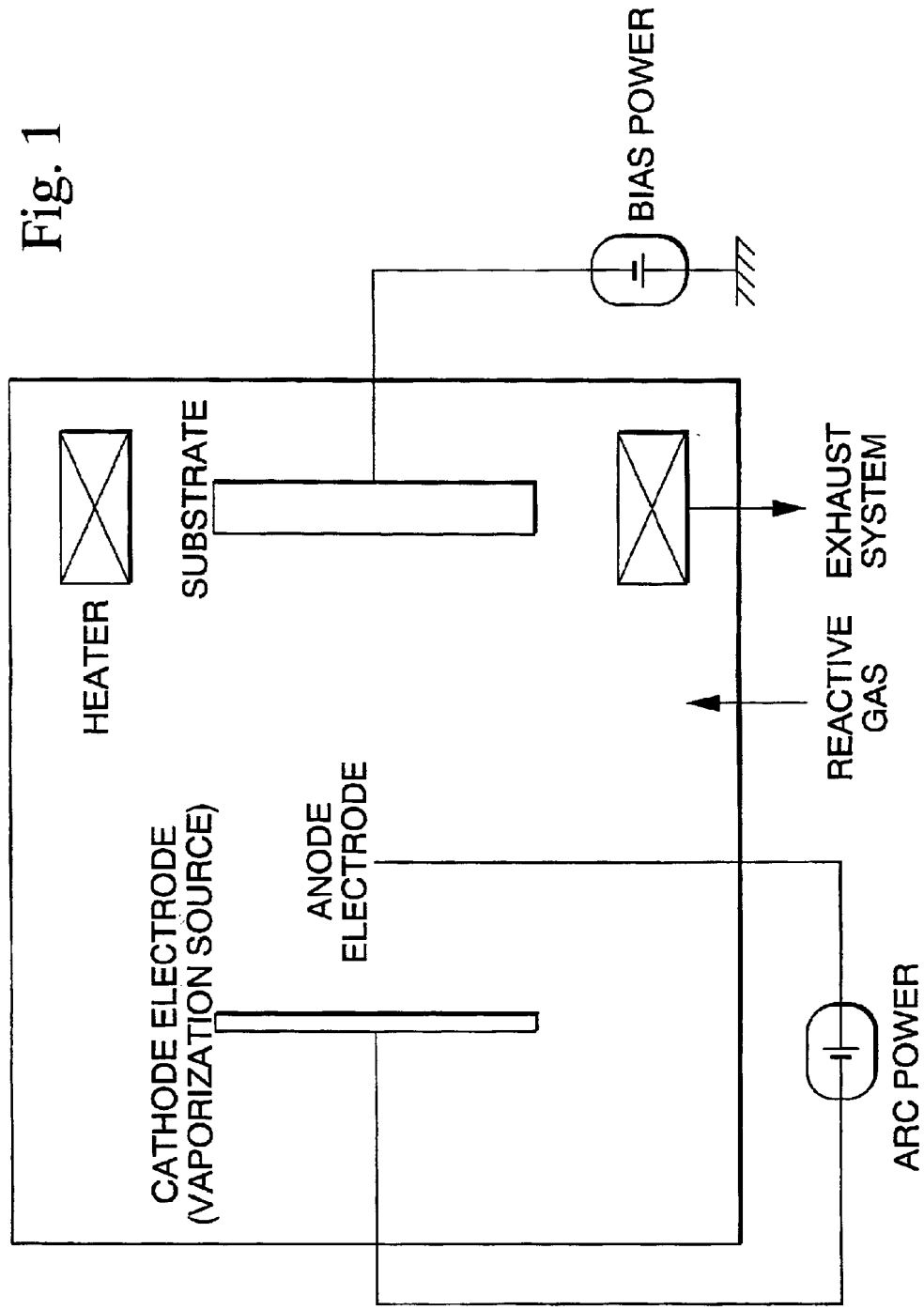

COATED CEMENTED CARBIDE INSERT

CUTTING EDGE  RAKE FACE

FLANK FACE

SURFACE-COATED CARBIDE ALLOY TOOL

BACKGROUND OF THE INVENTION

1. Field of the Invention

The present invention relates to a cutting tool made of a surface-coated carbide alloy (hereinafter referred to as a coated cemented carbide tool) which causes neither peeling nor chipping (microchipping) in a wear-resistant coating layer when various types of steel and cast iron are interruptedly cut under deep cutting conditions such as thick depth-of-cut and high feed where high mechanical and thermal impacts are applied, because the wear-resistant coating layer is superior in adhesion to the surface of a tungsten carbide-based carbide alloy substrate (hereinafter referred to as a cemented carbide substrate) and is also superior in resistance against chipping, thus exhibiting excellent wear resistance for a long period of time.

2. Description of the Related Art

In general, cutting tools include, for example, a throw-away insert to be attached detachably to the tip portion of a bit on cutting and planing of workpieces such as those of various types of steel and cast iron, drill or miniature drill used in drilling of the workpieces materials, and solid type end mill used in planing, fluting and chamfering of workpieces. There is also known a throw-away end milling tool which is used to cut in the same manner as in the case of the solid type end mill after the throw-away insert was detachably attached.

There is known a coated cemented carbide tool produced by depositing, on the surface of a cemented carbide substrate, a wear-resistant coating layer which is made of one layer or a plurality of two or more layers, among a layer of carbide of Ti (hereinafter referred to as TiC), a layer of nitride of Ti (hereinafter referred to as TiN), a layer of carbonitride of Ti (hereinafter referred to as TiCN), a layer of carboxide of Ti (hereinafter referred to as TiCO) and a layer of carbonitroxide of Ti (hereinafter referred to as TiCNO) and has an average thickness of 1 to 15 μm, using a conventional chemical deposition apparatus. It is also well known that this coated cemented carbide tool may be used in continuous cutting and interrupted cutting of various types of steel and cast iron.

There is also known a coated cemented carbide tool produced by depositing, on the surface of the cemented carbide substrate, a wear-resistant coating layer which is composed of: (a) a lower coating layer which is made of one layer or a plurality of two or more layers, among a layer of carbide of Ti (hereinafter referred to as TiC), a layer of nitride of Ti (hereinafter referred to as TiN), a layer of carbonitride of Ti (hereinafter referred to as TiCN), a layer of carboxide of Ti (hereinafter referred to as TiCO) and a layer of carbonitroxide of Ti (hereinafter referred to as TiCNO), and has an average thickness of 0.5 to 15 μm, deposited using a conventional chemical deposition device; and (b) an upper coating layer which is made of either or both of an aluminum oxide (hereinafter referred to as $Al_2O_3$) layer and an $Al_2O_3$—$ZrO_2$ mixed layer made of a matrix of $Al_2O_3$ and a zirconium oxide (hereinafter referred to as $ZrO_2$) phase dispersed and distributed therein (hereinafter referred to as an $Al_2O_3$—$ZrO_2$ mixed layer) described in Japanese Patent Application, First Publication No. Sho 57-39168 and Japanese Patent Application, First Publication No. Sho 61-201778, and has an average thickness of 0.5 to 15 μm, deposited using the same conventional chemical deposition device. It is also known that this coated cemented carbide tool may be used in continuous cutting and interrupted cutting of various types of steel and cast iron.

It is also known that a coated cemented carbide tool is produced by depositing, on the surface of the cemented carbide substrate, a wear-resistant coating layer which is made of a single-layered or multi-layered surface hard layer of either or both of a composite nitride layer of Ti and Al (hereinafter referred to as a (Ti, Al)N layer) and a composite carbonitride layer of Ti and Al (hereinafter referred to as a (Ti, Al)CN layer), which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm, as described in Japanese Patent Application, First Publication No. Sho 62-56565, using an arc ion plating apparatus as a kind of physical deposition apparatus shown in a schematic explanatory view of FIG. 1 under the conditions that arc discharge is generated between an anode electrode and a cathode electrode (vapor source), in which a Ti—Al alloy with a predetermined composition is set, under the conditions of a voltage of 35 V and a current of 90 A in the state where the atmosphere of the apparatus is evacuated to 0.5 Pa and heated to a temperature of 500° C. using a heater and, at the same time, a nitrogen gas and/or a methane gas, as a reactive gas, are introduced into the apparatus and a bias voltage of −200 V is applied to the cemented carbide substrate.

There is also known a coated cemented carbide tool produced by physically depositing, on the surface of the cemented carbide substrate, a single-layered or multi-layered lower hard layer of a wear-resistant coating layer, which is made of either or both of a composite nitride layer of Ti and Al (hereinafter referred to as a (Ti, Al)N layer) and a composite carbonitride layer of Ti and Al (hereinafter referred to as a (Ti, Al)CN layer), which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm, as described in Japanese Patent Application, First Publication No. Sho 62-56565, using an arc ion plating apparatus as a kind of physical deposition apparatus shown in a schematic explanatory drawing view of FIG. 1 under the conditions that arc discharge is generated between an anode electrode and a cathode electrode (vapor source), in which a Ti—Al alloy with a predetermined composition is set, under the conditions of a voltage of 35 V and a current of 90 A in the state where the atmosphere of the apparatus is evacuated to 0.5 Pa and heated to a temperature of 500° C. using a heater and, at the same time, a nitrogen gas and/or a methane gas, as a reactive gas, are introduced into the apparatus and a bias voltage of −200 V is applied to the cemented carbide substrate, and further depositing chemically thereon an upper coating layer which is made of either or both of an aluminum oxide (hereinafter referred to as $Al_2O_3$) layer and an $Al_2O_3$—$ZrO_2$ mixed layer made of a matrix of $Al_2O_3$ and a zirconium oxide (hereinafter referred to as $ZrO_2$) phase dispersed and distributed therein (hereinafter referred to as an $Al_2O_3$—$ZrO_2$ mixed layer) described in Japanese Patent Application, First Publication No. Sho 57-39168 and Japanese Patent Application, First Publication No. Sho 61-201778, and has an average thickness of 0.5 to 10 μm, using a conventional chemical deposition apparatus. It is also known that this coated cemented carbide tool may be used in continuous cutting and interrupted cutting of various types of steel and cast iron.

Recently, high performance cutting apparatuses have made remarkable advances. With an increase in strong demands of labor saving and energy saving as well as cost reduction to the cutting operation, cutting tools tend to require the versatility that it is hardly influenced by the cutting conditions as small as possible. When a conventional coated cemented carbide tool is used in continuous cutting and interrupted cutting of steel and cast iron under normal conditions, no problems arise. However, when a cutting operation using an end mill or drill whose cutting edge is exposed to interrupted cutting, and an interrupted cutting operation (hereinafter referred to as "interrupted cutting") using a throw-away insert are conducted under deep cutting conditions such as thick depth-of-cut and high feed, the surface hard layer is liable to be peeled off from the surface of the cemented carbide substrate due to high mechanical and thermal impacts produced during the cutting. Since the primary layer and surface hard layer are very hard, chipping is liable to occur at the cutting edge portion in the interrupted cutting under deep cutting conditions accompanied with high mechanical and thermal impacts, and failure occurs within a relatively short time.

SUMMARY OF THE INVENTION

To solve the problems described above, according to the present invention, the following cutting tools made of a surface-coated carbide alloy, which have a wear-resistant coating layer, were developed.

The cutting tool made of a surface-coated carbide alloy, in the first aspect of the present invention, comprises a tungsten carbide-based carbide alloy substrate having an amorphous layer formed by an arc ion plating surface treatment to an average depth of 1 to 50 nm from the surface; and a wear-resistant coating layer deposited chemically and/or physically on the surface of the tungsten carbide-based carbide alloy substrate, wherein the wear-resistant coating layer is made of one layer or a plurality of two or more layers, among a layer of carbide of Ti, a layer of nitride of Ti, a layer of carbonitride of Ti, a layer of carboxide of Ti and a layer of carbonitroxide of Ti, and has an average thickness of 1 to 15 μm, and the wear-resistant coating layer which has excellent adhesion.

In the surface-coated cemented carbide tool of this embodiment, since the amorphous layer formed at the surface portion of the cemented carbide substrate ensures strong adhesion between the surface of the cemented carbide substrate and the wear-resistant coating layer, peeling is not caused by poor adhesion in the wear-resistant coating layer during the interrupted cutting operation under deep cutting conditions of steel and cast iron accompanied with drastically high thermal and mechanical impacts, and the wear-resistant coating layer exhibits excellent wear resistance. On the other hand, in the conventional coated cemented carbide tool, peeling is caused by poor adhesion of the wear-resistant coating layer during the interrupted cutting operation under the deep cutting conditions described above, and it is evident that failure occurs within a relatively short time.

As described above, the coated cemented carbide tool of this invention exhibits excellent adhesion of the wear-resistant coating layer to the surface of the cemented carbide substrate and also exhibits excellent cutting performances for a long period of time even when used in the interrupted cutting operation under deep cutting conditions accompanied with particularly high mechanical and thermal impacts, not to mention the use in continuous cutting and interrupted cutting operations of various types of steel and cast iron under normal conditions, thus making it possible to satisfactorily cope with the variability of the cutting operation and to achieve further labor saving and energy saving as well as cost reduction in the cutting operation.

The cutting tool made of a surface-coated carbide alloy, in the second aspect of the present invention, comprises a tungsten carbide-based carbide alloy substrate having an amorphous layer formed by an arc ion plating surface treatment to an average depth of 1 to 50 nm from the surface; and a single-layered or multi-layered hard coating layer deposited physically on the surface of the tungsten carbide-based carbide alloy substrate, wherein the single-layered or multi-layered hard coating layer is made of either or both of a composite nitride layer of Ti and Al and a composite carbonitride layer of Ti and Al, which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm, and the hard coating layer exhibits excellent wear resistance.

The cutting tool made of a surface-coated carbide alloy of the second embodiment exhibited excellent cutting performances for a long period of time even when used in the interrupted cutting operation under deep cutting conditions accompanied with high mechanical and thermal impacts similar to the first embodiment, because the wear-resistant coating exhibited excellent adhesion to the surface of the cemented carbide substrate.

The cutting tool made of a surface-coated carbide alloy, in the third aspect of the present invention, comprises a tungsten carbide-based cemented carbide substrate having an amorphous layer formed by an arc ion plating surface treatment to an average depth of 1 to 50 nm from the surface; and a wear-resistant coating layer deposited physically on the surface of the tungsten carbide-based cemented carbide substrate, wherein wear-resistant coating layer is composed of: (a) a lower coating layer which is made of one layer or a plurality of two or more layers, among a layer of carbide of Ti, a layer of nitride of Ti, a layer of carbonitride of Ti, a layer of carboxide of Ti and a layer of carbonitroxide of Ti, and has an average thickness of 0.5 to 15 μm; and (b) an upper coating layer which is made of either or both of an aluminum oxide layer and an aluminum oxide-zirconium oxide mixed layer made of a matrix of aluminum oxide and a zirconium oxide phase dispersed and distributed therein, and has an average thickness of 0.5 to 15 μm.

The coated cemented carbide tool of this embodiment exhibits excellent cutting performances for a long period of time because the wear-resistant coating layer exhibits excellent adhesion even when used in the interrupted cutting operation under deep cutting conditions accompanied by particularly high mechanical and thermal impacts, not to mention the use in continuous cutting and interrupted cutting operations of various types of steel and cast iron under normal conditions, thus making it possible to satisfactorily cope with the variability of the cutting operation and to achieve further labor saving and energy saving as well as cost reduction in the cutting operation.

The cutting tool made of a surface-coated carbide alloy, in the fourth aspect of the present invention, was obtained by depositing the following layers (a) and (b) on the surface of a tungsten carbide-based cemented carbide substrate having an amorphous layer formed by an arc ion plating surface treatment to an average depth of 1 to 50 nm from the surface by physical deposition. These coating layers are respectively made of: (a) a primary tough layer which is made of a titanium nitride layer and has an average thickness of 0.1 to 5 μm; and (b) a single-layered or multi-layered surface hard layer which is made of either or both of a composite nitride layer of Ti and Al and a composite carbonitride layer of Ti and Al, which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm, and the wear-resistant coating layer exhibits excellent adhesion. Since the cemented carbide cutting tool thus obtained has excellent adhesion of the surface coating layer to the substrate and also has excellent resistance against chipping, this cutting tool made of a surface-coated carbide alloy exhibits excellent performance.

The coated cemented carbide tool of this embodiment exhibits excellent adhesion of the wear-resistant coating layer to the surface of the cemented carbide substrate and also exhibits excellent cutting performance for a long period of time even when used in an interrupted cutting operation under deep cutting conditions accompanied by particularly high mechanical and thermal impacts, not to mention the use in continuous cutting and interrupted cutting operations of various types of steel and cast iron under normal conditions, thus making it possible to satisfactorily cope with the versatility of the cutting operation and to achieve further labor saving and energy saving, as well as cost reduction, in the cutting operation.

The cutting tool made of a surface-coated carbide alloy, in the fifth aspect of the present invention, comprises a tungsten carbide-based carbide alloy substrate having an amorphous layer formed by an arc ion plating surface treatment to an average depth of 1 to 50 nm from the surface; and a wear-resistant coating layer deposited physically and/or chemically on the surface of the tungsten carbide-based carbide alloy substrate, wherein the wear-resistant coating layer is composed of: (a) a primary tough layer which is made of a titanium nitride layer and has an average thickness of 0.1 to 5 μm; (b) a single-layered or multi-layered lower hard layer which is made of either or both of a composite nitride layer of Ti and Al and a composite carbonitride layer of Ti and Al, which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm; and (c) a single-layered or multi-layered upper hard layer which is made of either or both of an aluminum oxide layer and an aluminum oxide-zirconium oxide mixed layer made of a matrix of aluminum oxide and a zirconium oxide phase dispersed and distributed therein, and has an average thickness of 0.5 to 10 μm, and the wear-resistant coating layer has excellent adhesion and resistance against chipping.

In the coated cemented carbide tool of this embodiment, since the amorphous layer formed at the surface portion of the cemented carbide substrate ensures strong adhesion between the surface of the cemented carbide substrate and the wear-resistant coating layer, peeling is not caused by poor adhesion in the wear-resistant coating layer during in the interrupted cutting operation under deep cutting conditions of steel and cast iron accompanied with extremely high thermal and mechanical impacts, and the wear-resistant coating layer exhibits excellent wear resistance. On the other hand, in the conventional coated cemented carbide tool, peeling is caused by poor adhesion of the wear-resistant coating layer during the interrupted cutting operation under the deep cutting conditions described above, and it is evident that failure occurs within a relatively short time.

As described above, the coated cemented carbide tool of the present invention exhibits excellent adhesion of the wear-resistant coating layer to the surface of the cemented carbide substrate and also exhibits excellent cutting performance for a long period of time even when used in the interrupted cutting operation under deep cutting conditions accompanied with particularly high mechanical and thermal impacts, not to mention the use in continuous cutting and interrupted cutting operations of various types of steel and cast iron under normal conditions, thus making it possible to satisfactorily cope with the variability of the cutting operation and to achieve further labor saving and energy saving as well as cost reduction in the cutting operation.

BRIEF DESCRIPTION OF THE DRAWINGS

FIG. 1 is a schematic explanatory view of an arc ion plating apparatus.

FIG. 2A is a schematic perspective view of the coated cemented carbide insert, while FIG. 2B is a schematic longitudinal cross-sectional view of the coated cemented carbide insert.

FIG. 3A is a schematic front view of the coated cemented carbide end mill, while FIG. 3B is a schematic transverse cross-sectional view of the cutting edge portion.

FIG. 4A is a schematic front view of the coated cemented carbide drill, while FIG. 4B is a schematic transverse cross-sectional view of the flute.

DETAILED DESCRIPTION OF THE INVENTION

Figure 2A:
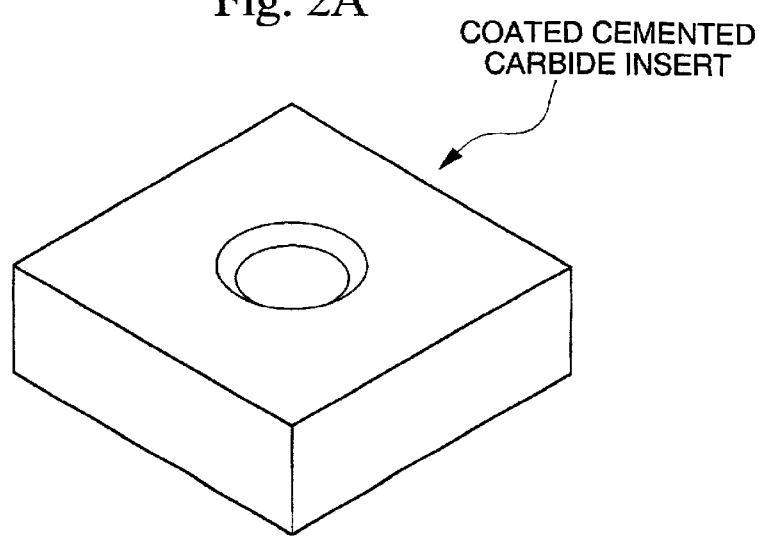
FIG. 2A and FIG. 2B show a coated cemented carbide insert.

Preferred embodiments of the cutting tool made of the surface-coated carbide alloy of the present invention will be described with reference to the accompanying drawings. The present invention is not limited to the following respective examples and, for example, constituent features of these embodiments may be appropriately used in combination.

First Embodiment

From the above-described point of view, the present inventors have researched to further improve the adhesion of the wear-resistant coating layer, which constitutes the above-described conventional coating cemented carbide tool to the surface of the cemented carbide substrate. As a result, the following discovered point was obtained.

(a) When the cemented carbide substrate described above is charged in an arc ion plating apparatus as a kind of physical deposition apparatus shown in a schematic explanatory view of FIG. 1 and the surface of the cemented carbide substrate is subjected to a pre-treatment without using a cathode electrode under the following conditions:

Atmospheric temperature in apparatus (temperature of cemented carbide substrate): 300 to 500° C.,
Atmospheric gas: Ar,
Atmospheric pressure: 1 to 10 Pa,
Arc discharge current: (Arc powder—OFF),
Bias pressure applied to cemented carbide substrate: −800 to −1000 V, and
Treating time: 2 to 10 min., and then the surface of the cemented carbide substrate is further subjected to an arc ion plating surface treatment using metallic Ti as the cathode electrode under the following conditions:

Atmospheric temperature in apparatus: 450 to 550° C.,
Atmospheric gas: Ar,
Atmospheric pressure: 1 to 10 Pa,
Arc discharge current: 100 to 200 A, and
Bias pressure applied to cemented carbide substrate: −900 to −1200 V, a metallic Ti layer as a deposition layer is not formed on the surface of the cemented carbide substrate. The structure of the surface of the cemented carbide substrate itself is observed using a transmission electron microscope. As a result, formation of an amorphous layer is confirmed.

(b) Formation of the metallic Ti layer using the arc ion plating apparatus is conducted under the following conditions:

Atmospheric temperature in apparatus: 300 to 500° C.,
Atmospheric gas: (not used),
Atmospheric pressure: vacuum at 0.1 Pa or less,
Cathode electrode: metallic Ti
Arc discharge current: 50 to 100 A, and
Bias pressure applied to cemented carbide substrate: −30 to −100 V.

(c) In the state where an amorphous layer is formed to an average depth of 1 to 50 nm from the surface, when a wear-resistant coating layer of the conventional coated cemented carbide tool is formed on the surface of the cemented carbide substrate with the amorphous layer formed on the surface thereof using the physical deposition apparatus described above or a conventional chemical deposition apparatus, since the amorphous layer has a high activity and a high reactivity, the amorphous layer reacts with the wear-resistant coating layer on formation of it with deposition, thereby to ensure remarkably strong adhesion between the surface of the cemented carbide substrate and the wear-resistant coating layer. As a result, the coated cemented carbide tool thus obtained is free from peeling of the wear-resistant coating layer even when used in the interrupted cutting operation under deep cutting conditions. Therefore, it becomes possible to satisfactorily exhibit excellent wear resistance of the wear-resistant coating layer.

This embodiment has been made based on the discovered point described above and is characterized by a coated cemented carbide tool, a wear-resistant coating layer which has excellent adhesion, comprising: a cemented carbide substrate having an amorphous layer formed by an arc ion plating surface treatment to an average depth of 1 to 50 nm from the surface; and a wear-resistant coating layer deposited chemically and/or physically on the surface of the tungsten carbide-based cemented carbide substrate, wherein the wear-resistant coating layer is made of one layer or a plurality of two or more layers, among a TiC layer, a TiN layer, a TiCN layer, a TiCO layer and a TiCNO layer, and has an average thickness of 1 to 15 μm.

Next, the reason why the average thickness of the amorphous layer formed on the surface of the cemented carbide substrate and the average thickness of the wear-resistant coating layer were limited as described above in the coated cemented carbide of this invention will be explained.

(1) Average Thickness of Amorphous Layer on the Surface of Cemented Carbide Substrate The amorphous layer has an action of imparting excellent adhesion between it and the wear-resistant coating layer, as described above. However, when the depth is less than 1 nm, desired excellent adhesion cannot be ensured. On the other hand, the effect of improving the adhesion of the wear-resistant layer to the surface of the cemented carbide substrate is satisfactory when the average depth from the surface is 50 nm. Therefore, the average depth was set of 1 to 50 nm.

(2) Average Thickness of Wear-Resistant Coating Layer

A Ti compound layer constituting the wear-resistant coating layer has an action of improving the wear resistance of a cutting tool. However, when the average thickness is less than 1 μm, desired wear resistance cannot be ensured. On the other hand, when the average thickness exceeds 15 μm, plastic deformation, which is likely to cause biased wear, is liable to occur in the wear-resistant coating layer in the interrupted cutting operation under deep cutting conditions. Therefore, the average depth was set within a range from 1 to 15 μm.

The coated cemented carbide tool of this embodiment will be described in detail.

EXAMPLE 1-1

Cemented carbide substrates A1-1 to A1-6, each having a shape of a throw-away insert defined in ISO•CNMG120408, were produced by preparing a WC powder, a (Ti, W)C (TiC/WC=30/70 in a weight ratio, the same as in other powders) powder, a (Ti, W)CN (TiC/TiN/WC=24/20/56) powder, a (Ta, Nb)C (TaC/NbC=90/10) powder, a $Cr_3C_2$ powder and a Co powder, each having a predetermined average grain size of 0.5 to 4 μm, compounding these raw powders according to each formulation in Table 1-1, wet-mixing them in a ball mill for 72 hours, drying the mixture, compacting the dried mixture under a pressure of 100 MPa to form green compacts, and vacuum-sintering these green compacts under the conditions of a vacuum degree of 6 Pa and a temperature of 1410° C. for one hour.

These cemented carbide substrates A1-1 to A1-6 were subjected to ultrasonic cleaning in acetone, were dried, and were then charged in a conventional arc ion plating apparatus shown in FIG. 1, and the surface of each of the cemented carbide substrates A1-1 to A1-6 was subjected to a pre-treatment under the following conditions:

Atmospheric temperature (temperature of cemented carbide substrate): 400° C.,
Atmospheric gas: Ar,
Atmospheric pressure: 3 Pa,
Cathode electrode: (not used)
Arc discharge current: (Arc powder—OFF),
Bias pressure applied to cemented carbide substrate: −900 V, and
Treating time: 3 min., and this was then subjected to an arc ion plating surface treatment under the following conditions:

Atmospheric temperature in apparatus: 500° C.,
Atmospheric gas: Ar,
Atmospheric pressure: 3 Pa,
Cathode electrode: metallic Ti,
Arc discharge current: 150 A, and
Bias pressure applied to cemented carbide substrate: −1000 V, thereby to form an amorphous layer on the surface of the cemented carbide substrates A1-1 to A1-6. The depth of the amorphous layer formed from the surface thereof was set by controlling the treating time of the arc ion plating surface treatment under the conditions described above.

The structure of the amorphous layer formed on the surface of the cemented carbide substrates A1-1 to A1-6 was observed by using an transmission electron microscope (magnification: 500,000) and the judgment and measurement were conducted based on the observed results. As a result, the average depths (average to depths measured at five points) from the surface are shown in Table 3, respectively.

Figure 2B:
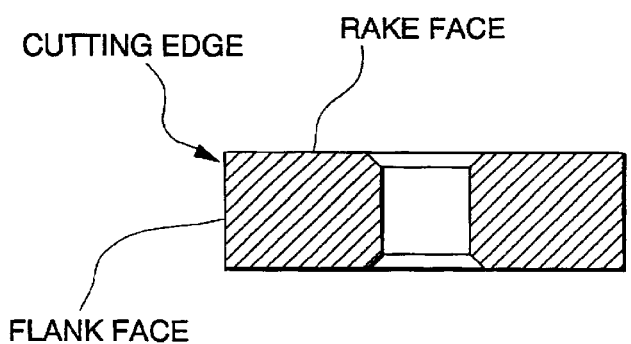

Using a conventional chemical deposition apparatus, a wear-resistant coating layer made of a Ti compound layer having a target composition and a target thickness shown in Table 1-3 was formed on the surface of these cemented carbide substrates A1-1 to A1-6 under the conditions (l-TiCN in the table represents conditions for formation of a TiCN layer with a crystal structure grown longitudinally as described in Japanese Patent Application, First Publication No. Hei 6-8010) shown in Table 1-2, thereby to produce throw-away inserts made of a surface-coated carbide alloy of this embodiment (hereinafter referred to as coated cemented carbide inserts of the present invention) 1-1 to 1-6 as the coated cemented carbide tool of the present invention, which has a shape shown in a schematic perspective view of FIG. 2(a) and a schematic longitudinal cross-sectional view of FIG. 2(b). Furthermore, the cemented carbide substrates A1-2, A1-4, A1-5 and A1-6 were charged in a conventional arc ion plating apparatus shown in FIG. 1 and the same wear-resistant coating layer made of a Ti compound layer having a target composition and a target thickness shown in Table 1-3 was formed on the surface of the cemented carbide substrates under the following conditions:

Atmospheric temperature in oven: 650° C.,
Atmospheric gas: nitrogen gas, methane gas, or mixed gas of nitrogen gas and methane gas in a predetermined ratio,
Atmospheric pressure: 5 Pa,
Cathode electrode: metallic Ti,
Arc discharge current: 80 A, and
Bias pressure applied to cemented carbide substrate: −200 V, thereby producing coated cemented carbide inserts 1-7 to 1-10 having the same shape shown in FIG. 2(a) and FIG. 2(b) of the present invention.

For comparison, as shown in Table 1-4, throw-away inserts made of a conventional coated cemented carbide (hereinafter referred to as conventional coated cemented carbide inserts) 1-1 to 1-10 as the conventional coated cemented carbide tool were respectively produced under the same conditions described above, except that the pretreatment and the arc ion plating surface treatment under the above conditions to the surface of the cemented carbide substrates A1-1 to A1-6 in the arc ion plating apparatus were not conducted, and therefore, the amorphous layer was not formed on the surface of the cemented carbide substrates A1-1 to A1-6.

Then, the coated cemented carbide inserts 1-1 to 1-10 of the present invention and the conventional coated cemented carbide inserts 1-1 to 1-10 were subjected to a dry type thick depth-of-cut interrupted cutting test of an alloy steel under the following conditions:

Workpiece: JIS•SCM440 round bar with four longitudinal grooves equally spaced,
Cutting speed: 120 m/min.,
Depth of cut: 5.4 mm,
Feed: 0.19 mm/rev., and
Cutting time: 5 min., a dry type thick depth-of-cut interrupted cutting test of a carbon steel under the following conditions:
Workpiece: JIS•S20C round bar with four longitudinal grooves equally spaced,
Cutting speed: 115 m/min.,
Depth of cut: 1.5 mm,
Feed: 0.48 mm/rev., and
Cutting time: 5 min., and a dry type thick depth-of-cut interrupted cutting test of a cast iron under the following conditions:
Workpiece: JIS•FC200 round bar with four longitudinal grooves equally spaced,
Cutting speed: 155 m/min.,
Depth of cut: 6.5 mm,
Feed: 0.17 mm/rev., and
Cutting time: 5 min., in the state of being screwed into the tip portion of a tool steel bit using a fixing jig. In all cutting tests, the flank wear width of the cutting edge was measured. The measurement results are shown in Table 1-5.

TABLE 1-1

| | | Composition formula (% by weight) | | | | | |
|---|---|---|---|---|---|---|---|
| Classification | | Co | (Ti, W) C | (Ti, W) CN | (Ta, Nb) C | $Cr_3C_2$ | WC |
| Cemented carbide substrates (inserts) | A1-1 | 6 | — | — | 1.5 | 0.4 | balance |
| | A1-2 | 6 | — | 8.5 | 3 | — | balance |
| | A1-3 | 7 | 3.5 | 5.5 | 4 | — | balance |
| | A1-4 | 8 | 4 | 4 | 5 | 0.5 | balance |
| | A1-5 | 9 | 21 | — | 2 | — | balance |
| | A1-6 | 10 | — | — | 2 | 0.6 | balance |

TABLE 1-2

| Wear-resistant coating layer | Forming conditions | | |
|---|---|---|---|
| | | Reactive atmosphere | |
| Classification | Composition of reactive gas (% by volume) | Pressure (kPa) | Temperature (° C.) |
| TiC | $TiCl_4$: 4.2%, $CH_4$: 8.5%, $H_2$: balance | 7 | 1020 |
| TiN | $TiCl_4$: 4.2%, $N_2$: 35%, $H_2$: balance | 25 | 1040 |

TABLE 1-2-continued

| Wear-resistant coating layer | Forming conditions | | |
|---|---|---|---|
| | | Reactive atmosphere | |
| Classification | Composition of reactive gas (% by volume) | Pressure (kPa) | Temperature (° C.) |
| 1-TiCN | TiCl$_4$: 4.2%, N$_2$: 20%, CH$_3$CN: 0.6%, H$_2$: balance | 7 | 900 |
| TiCN | TiCl$_4$: 4.2%, N$_2$: 20%, CH$_4$: 4%, H$_2$: balance | 7 | 1020 |
| TiCO | TiCl$_4$: 4.2%, CO: 4%, H$_2$: balance | 7 | 1020 |
| TiCNO | TiCl$_4$: 4.2%, CO: 3%, CH$_4$: 3%, N$_2$: 20%, H$_2$: balance | 15 | 1020 |

TABLE 1-3

| Classification | | Symbol | Cemented carbide substrate Average depth from the surface of amorphous layer (nm) | Wear-resistant coating layer (Figure in parentheses means target thickness) | | | | |
|---|---|---|---|---|---|---|---|---|
| | | | | First layer | Second layer | Third layer | Fourth layer | Fifth layer |
| Coated cemented carbide inserts of the inserts invention | 1-1 | A1-1 | 1.1 | TiN (0.5) | 1-TiCN (10) | TiN (0.5) | — | — |
| | 1-2 | A1-2 | 30.5 | TiN (2) | TiCN (6) | TiC (1) | TiCO (1) | TiN (1) |
| | 1-3 | A1-3 | 41.0 | TiC (3) | 1-TiCN (4) | TiN (0.6) | — | — |
| | 1-4 | A1-4 | 15.3 | TiCN (0.5) | 1-TiCN (14) | TiC (0.5) | — | — |
| | 1-5 | A1-5 | 7.2 | TiN (0.5) | TiC (0.5) | 1-TiCN (6) | TiN (0.4) | — |
| | 1-6 | A1-6 | 49.8 | TiN (0.2) | TiC (0.8) | — | — | — |
| | 1-7 | A1-2 | 5.5 | TiN (8) | — | — | — | — |
| | 1-8 | A1-4 | 10.1 | TiN (1) | TiCN (3) | — | — | — |
| | 1-9 | A1-5 | 23.4 | TiN (0.2) | TiCN (0.8) | TiC (2) | TiN (1) | — |
| | 1-10 | A1-6 | 4.1 | TiCN (4) | TiN (2) | — | — | — |

TABLE 1-4

| Classification | | Symbol | Cemented carbide substrate Average depth from the surface of amorphous layer (nm) | Wear-resistant coating layer (Figure in parentheses means target thickness) | | | | |
|---|---|---|---|---|---|---|---|---|
| | | | | First layer | Second layer | Third layer | Fourth layer | Fifth layer |
| Conventional coated cemented carbide inserts | 1-1 | A1-1 | — | the same as the coated cemented carbide insert 1-1 of the present invention | | | | |
| | 1-2 | A1-2 | — | the same as the coated cemented carbide insert 1-2 of the present invention | | | | |
| | 1-3 | A1-3 | — | the same as the coated cemented carbide insert 1-3 of the present invention | | | | |
| | 1-4 | A1-4 | — | the same as the coated cemented carbide insert 1-4 of the present invention | | | | |
| | 1-5 | A1-5 | — | the same as the coated cemented carbide insert 1-5 of the present invention | | | | |
| | 1-6 | A1-6 | — | the same as the coated cemented carbide insert 1-6 of the present invention | | | | |
| | 1-7 | A1-2 | — | the same as the coated cemented carbide insert 1-7 of the present invention | | | | |
| | 1-8 | A1-4 | — | the same as the coated cemented carbide insert 1-8 of the present invention | | | | |
| | 1-9 | A1-5 | — | the same as the coated cemented carbide insert 1-9 of the present invention | | | | |
| | 1-10 | A1-6 | — | the same as the coated cemented carbide insert 1-10 of the present invention | | | | |

TABLE 1-5

| Classification | | Flank wear width (mm) | | | Classification | | Cutting test results | | |
| --- | --- | --- | --- | --- | --- | --- | --- | --- | --- |
| | | Interrupted thick depth-of-cut of alloy steel | Interrupted high feed of carbon steel | Interrupted thick depth-of-cut of cast iron | | | Interrupted thick depth-of-cut of alloy steel | Interrupted high feed of alloy steel | Interrupted thick depth-of-cut of cast iron |
| Coated cemented carbide inserts of the present invention | 1-1 | 0.15 | 0.12 | 0.07 | Conventional coated cemented carbide inserts | 1-1 | Failure at 1.7 | Failure at 2.3 | Failure at 2.9 |
| | 1-2 | 0.14 | 0.11 | 0.08 | | 1-2 | Failure at 1.9 | Failure at 2.4 | Failure at 2.8 |
| | 1-3 | 0.17 | 0.13 | 0.06 | | 1-3 | Failure at 2.1 | Failure at 2.7 | Failure at 3.0 |
| | 1-4 | 0.15 | 0.14 | 0.07 | | 1-4 | Failure at 1.4 | Failure at 2.0 | Failure at 2.5 |
| | 1-5 | 0.14 | 0.12 | 0.08 | | 1-5 | Failure at 2.2 | Failure at 2.7 | Failure at 3.2 |
| | 1-6 | 0.18 | 0.17 | 0.11 | | 1-6 | Failure at 2.5 | Failure at 3.0 | Failure at 3.4 |
| | 1-7 | 0.21 | 0.19 | 0.15 | | 1-7 | Failure at 1.4 | Failure at 1.8 | Failure at 2.4 |
| | 1-8 | 0.19 | 0.16 | 0.13 | | 1-8 | Failure at 1.2 | Failure at 1.9 | Failure at 2.2 |
| | 1-9 | 0.18 | 0.15 | 0.10 | | 1-9 | Failure at 1.5 | Failure at 1.9 | Failure at 2.3 |
| | 1-10 | 0.18 | 0.15 | 0.12 | | 1-10 | Failure at 1.7 | Failure at 1.7 | Failure at 2.1 |

(Failure was caused by peeling of the wear-resistant layer.)

EXAMPLE 1-2

Cemented carbide substrates B1-1 to B1-8 for end mills, each having a size of 6 mm×13 mm, 10 mm×22 mm, and 20 mm×45 mm in diameter and length of the cutting edge portion, were produced in accordance with the combination shown in Table 1-6 by preparing a WC powder of medium coarse grains having an average grain size of 5.5 μm, a WC powder of fine grains having an average grain size of 0.8 μm, a TaC powder having an average grain size of 1.3 μm, a NbC powder having an average grain size of 1.2 μm, a ZrC powder having an average grain size of 1.2 μm, a $Cr_3C_2$ powder having an average grain size of 2.3 μm, a VC powder having an average grain size of 1.5 μm, a (Ti, W)C powder having an average grain size of 1.0 μm and a Co powder having an average grain size of 1.8 μm, compounding these raw powders according to each formulation in Table 1-6, adding a wax, mixing them in acetone in a ball mill for 24 hours, drying the mixture under reduced pressure, compacting the dried mixture under a pressure of 10 MPa to form green compacts, sintering these green compacts under the conditions of heating to a predetermined temperature within a range from 1370 to 1470° C. at a heating rate of 7° C./min in a vacuum atmosphere of 6 Pa, maintaining at this temperature for one hour and furnace-cooling, thereby forming three kinds of sintered round bars for forming cemented carbide substrates, each having a diameter of 8 mm, 13 mm, and 26 mm, and cutting three kinds of the sintered round bars.

These cemented carbide substrates B1-1 to B1-8 were subjected to ultrasonic cleaning in acetone, dried and then charged in the same arc ion plating apparatus shown in FIG. 1 and the surface of each of these cemented carbide substrates was subjected to the pre-treatment and the arc ion plating surface treatment under the same conditions as in Example 1 to form an amorphous layer on the surface of the cemented carbide substrates B1-1 to B1-8. The depth of the amorphous layer formed from the surface thereof was also set by controlling the treating time of the arc ion plating surface treatment under the conditions described above.

The structure of the amorphous layer formed on the surface of the cemented carbide substrates B1-1 to B1-8 was observed by using an transmission electron microscope (magnification: 500,000) and the judgment and measurement were conducted based on the observation results. As a result, the average depth (average depths measured at five points) from the surface is shown in Table 1-7, respectively.

Using a conventional chemical deposition apparatus, a wear-resistant coating layer made of a Ti compound layer having a target composition and a target thickness shown in Table 1-7 was formed on the surface of these cemented carbide substrates B1-1 to B1-8 under the same conditions as shown in Table 1-2 in the state of being subjected to honing, thereby to produce end mills made of a surface-coated carbide alloy of the present invention (hereinafter referred to as coated cemented carbide end mills of the present invention) 1-1' to 1-8' as the coated cemented carbide tool of the present invention, which has a shape shown in a schematic front view of FIG. 3A and a schematic transverse cross-sectional view of FIG. 3B of the cutting edge portion.

For comparison, as shown in Table 1-8, end mills made of a conventional coated cemented carbide (hereinafter referred to as conventional coated cemented carbide end mills) 1-1' to 1-8' as the conventional coated cemented carbide tool were respectively produced under the same conditions described above, except that the pre-treatment and the arc ion plating surface treatment under the above conditions on the surface of the cemented carbide substrates B1-1 to B1-8 in the arc ion plating apparatus were not conducted, and therefore, the amorphous layer was not formed on the surface of the cemented carbide substrates B1-1 to B1-8.

Then, the coated cemented carbide end mills 1-1' to 1-3' of the present invention and the conventional coated cemented carbide end mills 1-1' to 1-3', among the coated cemented carbide end mills 1-1' to 1-8' of the present invention and the conventional coated cemented carbide end mills 1-1' to 1-8', were subjected to a wet type thick depth-of-cut side cutting test of a cast iron under the following conditions:

Workpiece: JIS•FC250 plate having a planar size of 100 mm×250 mm and a thickness of 50 mm,
Rotating speed: 5350 min$^{-1}$,
Depth of cut in axial direction: 1.2 mm,
Depth of cut in radial direction: 1.6 mm, and
Feed: 590 mm/min. The coated cemented carbide end mills 1-4' to 1-6' of the present invention and the conventional coated cemented carbide end mills 1-4' to 1-6' were subjected to a wet type thick depth-of-cut side cutting test of a carbon steel under the following conditions:
Workpiece: JIS•S10C plate having a planar size of 100 mm×250 mm and a thickness of 50 mm,
Rotating speed: 2000 min$^{-1}$,
Depth of cut in axial direction: 20 mm,
Depth of cut in radial direction: 2.6 mm, and
Feed: 260 mm/min. The coated cemented carbide end mills 1-7' to 1-8' of the present invention and the coated cemented carbide end mills 1-7' to 1-8' were subjected to a wet type thick depth-of-cut side cutting test of a hardened steel under the following conditions:
Workpiece: JIS•SKD61 (hardness: HRC52) plate having a planar size of 100 mm×250 mm and a thickness of 50 mm,
Rotating speed: 650 min$^{-1}$,
Depth of cut in axial direction: 26 mm,
Depth of cut in radial direction: 1.4 mm, and
Feed: 72 mm/min. In all side cutting tests (water-soluble cutting oil is used in all tests), the cutting length until the flank wear amount of the peripheral edge reaches 0.1 mm as a criterion of the service life was measured. The measurement results are respectively shown in Table 1-7 and Table 1-8.

TABLE 1-6

| Classification | | Co | (Ti, W) C | TaC | NbC | ZrC | $Cr_3C_2$ | VC | WC | Diameter × length (mm) of cutting edge portion |
|---|---|---|---|---|---|---|---|---|---|---|
| Cemented carbide substrates (end mills) | B1-1 | 5.5 | — | 1 | — | — | — | — | Medium coarse grains: balance | 6 × 13 |
| | B1-2 | 9.5 | — | — | — | — | 0.5 | — | Fine grains: balance | 6 × 13 |
| | B1-3 | 10.5 | — | 1 | — | 1 | 0.5 | 0.5 | Fine grains: balance | 6 × 13 |
| | B1-4 | 8 | — | — | — | — | 0.5 | 0.5 | Fine grains: balance | 10 × 22 |
| | B1-5 | 9 | 8 | 10 | 1 | — | — | — | Medium coarse grains: balance | 10 × 22 |
| | B1-6 | 10 | — | — | — | — | 1 | — | Fine grains: balance | 10 × 22 |
| | B1-7 | 12 | 20 | 9 | 1 | — | — | — | Medium coarse grains: balance | 20 × 45 |
| | B1-8 | 7 | — | 4 | 4 | 4 | — | — | Medium coarse grains: balance | 20 × 45 |

TABLE 1-7

| Classification | Symbol | Cemented carbide substrate Average depth from the surface of amorphous layer (nm) | Wear-resistant coating layer (Figure in parentheses means target thickness) | | | | | Cut length (m) |
|---|---|---|---|---|---|---|---|---|
| | | | | First layer | Second layer | Third layer | Fourth layer | Fifth layer | |
| Coated cemented carbide end mills of the present invention | 1-1' | B1-1 | 1.2 | TiN (0.5) | 1-TiCN (2) | TiN (0.5) | — | — | 426 |
| | 1-2' | B1-2 | 30.7 | TiN (0.2) | TiCN (1) | TiCO (1) | TiC (1) | — | 433 |
| | 1-3' | B1-3 | 22.3 | TiN (0.5) | 1-TiCN (3) | TiC (2) | — | — | 552 |
| | 1-4' | B1-4 | 3.4 | TiCN (1) | 1-TiCN (2) | TiCNO (1) | TiN (0.5) | — | 278 |
| | 1-5' | B1-5 | 11.5 | TiN (1) | TiC (1) | 1-TiCN (1.5) | TiN (0.5) | — | 256 |
| | 1-6' | B1-6 | 42.6 | TiN (2) | TiC (2) | — | — | — | 265 |
| | 1-7' | B1-7 | 6.4 | TiN (0.5) | TiCN (2) | TiC (1) | TiCNO (0.5) | TiN (0.5) | 105 |
| | 1-8' | B1-8 | 49.8 | TiN (1) | 1-TiCN (2) | TiC (2) | TiN (1) | — | 122 |

TABLE 1-8

| Classification | | Symbol | Cemented carbide substrate Average depth from the surface of amorphous layer (nm) | Wear-resistant coating layer (Figure in parentheses means target thickness) | | | | | Cut length (m) |
|---|---|---|---|---|---|---|---|---|---|
| | | | | First layer | Second layer | Third layer | Fourth layer | Fifth layer | |
| Conventional coated cemented carbide end mills | 1-1' | B1-1 | — | the same as the coated cemented carbide end mills 1-1 of the present invention | | | | | Failure at 58 m |
| | 1-2' | B1-2 | — | the same as the coated cemented carbide end mill 1-2 of the present invention | | | | | Failure at 60 m |
| | 1-3' | B1-3 | — | the same as the coated cemented carbide end mill 1-3 of the present invention | | | | | Failure at 62 m |
| | 1-4' | B1-4 | — | the same as the coated cemented carbide end mill 1-4 of the present invention | | | | | Failure at 46 m |
| | 1-5' | B1-5 | — | the same as the coated cemented carbide end mill 1-5 of the present invention | | | | | Failure at 40 m |
| | 1-6' | B1-6 | — | the same as the coated cemented carbide end mill 1-6 of the present invention | | | | | Failure at 38 m |
| | 1-7' | B1-7 | — | the same as the coated cemented carbide end mill 1-7 of the present invention | | | | | Failure at 8 m |
| | 1-8' | B1-8 | — | the same as the coated cemented carbide end mill 1-8 of the present invention | | | | | Failure at 7 m |

(Failure was caused by peeling of the wear-resistant layer.)

EXAMPLE 1-3

Using three kinds of sintered round bars, each having a diameter of 8 mm (for forming cemented carbide substrates B1-1 to B1-3), a diameter of 13 mm (for forming cemented carbide substrates B1-4 to B1-6), and 26 mm (for forming cemented carbide substrates B1-7 to B1-8), produced in Example 1-2, cemented carbide substrates C1-1 to C1-8 for drills, each having a size of 4 mm×13 mm (cemented carbide substrates C1-1 to C1-3), 8 mm×22 mm (cemented carbide substrates C1-4 to C1-6), and 16 mm×45 mm (cemented carbide substrates C1-7 to C1-8) in diameter and length of the flute, were produced from these three kinds of sintered round bars.

These cemented carbide substrates C1-1 to C1-8 were subjected to ultrasonic cleaning in acetone, were dried, and were then charged in the same arc ion plating apparatus shown in FIG. 1 and the surface of each of these cemented carbide substrates was subjected to the pre-treatment and the arc ion plating surface treatment under the same conditions as in Example 1 to form an amorphous layer on the surface of the cemented carbide substrates C1-1 to C1-8. The depth of the amorphous layer formed from the surface thereof was also set by controlling the treating time of the arc ion plating surface treatment under the conditions described above.

The structure of the amorphous layer formed on the surface of the cemented carbide substrates C1-1 to C1-8 was observed by using an transmission electron microscope (magnification: 500,000) and the judgment and measurement were conducted based on the observed results. As a result, the average depth (average of depths measured at five points) from the surface is shown in Table 1-9, respectively.

Using a conventional chemical deposition apparatus, a wear-resistant coating layer made of a Ti compound layer having a target composition and a target thickness shown in Table 1-9 was formed on the surface of these cemented carbide substrates B1-1 to B1-8 under the same conditions as shown in Table 1-2 in the state of being subjected to honing, thereby to produce drills made of a surface-coated carbide alloy of the present invention (hereinafter referred to as coated cemented carbide drills of the present invention) 1-1" to 1-8" as the coated cemented carbide tool of the present invention, which has a shape shown in a schematic front view of FIG. 4A and a schematic transverse cross-sectional view of FIG. 4B of the flute.

For comparison, as shown in Table 1-10, end drills made of a conventional coated cemented carbide (hereinafter referred to as conventional coated cemented carbide drills) 1-1" to 1-8" as the conventional coated cemented carbide tool were respectively produced under the same conditions described above, except that the pre-treatment and the arc ion plating surface treatment under the above conditions to the surface of the cemented carbide substrates C1-1 to C1-8 in the arc ion plating apparatus were not conducted, and therefore, the amorphous layer was not formed on the surface of the cemented carbide substrates C1-1 to C1-8.

Then, the coated cemented carbide drills 1-1" to 1-3" of the present invention and the conventional coated cemented carbide drills 1-1" to 1-3", among the coated cemented carbide drills 1-1" to 1-8" of the present invention, were subjected to a wet type high feed drilling test of a cast iron under the following conditions:

Workpiece: JIS•FC250 plate having a planar size of 100 mm×250 mm and a thickness of 50 mm,
Cutting speed: 45 m/min., and
Feed: 0.42 mm/div. The coated cemented carbide drills 1-4" to 1-6" of the present invention and the conventional coated cemented carbide drills 1-4" to 1-6" were subjected to a wet type high feed drilling test of a carbon steel under the following conditions:
Workpiece: JIS•S10C plate having a planar size of 100 mm×250 mm and a thickness of 50 mm,
Cutting speed: 48 m/min., and
Feed: 0.36 mm/div. The coated cemented carbide drills 1-7" to 1-8" of the present invention and the conventional coated cemented carbide drills 1-7" to 1-8" were subjected to a wet type high feed drilling test of an alloy steel under the following conditions:
Workpiece: JIS•SCM440 plate having a planar size of 100 mm×250 mm and a thickness of 50 mm,
Cutting speed: 63 m/min., and
Feed: 0.43 mm/div. In all wet type high feed drilling tests (water-soluble cutting oil was used in all tests), the number of drilled holes until the flank wear width of the tip edge face reaches 0.3 mm was measured. The measurement results are respectively shown in Table 1-9 and Table 1-10.

TABLE 1-9

| Classification | | Symbol | Cemented carbide substrate Average depth from the surface of amorphous layer (nm) | Wear-resistant coating layer (Figure in parentheses means target thickness) | | | | | Number of drilled holes |
|---|---|---|---|---|---|---|---|---|---|
| | | | | First layer | Second layer | Third layer | Fourth layer | Fifth layer | |
| Coated cemented carbide drills of the present invention | 1-1" | C1-1 | 1.5 | TiN (0.5) | 1-TiCN (5) | TiN (1) | — | — | 2098 |
| | 1-2" | C1-2 | 49.8 | TiC (0.5) | TiCN (2) | TiCO (2) | TiC (3) | — | 2225 |
| | 1-3" | C1-3 | 13.2 | TiN (5) | TiC (5) | — | — | — | 2415 |
| | 1-4" | C1-4 | 3.8 | TiCN (1) | 1-TiCN (3) | TiC (2) | TiCNO (0.5) | TiN (0.5) | 1462 |
| | 1-5" | C1-5 | 20.6 | TiN (0.5) | 1-TiCN (10) | TiCO (1) | TiCN (1.5) | — | 1655 |
| | 1-6" | C1-6 | 39.8 | TiN (5) | TiC (5) | TiN (5) | — | — | 1783 |
| | 1-7" | C1-7 | 30.5 | TiN (0.2) | TiCN (0.8) | TiN (1) | TiCNO (1) | TiC (3) | 1250 |
| | 1-8" | C1-8 | 7.2 | TiC (1) | 1-TiCN (1) | TiN (1) | — | — | 989 |

TABLE 1-10

| Classification | | Symbol | Cemented carbide substrate Average depth from the surface of amorphous layer (nm) | Wear-resistant coating layer (Figure in parentheses means target thickness) | | | | | Number of drilled holes |
|---|---|---|---|---|---|---|---|---|---|
| | | | | First layer | Second layer | Third layer | Fourth layer | Fifth layer | |
| Conventional coated cemented carbide drills | 1-1" | C1-1 | — | the same as the coated cemented carbide drill 1-1 of the present invention | | | | | Failure at 506 holes |
| | 1-2" | C1-2 | — | the same as the coated cemented carbide drill 1-2 of the present invention | | | | | Failure at 515 holes |
| | 1-3" | C1-3 | — | the same as the coated cemented carbide drill 1-3 of the present invention | | | | | Failure at 562 holes |
| | 1-4" | C1-4 | — | the same as the coated cemented carbide drill 1-4 of the present invention | | | | | Failure at 381 holes |
| | 1-5" | C1-5 | — | the same as the coated cemented carbide drill 1-5 of the present invention | | | | | Failure at 429 holes |
| | 1-6" | C1-6 | — | the same as the coated cemented carbide drill 1-6 of the present invention | | | | | Failure at 451 holes |
| | 1-7" | C1-7 | — | the same as the coated cemented carbide drill 1-7 of the present invention | | | | | Failure at 289 holes |
| | 1-8" | C1-8 | — | the same as the coated cemented carbide drill 1-8 of the present invention | | | | | Failure at 220 holes |

(Failure was caused by peeling of the wear-resistant layer.)

The composition and the thickness of the hard coating layer of the coated cemented carbide inserts 1-1 to 1-10 of the present invention, the coated cemented carbide end mills 1-1' to 1-8' of the present invention and the coated cemented carbide drills 1-1" to 1-8" of the present invention as the coated cemented carbide tool of the present invention as well as the conventional coated cemented carbide inserts 1-1 to 1-10, the conventional coated cemented carbide end mills 1-1' to 1-8', and the conventional coated cemented carbide drills 1-1" to 1-8" as the conventional coated cemented carbide tool were measured by using an energy-dispersive X-ray measuring apparatus, an Auger spectrometer, and a scanning electron microscope. As a result, they exhibited the composition and average thickness (compared with an average value in thicknesses measured at five points), which are substantially the same as the target composition and the target average thickness in Table 1-3, Table 1-4, and Table 1-7 to Table 1-10.

Second Embodiment

The second embodiment of the present invention has been carried out based on the discovered points (a) to (c) obtained in the first embodiment described above and is characterized by a coated cemented carbide tool, a hard coating layer of which has excellent adhesion, comprising: a tungsten carbide-based cemented carbide substrate having an amorphous layer formed by an arc ion plating surface treatment in an average depth of 1 to 50 nm from the surface; and a single-layered or multi-layered hard coating layer deposited physically on the surface of the tungsten carbide-based cemented carbide substrate, wherein the single-layered or multi-layered hard coating layer is made of either or both of a (Ti, Al)N layer and a (Ti, Al)CN layer, which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm.

The average thickness of the amorphous layer formed on the surface of the cemented carbide substrate, which constitutes the coated cemented carbide tool of the present invention, in the coated cemented carbide tool of this embodiment was set within a range from 1 to 50 nm for the following reasons. That is, when the depth is less than 1 nm, desired excellent adhesion between it and the TiN layer as the primary tough layer can be ensured. On the other hand, the effect of improving the adhesion of the TiN layer to the surface of the cemented carbide substrate is satisfactory when the average depth from the surface is 50 nm.

In the coated cemented carbide tool of this invention, Al in the (Ti, Al)N layer and the (Ti, Al)CN layer, which constitute the hard coating layer, is incorporated into TiCN in the form of a solid solution for the purpose of enhancing the hardness, thereby to improve the wear resistance. Therefore, the X value was set within a range from 0.15 to 0.65 (atomic ratio) for the following reason. That is, when the X value in the composition formula: $(Ti_{1-X}Al_X)N$ and the composition formula: $(Ti_{1-X}Al_X)C_{1-Y}N_Y$ is less than 0.15, desired wear resistance cannot be ensured. On the other hand, when the X value exceeds 0.65, chipping is liable to occur in the cutting edge. Since the component C in the (Ti, Al)CN layer has an action of enhancing the hardness, the (Ti, Al)CN layer has a comparatively high hardness as compared with the (Ti, Al)N layer. When the amount of the component C is less than 0.01, that is, the Y value exceeds 0.99, a predetermined effect of improving the hardness cannot be obtained. On the other hand, when the amount of the component C exceeds 0.5, that is, the Y value is less than 0.5, the toughness is rapidly lowered. Therefore, the Y value was set within a range from 0.5 to 0.99, and preferably from 0.55 to 0.9.

The reason why the average thickness of the hard coating layer was set within a range from 0.5 to 15 μm is as follows. That is, when the thickness is less than 0.5 μm, desired excellent wear resistance cannot be ensured. On the other hand, when the thickness exceeds 15 μm, chipping is liable to occur at the cutting edge.

The coated cemented carbide tool of this embodiment will be described in detail.

EXAMPLE 2-1

Cemented carbide substrates A2-1 to A2-6, each having a shape of an insert defined in ISO•SNGA120412, and cemented carbide substrates A2-7 to A2-10, each having a shape of an insert defined in ISO•SNMA120412, were produced by preparing a WC powder, a TiC powder, a ZrC powder, a VC powder, a TaC powder, a NbC powder, a $Cr_3C_2$ powder, a TiN powder, a TaN powder and a Co powder, each having a predetermined average grain size of 1 to 3 μm, compounding these raw powders according to each formulation in Table 2-1, wet-mixing them in a ball mill for 72 hours, drying the mixture, compacting the dried mixture under a pressure of 100 MPa to form green compacts, vacuum-sintering these green compacts under the conditions of a vacuum degree of 6 Pa and a temperature of 1410° C. for one hour, and subjecting the cutting edge portion to honing (R: 0.05).

These cemented carbide substrates A2-1 to A2-10 were subjected to ultrasonic cleaning in acetone, were dried, and then were charged in a conventional arc ion plating apparatus shown in FIG. 1 and the surface of each of the cemented carbide substrates A2-1 to A2-10 was subjected to a pre-treatment under the following conditions:

Atmospheric temperature in apparatus (temperature of cemented carbide substrate): 400° C.,
Atmospheric gas: Ar,
Atmospheric pressure: 3 Pa,
Cathode electrode: (not used)
Arc discharge current: (Arc powder—OFF),
Bias pressure applied to cemented carbide substrate: –900 V, and
Treating time: 3 min., and then subjected to an arc ion plating surface treatment under the following conditions:
Atmospheric temperature in apparatus: 500° C.,
Atmospheric gas: Ar,
Atmospheric pressure: 3 Pa,
Cathode electrode: metallic Ti,
Arc discharge current: 150 A, and
Bias pressure applied to cemented carbide substrate: –1000 V, thereby to form an amorphous layer on the surface of the cemented carbide substrates A2-1 to A2-10. The depth of the amorphous layer formed from the surface thereof was set by controlling the treating time of the arc ion plating surface treatment under the conditions described above.

The structure of the amorphous layer formed on the surface of the cemented carbide substrates A2-1 to A2-10 was observed by using an transmission electron microscope (magnification: 500,000) and the judgment and measurement were conducted based on the observed results. As a result, the average depths (average at depths measured at five points) from the surface are shown in Table 2-2 and Table 2-3, respectively.

Using the same chemical deposition apparatus, a hard coating layer having a target composition and a target thickness shown in Table 2-2 and Table 2-3 was deposited on the surface of these cemented carbide substrates A2-1 to A2-10 with the amorphous layer formed on the surface thereof under the following conditions:

Atmospheric temperature in oven: 500° C.,
Atmospheric gas: nitrogen gas, methane gas, or mixed gas of nitrogen gas and methane gas in a predetermined ratio,
Atmospheric pressure: 5 Pa,
Cathode electrode: Ti—Al alloy with various compositions,
Arc discharge current: 70 A, and
Bias pressure applied to cemented carbide substrate: –100 V, thereby producing coated cemented carbide inserts 2-1 to 2-20 having a shape shown in a schematic perspective view of FIG. 2A and a schematic longitudinal cross-sectional view of FIG. 2B of the present invention.

For comparison, as shown in Table 2-4 and Table 2-5, conventional coated cemented carbide inserts 2-1 to 2-20 (hereinafter referred to as conventional coated cemented carbide inserts) were respectively produced under the same conditions described above, except that the pre-treatment and the arc ion plating surface treatment under the above conditions to the surface of the cemented carbide substrates A2-1 to A2-10 in the arc ion plating apparatus were not conducted, and therefore, the amorphous layer was not formed on the surface of the cemented carbide substrates A2-1 to A2-10.

Then, the coated cemented carbide inserts 2-1 to 2-20 of the present invention and the conventional coated cemented carbide inserts 2-1 to 2-20 were subjected to a dry type thick depth-of-cut interrupted cutting test of an alloy steel under the following conditions:

Workpiece: JIS•SCM440 round bar with four longitudinal grooves equally spaced,
Cutting speed: 125 m/min.,
Depth of cut: 5 mm,
Feed: 0.2 mm/rev., and
Cutting time: 5 min., a dry type high feed interrupted cutting test of a carbon steel under the following conditions:
Workpiece: JIS•S20C round bar with four longitudinal grooves equally spaced,
Cutting speed: 120 m/min.,
Depth of cut: 1.5 mm,
Feed: 0.45 mm/rev., and
Cutting time: 5 min., and a dry type high speed interrupted cutting test of a carbon steel under the following conditions:
Workpiece: JIS•A10C round bar with four longitudinal grooves equally spaced,
Cutting speed: 250 m/min.,
Depth of cut: 2 mm,
Feed: 0.2 mm/rev., and
Cutting time: 4 min., in the state of being screwed into the tip portion of a tool steel bite using a fixing jig. In all cutting tests, the flank wear width of the cutting edge was measured. The measurement results are shown in Table 2-6 and Table 2-7.

TABLE 2-1

| Classification | | Co | TiC | ZrC | VC | TaC | NbC | $Cr_3C_2$ | TiN | TaN | WC |
|---|---|---|---|---|---|---|---|---|---|---|---|
| Cemented carbide substrates (inserts) | A2-1 | 10.5 | 8 | — | — | 8 | 1.5 | — | — | — | balance |
| | A2-2 | 7 | — | — | — | — | — | — | — | — | balance |
| | A2-3 | 5.7 | — | — | — | 1.5 | 0.5 | — | — | — | balance |
| | A2-4 | 10 | — | — | — | — | — | 1 | — | — | balance |
| | A2-5 | 14 | — | — | 0.2 | — | — | 0.8 | — | — | balance |
| | A2-6 | 9 | 8.5 | — | — | 8 | 3 | — | — | — | balance |
| | A2-7 | 10 | — | — | — | — | — | 0.5 | — | — | balance |
| | A2-8 | 8.5 | — | 0.5 | — | — | — | 0.5 | — | — | balance |
| | A2-9 | 11 | 8 | — | — | 4.5 | — | — | 1.5 | — | balance |
| | A2-10 | 12.5 | 2 | — | — | — | — | — | 1 | 1.5 | balance |

TABLE 2-2

| | | Cemented carbide substrate | Hard coating layer | | | | | | | |
|---|---|---|---|---|---|---|---|---|---|---|
| | | Average depth from the surface of amorphous | First layer | | | | Second layer | | | |
| | | | Target composition (atomic ratio) | | | | Target thickness | Target composition (atomic ratio) | | | | Target thickness |
| Classification | Symbol | layer (nm) | Ti | Al | C | N | (μm) | Ti | Al | C | N | (μm) |
| Coated cemented carbide inserts of the present invention | 2-1 | A2-1 | 1.1 | 0.35 | 0.65 | | 1.00 | 15.0 | — | — | — | — | — |
| | 2-2 | A2-2 | 5.2 | 0.45 | 0.55 | | 1.00 | 6.0 | — | — | — | — | — |
| | 2-3 | A2-3 | 10.7 | 0.55 | 0.45 | | 1.00 | 3.5 | — | — | — | — | — |
| | 2-4 | A2-4 | 5.8 | 0.70 | 0.30 | | 1.00 | 1.0 | — | — | — | — | — |
| | 2-5 | A2-5 | 20.4 | 0.85 | 0.15 | | 1.00 | 8.5 | — | — | — | — | — |
| | 2-6 | A2-6 | 8.1 | 0.40 | 0.60 | 0.01 | 0.99 | 4.5 | — | — | — | — | — |
| | 2-7 | A2-7 | 5.6 | 0.45 | 0.55 | 0.15 | 0.85 | 6.5 | — | — | — | — | — |
| | 2-8 | A2-8 | 30.2 | 0.60 | 0.40 | 0.30 | 0.70 | 1.5 | — | — | — | — | — |
| | 2-9 | A2-9 | 1.3 | 0.70 | 0.30 | 0.40 | 0.60 | 12.5 | — | — | — | — | — |
| | 2-10 | A2-10 | 49.3 | 0.80 | 0.20 | 0.50 | 0.50 | 0.5 | — | — | — | — | — |

TABLE 2-3

| | | Cemented carbide substrate | Hard coating layer | | | | | | | |
|---|---|---|---|---|---|---|---|---|---|---|
| | | Average depth from the surface of amorphous | First layer | | | | Second layer | | | |
| | | | Target composition (atomic ratio) | | | | Target thickness | Target composition (atomic ratio) | | | | Target thickness |
| Classification | Symbol | layer (nm) | Ti | Al | C | N | (μm) | Ti | Al | C | N | (μm) |
| Coated cemented carbide | 2-11 | A2-1 | 3.1 | 0.35 | 0.65 | — | 1.00 | 0.3 | 0.50 | 0.30 | — | 1.00 | 0.2 |
| | 2-12 | A2-2 | 5.2 | 0.60 | 0.40 | — | 1.00 | 0.5 | 0.45 | 0.45 | — | 1.00 | 4.5 |
| | 2-13 | A2-3 | 8.3 | 0.85 | 0.15 | — | 1.00 | 6.0 | 0.50 | 0.60 | — | 1.00 | 3.0 |

TABLE 2-3-continued

| Classification | | Symbol | Cemented carbide substrate Average depth from the surface of amorphous layer (nm) | Hard coating layer | | | | | | | | | |
|---|---|---|---|---|---|---|---|---|---|---|---|---|---|
| | | | | First layer | | | | | Second layer | | | | |
| | | | | Target composition (atomic ratio) | | | | Target thickness (μm) | Target composition (atomic ratio) | | | | Target thickness (μm) |
| | | | | Ti | Al | C | N | | Ti | Al | C | N | |
| inserts of the present invention | 2-14 | A2-4 | 3.4 | 0.70 | 0.30 | — | 1.00 | 4.5 | 0.70 | 0.30 | 0.01 | 0.99 | 0.5 |
| | 2-15 | A2-5 | 10.8 | 0.40 | 0.60 | — | 1.00 | 4.0 | 0.30 | 0.15 | 0.35 | 0.65 | 4.5 |
| | 2-16 | A2-6 | 1.2 | 0.35 | 0.65 | 0.30 | 0.70 | 2.5 | 0.55 | 0.45 | — | 1.00 | 0.5 |
| | 2-17 | A2-7 | 5.5 | 0.55 | 0.45 | 0.55 | 0.45 | 2.0 | 0.40 | 0.60 | — | 1.00 | 3.0 |
| | 2-18 | A2-8 | 5.2 | 0.50 | 0.50 | 0.15 | 0.85 | 1.5 | 0.50 | 0.50 | 0.40 | 0.60 | 5.0 |
| | 2-19 | A2-9 | 15.9 | 0.75 | 0.25 | 0.05 | 0.95 | 12.0 | 0.40 | 0.60 | 0.10 | 0.70 | 3.0 |
| | 2-20 | A2-10 | 40.7 | 0.85 | 0.15 | 0.40 | 0.60 | 1.5 | 0.50 | 0.50 | 0.30 | 0.90 | 5.0 |

TABLE 2-4

| Classification | | Symbol | Cemented carbide substrate Average depth from the surface of amorphous layer (nm) | Hard coating layer | | | | | | | | | |
|---|---|---|---|---|---|---|---|---|---|---|---|---|---|
| | | | | First layer | | | | | Second layer | | | | |
| | | | | Target composition (atomic ratio) | | | | Target thickness (μm) | Target composition (atomic ratio) | | | | Target thickness (μm) |
| | | | | Ti | Al | C | N | | Ti | Al | C | N | |
| Conventional coated cemented carbide inserts | 2-1 | A2-1 | — | the same as the coated cemented carbide insert 2-1 of the present invention | | | | | | | | | |
| | 2-2 | A2-2 | — | the same as the coated cemented carbide insert 2-2 of the present invention | | | | | | | | | |
| | 2-3 | A2-3 | — | the same as the coated cemented carbide insert 2-3 of the present invention | | | | | | | | | |
| | 2-4 | A2-4 | — | the same as the coated cemented carbide insert 2-4 of the present invention | | | | | | | | | |
| | 2-5 | A2-5 | — | the same as the coated cemented carbide insert 2-5 of the present invention | | | | | | | | | |
| | 2-6 | A2-6 | — | the same as the coated cemented carbide insert 2-6 of the present invention | | | | | | | | | |
| | 2-7 | A2-7 | — | the same as the coated cemented carbide insert 2-7 of the present invention | | | | | | | | | |
| | 2-8 | A2-8 | — | the same as the coated cemented carbide insert 2-8 of the present invention | | | | | | | | | |
| | 2-9 | A2-9 | — | the same as the coated cemented carbide insert 2-9 of the present invention | | | | | | | | | |
| | 2-10 | A2-10 | — | the same as the coated cemented carbide insert 2-10 of the present invention | | | | | | | | | |

TABLE 2-5

| Classification | | Symbol | Cemented carbide substrate Average depth from the surface of amorphous layer (nm) | Hard coating layer | | | | | | | | | |
|---|---|---|---|---|---|---|---|---|---|---|---|---|---|
| | | | | First layer | | | | | Second layer | | | | |
| | | | | Target composition (atomic ratio) | | | | Target thickness (μm) | Target composition (atomic ratio) | | | | Target thickness (μm) |
| | | | | Ti | Al | C | N | | Ti | Al | C | N | |
| Conventional coated cemented carbide inserts | 2-11 | A2-1 | — | the same as the coated cemented carbide insert 2-11 of the present invention | | | | | | | | | |
| | 2-12 | A2-2 | — | the same as the coated cemented carbide insert 2-12 of the present invention | | | | | | | | | |
| | 2-13 | A2-3 | — | the same as the coated cemented carbide insert 2-13 of the present invention | | | | | | | | | |

TABLE 2-5-continued

| | | Cemented carbide substrate | Hard coating layer | | | | | |
|---|---|---|---|---|---|---|---|---|
| | | Average depth from the surface of amorphous | First layer | | | Second layer | | |
| | | | Target composition (atomic ratio) | | Target thickness | Target composition (atomic ratio) | | Target thickness |
| Classification | Symbol | layer (nm) | Ti  Al  C  N | | ($\mu$m) | Ti  Al  C  N | | ($\mu$m) |
| 2-14 | A2-4 | — | the same as the coated cemented carbide insert 2-14 of the present invention | | | | | |
| 2-15 | A2-5 | — | the same as the coated cemented carbide insert 2-15 of the present invention | | | | | |
| 2-16 | A2-6 | — | the same as the coated cemented carbide insert 2-16 of the present invention | | | | | |
| 2-17 | A2-7 | — | the same as the coated cemented carbide insert 2-17 of the present invention | | | | | |
| 2-18 | A2-8 | — | the same as the coated cemented carbide insert 2-18 of the present invention | | | | | |
| 2-19 | A2-9 | — | the same as the coated cemented carbide insert 2-19 of the present invention | | | | | |
| 2-20 | A2-10 | — | the same as the coated cemented carbide insert 2-20 of the present invention | | | | | |

TABLE 2-6

| Classification | | Flank wear width (mm) | | | Classification | | Cutting test results | | |
|---|---|---|---|---|---|---|---|---|---|
| | | Interrupted thick depth-of-cut of alloy steel | Interrupted high feed of carbon steel | Interrupted high speed of alloy steel | | | Interrupted thick depth-of-cut of alloy steel | Interrupted high feed of carbon steel | Interrupted high speed of alloy steel |
| Coated cemented carbide inserts of the present invention | 2-1 | 0.12 | 0.11 | 0.15 | Conventional coated cemented carbide inserts | 2-1 | Failure in 0.8 min. | Failure in 0.7 min. | Failure in 0.4 min. |
| | 2-2 | 0.15 | 0.15 | 0.17 | | 2-2 | Failure in 2.5 min. | Failure in 1.5 min. | Failure in 0.8 min. |
| | 2-3 | 0.14 | 0.16 | 0.20 | | 2-3 | Failure in 2.7 min. | Failure in 1.9 min. | Failure in 0.9 min. |
| | 2-4 | 0.16 | 0.13 | 0.21 | | 2-4 | Failure in 3.2 min. | Failure in 2.3 min. | Failure in 1.1 min. |
| | 2-5 | 0.16 | 0.14 | 0.16 | | 2-5 | Failure in 1.6 min. | Failure in 1.1 min. | Failure in 0.7 min. |
| | 2-6 | 0.15 | 0.14 | 0.19 | | 2-6 | Failure in 2.6 min. | Failure in 2.0 min. | Failure in 0.8 min. |
| | 2-7 | 0.13 | 0.15 | 0.18 | | 2-7 | Failure in 2.0 min. | Failure in 1.4 min. | Failure in 0.7 min. |
| | 2-8 | 0.14 | 0.16 | 0.20 | | 2-8 | Failure in 3.1 min. | Failure in 2.2 min. | Failure in 1.0 min. |
| | 2-9 | 0.12 | 0.12 | 0.16 | | 2-9 | Failure in 1.4 min. | Failure in 1.0 min. | Failure in 0.6 min. |
| | 2-10 | 0.17 | 0.15 | 0.23 | | 2-20 | Failure in 3.4 min. | Failure in 2.5 min. | Failure in 1.3 min. |

(Failure was caused by a peeling phenomenon in the hard coating layer.)

TABLE 2-7

| Classification | | Flank wear width (mm) | | | Classification | | Cutting test results | | |
|---|---|---|---|---|---|---|---|---|---|
| | | Interrupted thick depth-of-cut of alloy steel | Interrupted high feed of carbon steel | Interrupted high speed of alloy steel | | | Interrupted thick depth-of-cut of alloy steel | Interrupted high feed of carbon steel | Interrupted high speed of alloy steel |
| Coated cemented carbide inserts of the | 2-11 | 0.17 | 0.18 | 0.24 | Conventional coated cemented carbide | 2-11 | Failure in 3.3 min. | Failure in 2.5 min. | Failure in 1.2 min. |
| | 2-12 | 0.14 | 0.15 | 0.18 | | 2-12 | Failure in 2.4 min. | Failure in 2.0 min. | Failure in 0.9 min. |
| | 2-13 | 0.11 | 0.12 | 0.16 | | 2-13 | Failure in | Failure in | Failure in |

TABLE 2-7-continued

| | | Flank wear width (mm) | | | | Cutting test results | | |
|---|---|---|---|---|---|---|---|---|
| Classification | | Interrupted thick depth-of-cut of alloy steel | Interrupted high feed of carbon steel | Interrupted high speed of alloy steel | Classification | | Interrupted thick depth-of-cut of alloy steel | Interrupted high feed of carbon steel | Interrupted high speed of alloy steel |
| present invention | 2-14 | 0.14 | 0.16 | 0.17 | inserts | 2-14 | 1.6 min.<br>Failure in 2.4 min. | 1.2 min.<br>Failure in 2.2 min. | 0.7 min.<br>Failure in 0.6 min. |
| | 2-15 | 0.13 | 0.14 | 0.18 | | 2-15 | Failure in 1.5 min. | Failure in 1.4 min. | Failure in 0.6 min. |
| | 2-16 | 0.15 | 0.15 | 0.20 | | 2-16 | Failure in 2.5 min. | Failure in 1.9 min. | Failure in 1.0 min. |
| | 2-17 | 0.14 | 0.16 | 0.18 | | 2-17 | Failure in 2.6 min. | Failure in 2.1 min. | Failure in 0.8 min. |
| | 2-18 | 0.14 | 0.17 | 0.19 | | 2-18 | Failure in 2.2 min. | Failure in 1.5 min. | Failure in 0.7 min. |
| | 2-19 | 0.12 | 0.13 | 0.15 | | 2-19 | Failure in 0.9 min. | Failure in 0.8 min. | Failure in 0.5 min. |
| | 2-20 | 0.16 | 0.18 | 0.18 | | 2-20 | Failure in 2.1 min. | Failure in 1.5 min. | Failure in 0.7 min. |

(Failure was caused by a peeling phenomenon in the hard coating layer.)

EXAMPLE 2-2

Cemented carbide substrates B2-1 to B2-8 for end mill, each having a size of 6 mm×13 mm, 10 mm×22 mm, and 20 mm×45 mm in diameter and length of the cutting edge portion, were produced in accordance with the combination shown in Table 2-8 by preparing a WC powder of medium coarse grains having an average grain size of 5.5 $\mu$m, a WC powder of fine grains having an average grain size of 0.8 $\mu$m, a TaC powder having an average grain size of 1.3 $\mu$m, a NbC powder having an average grain size of 1.2 $\mu$m, a ZrC powder having an average grain size of 1.2 $\mu$m, a $Cr_3C_2$ powder having an average grain size of 2.3 $\mu$m, a VC powder having an average grain size of 1.5 $\mu$m, a (Ti, W)C powder having an average grain size of 1.0 $\mu$m and a Co powder having an average grain size of 1.8 $\mu$m, compounding these raw powders according to each formulation in Table 2-8, adding a wax, mixing them in acetone in a ball mill for 24 hours, drying the mixture under reduced pressure, compacting the dried mixture under a pressure of 100 MPa to form green compacts, sintering these green compacts under the conditions of heating to a predetermined temperature within a range from 1370 to 1470° C. at a heating rate of 7° C./min. in a vacuum atmosphere of 6 Pa, maintaining at this temperature for one hour and furnace-cooling, thereby forming three kinds of sintered round bars for forming cemented carbide substrate, each having a diameter of 8 mm, 13 mm, and 26 mm, and cutting three kinds of the sintered round bars.

These cemented carbide substrates B2-1 to B2-8 were subjected to ultrasonic cleaning in acetone, were dried, and were then charged in the same arc ion plating apparatus shown in FIG. 1, and the surface of each of these cemented carbide substrates was subjected to the pre-treatment and the arc ion plating surface treatment under the same conditions as in Example 1 to form an amorphous layer on the surface of the cemented carbide substrates B2-1 to B2-8. The depth of the amorphous layer formed from the surface thereof was also set by controlling the treating time of the arc ion plating surface treatment under the conditions described above.

The structure of the amorphous layer formed on the surface of the cemented carbide substrates B2-1 to B2-8 was observed by using an transmission electron microscope (magnification: 500,000) and the judgment and measurement were conducted based on the observation results. As a result, the average depths (average in depths measured at five points) from the surface are shown in Table 2-9 and Table 2-10, respectively.

Using the same chemical deposition apparatus, a single-layered or multi-layered surface hard layer of either or both of a (Ti, Al)N layer and a (Ti, Al)CN layer, which have a target composition and a target thickness shown in Table 2-9 and Table 2-10, was formed on the surface of these cemented carbide substrates under the same conditions as in Example 1, thereby producing end mills made of a surface-coated carbide alloy of the present invention (hereinafter referred to as coated cemented carbide end mills of the present invention) 2-1' to 2-16' as the coated cemented carbide tool of the present invention, which has a shape shown in a schematic front view of FIG. 3A and a schematic transverse cross-sectional view of FIG. 3B of the cutting edge portion.

For comparison, as shown in Table 2-11 and Table 2-12, end mills made of a conventional coated cemented carbide (hereinafter referred to as conventional coated cemented carbide end mills) 2-1' to 2-16' as the conventional coated cemented carbide tool were respectively produced under the same conditions described above, except that the pre-treatment and the arc ion plating surface treatment under the above conditions to the surface of the cemented carbide substrates B2-1 to B2-8 in the arc ion plating apparatus were not conducted, and therefore, the amorphous layer was not formed on the surface of the cemented carbide substrates B2-1 to B2-8.

Then, the coated cemented carbide end mills 2-1' to 2-3' and 2-9' to 2-11' of the present invention and the conventional coated cemented carbide end mills 2-1' to 2-3' and 2-9' to 2-11', among the coated cemented carbide end mills 2-1' to 2-16' of the present invention and the conventional coated cemented carbide end mills 2-1' to 2-16', were subjected to a wet type thick depth-of-cut side cutting test of a cast iron under the following conditions:

Workpiece: JIS•FC250 plate having a planar size of 100 mm×250 mm and a thickness of 50 mm,
Rotating speed: 5050 min$^{-1}$,
Depth of cut in axial direction: 12 mm,
Depth of cut in radial direction: 1.6 mm, and
Feed: 610 mm/min. The coated cemented carbide end mills 2-4' to 2-6' and 2-12' to 2-14' of the present invention and the conventional coated cemented carbide end mills 2-4' to 2-6' and 2-12' to 2-14' were subjected to a wet type thick depth-of-cut side cutting test of a carbon steel under the following conditions:
Workpiece: JIS•S10C plate having a planar size of 100 mm×250 mm and a thickness of 50 mm,
Rotating speed: 1910 min$^{-1}$,
Depth of cut in axial direction: 20 mm,
Depth of cut in radial direction: 2.6 mm, and
Feed: 280 mm/min. The coated cemented carbide end mills 2-7' to 2-8' and 2-15' to 2-16' of the present invention and the conventional coated cemented carbide end mills 2-7' to 2-8' and 2-15' to 2-16' were subjected to a wet type thick depth-of-cut side cutting test of a hardened steel under the following conditions:
Workpiece: JIS•SKD61 (hardness: HRC52) plate having a planar size of 100 mm×250 mm and a thickness of 50 mm,
Rotating speed: 620 min$^{-1}$,
Depth of cut in axial direction: 26 mm,
Depth of cut in radial direction: 1.4 mm, and
Feed: 75 mm/min. In all side cutting tests (water-soluble cutting oil was used in all tests), the cutting length until the flank wear amount of the peripheral edge reached 0.1 mm as a criterion of the service life was measured. The measurement results are respectively shown in Table 2-9 and Table 2-12.

TABLE 2-8

| | | | Composition formula (% by weight) | | | | | | | Diameter × length (mm) of cutting |
|---|---|---|---|---|---|---|---|---|---|---|
| Classification | | Co | (Ti, W) C | TaC | NbC | ZrC | Cr$_3$C$_2$ | VC | WC | edge portion |
| Cemented carbide substrates (end mills) | B2-1 | 8 | — | — | — | — | 0.4 | — | Medium coarse grains: balance | 6 × 13 |
| | B2-2 | 6 | — | — | 1.5 | — | — | — | Fine grains: balance | 6 × 13 |
| | B2-3 | 10 | — | 1 | — | 1 | 0.5 | 0.5 | Fine grains: balance | 6 × 13 |
| | B2-4 | 8 | — | — | — | — | 0.5 | 0.5 | Fine grains: balance | 10 × 22 |
| | B2-5 | 6 | 10 | 10 | 1 | — | — | — | Medium coarse grains: balance | 10 × 22 |
| | B2-6 | 10 | — | — | — | — | 1 | — | Fine grains: balance | 10 × 22 |
| | B2-7 | 12 | 17 | 9 | 1 | — | — | — | Medium coarse grains: balance | 20 × 45 |
| | B2-8 | 8 | — | 10 | 5 | 10 | — | — | Medium coarse grains: balance | 20 × 45 |

TABLE 2-9

| | | Cemented carbide substrate | Hard coating layer | | | | | | | |
|---|---|---|---|---|---|---|---|---|---|---|
| | | Average depth from the surface of amorphous | First layer | | | | | Second layer | | | |
| | | | Target composition (atomic ratio) | | | | Target thickness | Target composition (atomic ratio) | | | | Target thickness | Cut length |
| Classification | Symbol | layer (nm) | Ti | Al | C | N | (μm) | Ti | Al | C | N | (μm) | (m) |
| Coated cemented carbide end mills of the present invention | 2-1' | B2-1 | 39.6 | 0.50 | 0.50 | — | 1.00 | 6 | — | — | — | — | — | 356 |
| | 2-2' | B2-2 | 1.1 | 0.80 | 0.20 | — | 1.00 | 8 | — | — | — | — | — | 409 |
| | 2-3' | B2-3 | 10.3 | 0.35 | 0.65 | — | 0.85 | 4 | — | — | — | — | — | 301 |
| | 2-4' | B2-4 | 8.6 | 0.65 | 0.35 | — | 1.00 | 2 | — | — | — | — | — | 194 |
| | 2-5' | B2-5 | 33.3 | 0.60 | 0.40 | — | 1.00 | 3 | — | — | — | — | — | 205 |
| | 2-6' | B2-6 | 5.4 | 0.45 | 0.55 | 0.30 | 0.70 | 1 | — | — | — | — | — | 163 |
| | 2-7' | B2-7 | 15.9 | 0.70 | 0.30 | 0.01 | 0.99 | 0.5 | — | — | — | — | — | 69 |
| | 2-8' | B2-8 | 21.3 | 0.55 | 0.45 | 0.50 | 0.50 | 2 | — | — | — | — | — | 84 |

TABLE 2-10

| Classification | | Symbol | Cemented carbide substrate Average depth from the surface of amorphous layer (nm) | Hard coating layer | | | | | | | | | | Cut length (m) |
|---|---|---|---|---|---|---|---|---|---|---|---|---|---|---|---|
| | | | | First layer | | | | | Second layer | | | | | |
| | | | | Target composition (atomic ratio) | | | | Target thickness (μm) | Target composition (atomic ratio) | | | | Target thickness (μm) | |
| | | | | Ti | Al | C | N | | Ti | Al | C | N | | |
| Coated cemented carbide end mills of the invention | 2-9' | B2-1 | 3.3 | 0.50 | 0.50 | — | 1.00 | 2 | 0.80 | 0.40 | — | 1.00 | 3 | 322 |
| | 2-10' | B2-2 | 49.8 | 0.60 | 0.40 | — | 1.00 | 5 | 0.40 | 0.60 | — | 1.00 | 4 | 425 |
| | 2-11' | B2-3 | 14.6 | 0.85 | 0.15 | 0.55 | 0.45 | 3 | 0.50 | 0.50 | 0.10 | 0.90 | 2 | 331 |
| | 2-12' | B2-4 | 20.4 | 0.35 | 0.65 | — | 1.00 | 1 | 0.75 | 0.25 | 0.50 | 0.50 | 1 | 188 |
| | 2-13' | B2-5 | 7.6 | 0.40 | 0.60 | 0.01 | 0.99 | 2 | 0.40 | 0.60 | — | 1.00 | 4 | 249 |
| | 2-14' | B2-6 | 35.5 | 0.45 | 0.55 | — | 1.00 | 6 | 0.85 | 0.15 | — | 1.00 | 2 | 298 |
| | 2-15' | B2-7 | 41.2 | 0.55 | 0.45 | 0.15 | 0.85 | 0.5 | 0.50 | 0.50 | 0.35 | 0.65 | 0.5 | 77 |
| | 2-16' | B2-8 | 26.7 | 0.70 | 0.30 | 0.40 | 0.60 | 1 | 0.65 | 0.35 | — | 1.00 | 2 | 93 |

TABLE 2-11

| Classification | | Symbol | Cemented carbide substrate Average depth from the surface of amorphous layer (nm) | Hard coating layer | Cut length (m) |
|---|---|---|---|---|---|
| Conventional coated cemented carbide end mills | 2-1' | B2-1 | — | the same as the coated cemented carbide end mill 2-1' of the present invention | Failure at 58 m |
| | 2-2' | B2-2 | — | the same as the coated cemented carbide end mill 2-2' of the present invention | Failure at 57 m |
| | 2-3' | B2-3 | — | the same as the coated cemented carbide end mill 2-3' of the present invention | Failure at 47 m |
| | 2-4' | B2-4 | — | the same as the coated cemented carbide end mill 2-4' of the present invention | Failure at 22 m |
| | 2-5' | B2-5 | — | the same as the coated cemented carbide end mill 2-5' of the present invention | Failure at 21 m |
| | 2-6' | B2-6 | — | the same as the coated cemented carbide end mill 2-6' of the present invention | Failure at 18 m |
| | 2-7' | B2-7 | — | the same as the coated cemented carbide end mill 2-7' of the present invention | Failure at 7 m |
| | 2-8' | B2-8 | — | the same as the coated cemented carbide end mill 2-8' of the present invention | Failure at 10 m |

(Failure was caused by a peeling phenomenon in the hard coating layer.)

TABLE 2-12

| Classification | | Symbol | Cemented carbide substrate Average depth from the surface of amorphous layer (nm) | Hard coating layer | Cut length (m) |
|---|---|---|---|---|---|
| Conventional coated cemented carbide end mills | 2-9' | B2-1 | — | the same as the coated cemented carbide end mill 2-9' of the present invention | Failure at 51 m |
| | 2-10' | B2-2 | — | the same as the coated cemented carbide end mill 2-10' of the present invention | Failure at 62 m |
| | 2-11' | B2-3 | — | the same as the coated cemented carbide end mill 2-11' of the present invention | Failure at 53 m |

TABLE 2-12-continued

| | | Cemented carbide substrate | Hard coating layer | | | | | | | |
|---|---|---|---|---|---|---|---|---|---|---|
| | | Average depth from the surface of amorphous | First layer | | Second layer | | | | | Cut length |
| | | | Target composition (atomic ratio) | Target thickness | Target composition (atomic ratio) | | | | Target thickness | |
| Classification | Symbol | layer (nm) | Ti  Al  C  N | (μm) | Ti | Al | C | N | (μm) | (m) |
| 2-12' | B2-4 | — | the same as the coated cemented carbide end mill 2-12' of the present invention | | | | | | | Failure at 23 m |
| 2-13' | B2-5 | — | the same as the coated cemented carbide end mill 2-13' of the present invention | | | | | | | Failure at 25 m |
| 2-14' | B2-6 | — | the same as the coated cemented carbide end mill 2-14' of the present invention | | | | | | | Failure at 29 m |
| 2-15' | B2-7 | — | the same as the coated cemented carbide end mill 2-15' of the present invention | | | | | | | Failure at 8 m |
| 2-16' | B2-8 | — | the same as the coated cemented carbide end mill 2-16' of the present invention | | | | | | | Failure at 10 m |

(Failure was caused by a peeling phenomenon in the hard coating layer.)

EXAMPLE 2-3

Using three kinds of sintered round bars, each having a diameter of 8 mm (for forming cemented carbide substrates B2-1 to B2-3), a diameter of 13 mm (for forming cemented carbide substrates B2-4 to B2-6) and 26 mm (for forming cemented carbide substrates B2-7 to B2-8), produced in Example 2-2, cemented carbide substrates C2-1 to C2-8 for drills, each having a size of 4 mm×13 mm (cemented carbide substrates C2-1 to C2-3), 8 mm×22 mm (cemented carbide substrates C2-4 to C2-6), and 16 mm×45 mm (cemented carbide substrates C2-7 to C2-8), in diameter and length of the flute, were produced from these three kinds of sintered round bars.

These cemented carbide substrates C2-1 to C2-8 were subjected to ultrasonic cleaning in acetone, dried and then charged in the same arc ion plating apparatus shown in FIG. 1 and the surface of each of these cemented carbide substrates was subjected to the pre-treatment and the arc ion plating surface treatment under the same conditions as in Example 1 to form an amorphous layer on the surface of the cemented carbide substrates C2-1 to C2-8. The depth of the amorphous layer formed from the surface thereof was also set by controlling the treating time of the arc ion plating surface treatment under the conditions described above.

The structure of the amorphous layer formed on the surface of the cemented carbide substrates C2-1 to C2-8 was observed by using an transmission electron microscope (magnification: 500,000) and the judgment and measurement were conducted based on the observed results. As a result, the average depths (average of depths measured at five points) from the surface are shown in Table 2-13 and Table 2-14, respectively.

Using the same conventional chemical deposition apparatus, a single-layered or multi-layered surface hard layer of either or both of a (Ti, Al)N layer and a (Ti, Al)CN layer, which have a target composition and a target thickness shown in Table 2-13 and Table 2-14, was formed on the surface of these cemented carbide substrates under the same conditions as in Example 1, thereby producing drills made of a surface-coated carbide alloy of the present invention (hereinafter referred to as coated cemented carbide drills of the present invention) 2-1" to 2-16" as the coated cemented carbide tool of the present invention, which has a shape shown in a schematic front view of FIG. 4A and a schematic transverse cross-sectional view of FIG. 4B of the flute.

For comparison, as shown in Table 2-15 and Table 2-16, end drills made of a conventional coated cemented carbide (hereinafter referred to as conventional coated cemented carbide drills) 2-1" to 2-16" as the conventional coated cemented carbide tool were respectively produced under the same conditions described above, except that the pre-treatment and the arc ion plating surface treatment under the above conditions to the surface of the cemented carbide substrates C2-1 to C2-8 in the arc ion plating apparatus were not conducted, and therefore, the amorphous layer was not formed on the surface of the cemented carbide substrates C1-1 to C1-8. Then, the coated cemented carbide drills 2-1" to 2-3" and 2-9" to 2-11" of the present invention and the conventional coated cemented carbide drills 2-1" to 2-3" and 2-9" to 2-11", among the coated cemented carbide drills 2-1" to 2-16" of the present invention and the conventional coated cemented carbide drills 2-1" to 2-16", were subjected to a wet type high feed drilling test of a cast iron under the following conditions:

Workpiece: JIS•FC250 plate having a planar size of 100 mm×250 mm and a thickness of 50 mm,
Cutting speed: 42 m/min., and
Feed: 0.43 mm/div. The coated cemented carbide drills 2-4" to 2-6" and 2-12" to 2-14" of the present invention and the conventional coated cemented carbide drills 2-4" to 2-6" and 2-12" to 2-14" were subjected to a wet type high feed drilling test of a carbon steel under the following conditions:
Workpiece: JIS•S10C plate having a planar size of 100 mm×250 mm and a thickness of 50 mm,
Cutting speed: 45 m/min., and
Feed: 0.37 mm/div. The coated cemented carbide drills 2-7", 2-8", 2-15" and 2-16" of the present invention and the conventional coated cemented carbide drills 2-7", 2-8", 2-15" and 2-16" were subjected to a wet type high feed drilling test of an alloy steel under the following conditions:
Workpiece: JIS•SCM440 plate having a planar size of 100 mm×250 mm and a thickness of 50 mm,
Cutting speed: 60 m/min., and
Feed: 0.45 mm/div. In all wet type high feed drilling tests (water-soluble cutting oil was used in all tests), the number of drilled holes until the flank wear width of the tip edge face reaches 0.3 mm were measured. The measurement results are respectively shown in Table 2-13 and Table 2-16.

TABLE 2-13

| | | Cemented carbide substrate | Hard coating layer | | | | | | | | | |
|---|---|---|---|---|---|---|---|---|---|---|---|---|
| | | Average depth from the surface of amorphous | First layer | | | | | Second layer | | | | |
| | | | Target composition (atomic ratio) | | | | Target thickness | Target composition (atomic ratio) | | | | Target thickness | Number of drilled |
| Classification | Symbol | layer (nm) | Ti | Al | C | N | (μm) | Ti | Al | C | N | (μm) | holes |
| Coated cemented carbide dirlls of the present invention | 2-1" | C2-1 | 20.3 | 0.50 | 0.50 | 0.50 | 0.50 | 10 | — | — | — | — | — | 2004 |
| | 2-2" | C2-2 | 2.3 | 0.65 | 0.35 | — | 1.00 | 7 | — | — | — | — | — | 1966 |
| | 2-3" | C2-3 | 31.4 | 0.40 | 0.60 | 0.01 | 0.99 | 12 | — | — | — | — | — | 2155 |
| | 2-4" | C2-4 | 49.7 | 0.75 | 0.25 | — | 1.00 | 6 | — | — | — | — | — | 1109 |
| | 2-5" | C2-5 | 5.6 | 0.70 | 0.30 | 0.15 | 0.85 | 8 | — | — | — | — | — | 1326 |
| | 2-6" | C2-6 | 7.8 | 0.55 | 0.45 | 0.30 | 0.70 | 9 | — | — | — | — | — | 1415 |
| | 2-7" | C2-7 | 40.2 | 0.35 | 0.65 | — | 1.00 | 13 | — | — | — | — | — | 1154 |
| | 2-8" | C2-8 | 15.4 | 0.85 | 0.15 | — | 1.00 | 15 | — | — | — | — | — | 1201 |

TABLE 2-14

| | | Cemented carbide substrate | Hard coating layer | | | | | | | | | | |
|---|---|---|---|---|---|---|---|---|---|---|---|---|---|
| | | Average depth from the surface of amorphous | First layer | | | | | Second layer | | | | | |
| | | | Target composition (atomic ratio) | | | | Target thickness | Target composition (atomic ratio) | | | | Target thickness | Number of drilled |
| Classification | Symbol | layer (nm) | Ti | Al | C | N | (μm) | Ti | Al | C | N | (μm) | holes |
| Coated cemented carbide dirlls of the present invention | 2-9" | C2-1 | 1.2 | 0.80 | 0.20 | 0.15 | 0.85 | 8 | 0.45 | 0.55 | 0.35 | 0.65 | 0.5 | 1989 |
| | 2-10" | C2-2 | 25.6 | 0.70 | 0.30 | — | 1.00 | 6 | 0.55 | 0.45 | — | 1.00 | 5 | 2049 |
| | 2-11" | C2-3 | 45.8 | 0.60 | 0.40 | — | 1.00 | 10 | 0.70 | 0.30 | — | 1.00 | 1 | 2087 |
| | 2-12" | C2-4 | 5.6 | 0.50 | 0.50 | — | 1.00 | 3 | 0.80 | 0.20 | 0.50 | 0.50 | 10 | 1549 |
| | 2-13" | C2-5 | 16.9 | 0.35 | 0.65 | 0.01 | 0.99 | 5 | 0.40 | 0.60 | 0.10 | 0.90 | 2 | 1251 |
| | 2-14" | C2-6 | 35.8 | 0.45 | 0.55 | — | 1.00 | 4 | 0.85 | 0.15 | — | 1.00 | 2 | 1125 |
| | 2-15" | C2-7 | 10.9 | 0.60 | 0.40 | 0.35 | 0.65 | 5 | 0.50 | 0.50 | 0.20 | 0.80 | 5 | 1068 |
| | 2-16" | C2-8 | 3.3 | 0.85 | 0.15 | 0.50 | 0.50 | 6 | 0.35 | 0.65 | — | 1.00 | 9 | 1221 |

TABLE 2-15

| | | Cemented carbide substrate | Hard coating layer | | | | | | | | | | |
|---|---|---|---|---|---|---|---|---|---|---|---|---|---|
| | | Average depth from the surface of amorphous | First layer | | | | | Second layer | | | | | |
| | | | Target composition (atomic ratio) | | | | Target thickness | Target composition (atomic ratio) | | | | Target thickness | Number of drilled |
| Classification | Symbol | layer (nm) | Ti | Al | C | N | (μm) | Ti | Al | C | N | (μm) | holes |
| Conventional coated cemented carbide drills | 2-1" | C2-1 | — | the same as the coated cemented carbide drill 2-1" of the present invention | | | | | | | | | | Failure at 505 holes |
| | 2-2" | C2-2 | — | the same as the coated cemented carbide drill 2-2" of the present invention | | | | | | | | | | Failure at 483 holes |
| | 2-3" | C2-3 | — | the same as the coated cemented carbide drill 2-3" of the present invention | | | | | | | | | | Failure at 523 holes |
| | 2-4" | C2-4 | — | the same as the coated cemented carbide drill 2-4" of the present invention | | | | | | | | | | Failure at 291 holes |
| | 2-5" | C2-5 | — | the same as the coated cemented carbide drill 2-5" of the present invention | | | | | | | | | | Failure at 322 holes |

TABLE 2-15-continued

| | | Cemented carbide substrate | Hard coating layer | | | | | | | | | | |
|---|---|---|---|---|---|---|---|---|---|---|---|---|---|
| | | Average depth from the surface of amorphous | First layer | | | | | Second layer | | | | | Number of drilled |
| Classification | Symbol | layer (nm) | Target composition (atomic ratio) | | | | Target thickness (μm) | Target composition (atomic ratio) | | | | Target thickness (μm) | holes |
| | | | Ti | Al | C | N | | Ti | Al | C | N | | |
| 2-6" | C2-6 | — | the same as the coated cemented carbide drill 2-6" of the present invention | | | | | | | | | | Failure at 348 holes |
| 2-7" | C2-7 | — | the same as the coated cemented carbide drill 2-7" of the present invention | | | | | | | | | | Failure at 273 holes |
| 2-8" | C2-8 | — | the same as the coated cemented carbide drill 2-8" of the present invention | | | | | | | | | | Failure at 299 holes |

(Failure was caused by a peeling phenomenon in the hard coating layer.)

TABLE 2-16

| | | | Cemented carbide substrate | Hard coating layer | | | | | | | | | | |
|---|---|---|---|---|---|---|---|---|---|---|---|---|---|---|
| | | | Average depth from the surface of amorphous | First layer | | | | | Second layer | | | | | Number of drilled |
| Classification | | Symbol | layer (nm) | Target composition (atomic ratio) | | | | Target thickness (μm) | Target composition (atomic ratio) | | | | Target thickness (μm) | holes |
| | | | | Ti | Al | C | N | | Ti | Al | C | N | | |
| Conventional coated cemented carbide drills | 2-9" | C2-1 | — | the same as the coated cemented carbide drill 2-9" of the present invention | | | | | | | | | | Failure at 505 holes |
| | 2-10" | C2-2 | — | the same as the coated cemented carbide drill 2-10" of the present invention | | | | | | | | | | Failure at 483 holes |
| | 2-11" | C2-3 | — | the same as the coated cemented carbide drill 2-11" of the present invention | | | | | | | | | | Failure at 523 holes |
| | 2-12" | C2-4 | — | the same as the coated cemented carbide drill 2-12" of the present invention | | | | | | | | | | Failure at 291 holes |
| | 2-13" | C2-5 | — | the same as the coated cemented carbide drill 2-13" of the present invention | | | | | | | | | | Failure at 322 holes |
| | 2-14" | C2-6 | — | the same as the coated cemented carbide drill 2-14" of the present invention | | | | | | | | | | Failure at 348 holes |
| | 2-15" | C2-7 | — | the same as the coated cemented carbide drill 2-15" of the present invention | | | | | | | | | | Failure at 273 holes |
| | 2-16" | C2-8 | — | the same as the coated cemented carbide drill 2-16" of the present invention | | | | | | | | | | Failure at 299 holes |

(Failure was caused by a peeling phenomenon in the hard coating layer.)

The composition and the thickness of the hard coating layer of the coated cemented carbide inserts 2-1 to 2-20 of the present invention, the coated cemented carbide end mills 2-1' to 2-16' of the present invention and the coated cemented carbide drills 2-1" to 2-16" of the present invention as the coated cemented carbide tool of the present invention as well as the conventional coated cemented carbide inserts 2-1 to 2-20, the conventional coated cemented carbide end mills 2-1' to 2-16' and the conventional coated cemented carbide drills 2-1" to 2-16" as the conventional coated cemented carbide tool were measured by using an energy-dispersive X-ray measuring apparatus, an Auger spectrometer, and a scanning electron microscope. As a result, they exhibited the composition and average thickness (compared with an average value in thicknesses measured at five points), which are substantially the same as the target composition and the target average thickness in Table 2-2 to Table 2-5 and Table 2-9 to Table 2-16.

Third Embodiment

The third embodiment of the present invention has been carried out based on the discovered points (a) to (c). This embodiment is characterized by a coated cemented carbide tool, a wear-resistant coating layer of which has excellent adhesion, comprising: a tungsten carbide-based cemented carbide substrate having an amorphous layer formed by an arc ion plating surface treatment to an average depth of 1 to 50 nm from the surface; and a wear-resistant coating layer deposited physically and/or chemically on the surface of the tungsten carbide-based cemented carbide substrate, wherein a wear-resistant coating layer is composed of: (a) a lower coating layer which is made of one layer or a plurality of two or more layers, among a TiC layer, a TiN layer, a TiCN layer, a TiCO layer and a TiCNO layer (hereinafter generically referred to as a Ti compound layer), and has an average thickness of 0.5 to 15 µm; and (b) an upper coating layer which is made of either or both of an $Al_2O_3$ layer and an $Al_2O_3$—$ZrO_2$ mixed layer made of a matrix of $Al_2O_3$ and a $ZrO_2$ phase dispersed and distributed therein, and has an average thickness of 0.5 to 15 µm.

In the coated cemented carbide tool of the present invention, with respect to the amorphous layer formed on the surface of the cemented carbide substrate and the wear-resistant coating layer, the amorphous layer formed on the surface of the cemented carbide substrate has an action of imparting excellent adhesion between it and the wear-resistant coating layer (lower coating layer), as described above. However, when the depth is less than 1 nm, desired excellent adhesion cannot be ensured. On the other hand, the effect of improving the adhesion of the lower coating layer on the surface of the cemented carbide substrate is satisfactory when the average depth from the surface is 50 nm. Therefore, the average depth was set within a range from 1 to 50 nm.

A Ti compound layer constituting the lower coating layer basically has an action of improving the toughness of the wear-resistant coating layer, thereby remarkably suppressing chipping from occurring in the wear-resistant coating layer even in the interrupted cutting operation accompanied with high mechanical and thermal impacts under deep cutting conditions. However, when the average thickness is less than 0.5 µm, desired toughness cannot be ensured in the wear-resistant coating layer. On the other hand, when the average thickness exceeds 15 µm, plastic deformation, which is likely to cause biased wear, is liable to occur in the wear-resistant coating layer in the interrupted cutting operation under deep cutting conditions. Therefore, the average depth was set within a range from 0.5 to 15 µm.

The $Al_2O_3$ layer and the $Al_2O_3$—$ZrO_2$ mixed layer, which constitute the upper coating layer, have an action of imparting the hardness and heat resistance to the wear-resistant coating layer, thereby exhibiting excellent wear resistance without causing chipping in the co-existing lower coating layer. When the average thickness is less than 0.5 µm, desired excellent wear resistance cannot be ensured. On the other hand, when the average thickness exceeds 15 µm, chipping is liable to occur in the wear-resistant coating layer. Therefore, the average depth was set within a range from 0.5 to 15 µm.

The coated cemented carbide tool of this embodiment will be described in detail.

EXAMPLE 3-1

Cemented carbide substrates A3-1 to A3-6, each having a shape of a throw-away insert defined in ISO•SNGA120412, were produced by preparing a WC powder, a (Ti, W)C (TiC/WC=30/70 in a weight ratio, the same as in other powders) powder, a (Ti, W)CN (TiC/TiN/WC=24/20/56) powder, a (Ta, Nb)C (TaC/NbC=90/10) powder, a $Cr_3C_2$ powder and a Co powder, each having a predetermined average grain size of 0.5 to 4 µm, compounding these raw powders according to each formulation in Table 3-1, wet-mixing them in a ball mill for 72 hours, drying the mixture, compacting the dried mixture under a pressure of 100 MPa to form green compacts, vacuum-sintering these green compacts under the conditions of a vacuum degree of 6 Pa, a temperature of 1410° C. for one hour, and subjecting the cutting edge portion to honing (R: 0.05).

These cemented carbide substrates A3-1 to A3-6 were subjected to ultrasonic cleaning in acetone, were dried, and were then charged in a conventional arc ion plating apparatus shown in FIG. 1 and the surface of each of the cemented carbide substrates A–F was subjected to a pre-treatment under the following conditions:

Atmospheric temperature in apparatus (temperature of cemented carbide substrate): 400° C.,
Atmospheric gas: Ar,
Atmospheric pressure: 3 Pa,
Cathode electrode: (not used)
Arc discharge current: (Arc powder—OFF),
Bias pressure applied to cemented carbide substrate: −900 V, and
Treating time: 3 min., and then subjected to an arc ion plating surface treatment under the following conditions:
Atmospheric temperature in apparatus: 500° C.,
Atmospheric gas: Ar,
Atmospheric pressure: 3 Pa,
Cathode electrode: metallic Ti,
Arc discharge current: 150 A, and
Bias pressure applied to cemented carbide substrate: −1000 V, thereby to form an amorphous layer on the surface of the cemented carbide substrates A to F. The depth of the amorphous layer formed from the surface thereof was set by controlling the treating time of the arc ion plating surface treatment under the conditions described above.

The structure of the amorphous layer formed on the surface of the cemented carbide substrates A3-1 to A3-6 was observed by using an transmission electron microscope (magnification: 500,000) and the judgment and measurement were conducted based on the observation results. As a result, the average depth (average of depths measured at five points) from the surface is shown in Table 3-3, respectively.

Using a conventional chemical deposition apparatus, a wear-resistant coating layer composed of a Ti compound layer (lower coating layer) having a target composition and a target thickness shown in Table 3-3 and an $Al_2O_3$ layer and/or an $Al_2O_3$—$ZrO_2$ mixed layer (upper coating layer) was formed on the surface of these cemented carbide substrates A3-1 to A3-6 under the conditions (l-TiCN in the table represents conditions for formation of a TiCN layer with a crystal structure grown longitudinally as described in Japanese Patent Application, First Publication No. Hei 6-8010) shown in Table 3-2, thereby producing throw-away inserts made of a surface-coated carbide alloy of this embodiment (hereinafter referred to as coated cemented carbide inserts of the present invention) 3-1 to 3-10 as the coated cemented carbide tool of the present invention, which has a shape shown in a schematic perspective view of FIG. 2A and a schematic longitudinal cross-sectional view of FIG. 2B.

For comparison, as shown in Table 3-4, conventional coated cemented carbide inserts 3-1 to 3-10 (hereinafter referred to as conventional coated cemented carbide inserts) were respectively produced under the same conditions described above, except that the pre-treatment and the arc ion plating surface treatment under the above conditions to the surface of the cemented carbide substrates A3-1 to A3-6 in the arc ion plating apparatus were not conducted, and therefore, the amorphous layer was not formed on the surface of the cemented carbide substrates A3-1 to A3-6.

Then, the coated cemented carbide inserts 3-1 to 3-10 of the present invention and the conventional coated cemented carbide inserts 3-1 to 3-10 were subjected to a dry type thick depth-of-cut interrupted cutting test of an alloy steel under the following conditions:

Workpiece: JIS•SCM440 round bar with four longitudinal grooves equally spaced,
Cutting speed: 130 m/min.,
Depth of cut: 5.3 mm,
Feed: 0.18 mm/rev., and
Cutting time: 5 min., a dry type high feed interrupted cutting test of a carbon steel under the following conditions:

Workpiece: JIS•S20C round bar with four longitudinal grooves equally spaced,
Cutting speed: 135 m/min.,
Depth of cut: 1.4 mm,
Feed: 0.5 mm/rev., and
Cutting time: 5 min., and a dry type high speed interrupted cutting test of a ductile cast iron under the following conditions:

Workpiece: JIS•FC450 round bar with four longitudinal grooves equally spaced,
Cutting speed: 170 m/min.,
Depth of cut: 7 mm,
Feed: 0.2 mm/rev., and
Cutting time: 5 min., in the state of being screwed into the tip portion of a tool steel bit using a fixing jig. In all cutting tests, the flank wear width of the cutting edge was measured. The measurement results are shown in Table 3-5.

TABLE 3-1

| | | Composition formula (% by weight) | | | | | |
|---|---|---|---|---|---|---|---|
| Classification | | Co | (Ti, W) C | (Ti, W) CN | (Ta, Nb) C | $Cr_3C_2$ | WC |
| Cemented carbide substrates (inserts) | A3-1 | 6 | — | — | 1.5 | 0.3 | balance |
| | A3-2 | 6 | — | 3 | 4 | — | balance |
| | A3-3 | 7 | 3.5 | 3 | 4 | — | balance |
| | A3-4 | 8.5 | 7 | 2 | — | 0.5 | balance |
| | A3-5 | 9 | 15 | — | 6 | — | balance |
| | A3-6 | 10 | — | — | 2 | — | balance |

TABLE 3-2

| Wear-resistant coating layer | Forming conditions | | |
|---|---|---|---|
| | | Reactive atmosphere | |
| Classification | Composition of reactive gas (% by volume) | Pressure (kPa) | Temperature (° C.) |
| TiC | $TiCl_4$: 4.2%, $CH_4$: 8.5%, $H_2$: balance | 7 | 1020 |
| TiN | $TiCl_4$: 4.2%, $N_2$: 30%, $H_2$: balance | 20 | 900 |
| 1-TiCN | $TiCl_4$: 4.2%, $N_2$: 20%, $CH_3CN$: 0.6%, $H_2$: balance | 7 | 900 |
| TiCN | $TiCl_4$: 4.2%, $N_2$: 20%, $CH_4$: 4%, $H_2$: balance | 7 | 1020 |
| TiCO | $TiCl_4$: 4.2%, CO: 4%, $H_2$: balance | 7 | 1020 |
| TiCNO | $TiCl_4$: 4.2%, CO: 3%, $CH_4$: 3%, $N_2$: 20%, $H_2$: balance | 15 | 1020 |
| $\alpha$-$Al_2O_3$ | $AlCl_3$: 2.2%, $CO_2$: 5.5%, CHl: 2.2%, $H_2S$: 0.2%, $H_2$: balance | 7 | 1000 |
| $\kappa$-$Al_2O_3$ | $AlCl_3$: 3.3%, $CO_2$: 5.5%, CHl: 2.2%, $H_2S$: 0.2%, $H_2$: balance | 7 | 950 |
| Mixed layer ① (matrix: $\alpha$-$Al_2O_3$, $ZrO_2$: 3 mol %) | $AlCl_3$: 3.3%, $ZrCl_4$: 1.1%, $CO_2$: 5%, HCl: 2.2%, $H_2$: balance | 7 | 1000 |
| Mixed layer ② (matrix: $\kappa$-$Al_2O_3$, $ZrO_2$: 10 mol %) | $AlCl_3$: 1.1%, $ZrCl_4$: 3.3%, $CO_2$: 4%, HCl: 2.2%, $H_2$: balance | 7 | 950 |

(The percentage of $ZrO_2$ in the mixed layers ① and ② represents a target content)

TABLE 3-3

| | | Cemented carbide substrate | Wear-resistant coating layer (Figure in parentheses means target thickness) | | | | |
|---|---|---|---|---|---|---|---|
| Classification | | Symbol | Average depth from the surface of amorphous layer (nm) | First layer | Second layer | Third layer | Fourth layer | Fifth layer |
| Coated cemented carbide inserts of the present invention | 3-1 | A3-1 | 4.2 | TiN (0.5) | 1-TiCN (3) | TiC (1.8) | TiCNO (0.3) | $\alpha Al_2O_3$ (6) |
| | 3-2 | A3-2 | 49.9 | TiN (2) | TiCN (6) | TiC (1) | TiCO (1) | $\kappa Al_2O_3$ (2) |

TABLE 3-3-continued

| | | Cemented carbide substrate | Wear-resistant coating layer (Figure in parentheses means target thickness) | | | | |
|---|---|---|---|---|---|---|---|
| Classification | Symbol | Average depth from the surface of amorphous layer (nm) | First layer | Second layer | Third layer | Fourth layer | Fifth layer |
| 3-3 | A3-3 | 7.8 | TiC (3) | 1-TiCN (4) | TiCO (0.6) | αAl$_2$O$_3$ (10) | — |
| 3-4 | A3-4 | 13.1 | TiN (0.5) | 1-TiCN (14) | TiCNO (0.5) | αAl$_2$O$_3$ (15) | — |
| 3-5 | A3-5 | 20.4 | TiC (0.5) | 1-TiCN (6) | TiCO (0.4) | κAl$_2$O$_3$ (7) | — |
| 3-6 | A3-6 | 3.8 | TiN (0.2) | TiC (0.3) | αAl$_2$O$_3$ (1) | — | — |
| 3-7 | A3-1 | 15.9 | TiC (2) | 1-TiCN (6) | TiCNO (0.5) | Mixed layer ② (8) | αAl$_2$O$_3$ (3) |
| 3-8 | A3-2 | 1.2 | TiC (3) | 1-TiCN (4) | TiCNO (0.6) | Mixed layer ① (5) | κAl$_2$O$_3$ (5) |
| 3-9 | A3-5 | 30.4 | TiN (1.5) | TiC (5) | 1-TiCN (6) | TiCO (0.6) | Mixed layer ① (8) |
| 3-10 | A3-6 | 26.7 | TiN (1) | TiC (2) | Mixed layer ② (0.5) | — | — |

TABLE 3-4

| | | | Cemented carbide substrate | Wear-resistant coating layer (Figure in parentheses means target thickness) | | | | |
|---|---|---|---|---|---|---|---|---|
| Classification | | Symbol | Average depth from the surface of amorphous layer (nm) | First layer | Second layer | Third layer | Fourth layer | Fifth layer |
| Conventional coated cemented carbide inserts | 3-1 | A3-1 | — | the same as the coated cemented carbide insert 3-1 of the present invention | | | | |
| | 3-2 | A3-2 | — | the same as the coated cemented carbide insert 3-2 of the present invention | | | | |
| | 3-3 | A3-3 | — | the same as the coated cemented carbide insert 3-3 of the present invention | | | | |
| | 3-4 | A3-4 | — | the same as the coated cemented carbide insert 3-4 of the present invention | | | | |
| | 3-5 | A3-5 | — | the same as the coated cemented carbide insert 3-5 of the present invention | | | | |
| | 3-6 | A3-6 | — | the same as the coated cemented carbide insert 3-6 of the present invention | | | | |
| | 3-7 | A3-7 | — | the same as the coated cemented carbide insert 3-7 of the present invention | | | | |
| | 3-8 | A3-8 | — | the same as the coated cemented carbide insert 3-8 of the present invention | | | | |
| | 3-9 | A3-9 | — | the same as the coated cemented carbide insert 3-9 of the present invention | | | | |
| | 3-10 | A3-10 | — | the same as the coated cemented carbide insert 3-10 of the present invention | | | | |

TABLE 3-5

| | | Flank wear width (nm) | | | Cutting test results | | | | |
|---|---|---|---|---|---|---|---|---|---|
| Classification | | Interrupted thick depth-of-cut of alloy steel | Interrupted high feed of carbon steel | Interrupted thick depth-of-cut of ductile cast iron | Classification | | Interrupted thick depth-of-cut of alloy steel | Interrupted high feed of carbon steel | Interrupted thick depth-of-cut of ductile cast iron |
| Coated cemented carbide inserts of the present | 3-1 | 0.14 | 0.15 | 0.20 | Conventional coated cemented carbide inserts | 3-1 | Failure in 3.1 min. | Failure in 3.7 min. | Failure in 0.8 min. |
| | 3-2 | 0.15 | 0.15 | 0.21 | | 3-2 | Failure in 3.2 min. | Failure in 3.8 min. | Failure in 4.8 min. |
| | 3-3 | 0.17 | 0.16 | 0.18 | | 3-3 | Failure in 1.5 min. | Failure in 2.0 min. | Failure in 1.2 min. |

TABLE 3-5-continued

| | | Flank wear width (nm) | | | | Cutting test results | | |
|---|---|---|---|---|---|---|---|---|
| Classification | | Interrupted thick depth-of-cut of alloy steel | Interrupted high feed of carbon steel | Interrupted thick depth-of-cut of ductile cast iron | Classification | Interrupted thick depth-of-cut of alloy steel | Interrupted high feed of carbon steel | Interrupted thick depth-of-cut of ductile cast iron |
| invention | 3-4 | 0.18 | 0.19 | 0.17 | 3-4 | Failure in 0.7 min. | Failure in 0.9 min. | Failure in 0.7 min. |
| | 3-5 | 0.20 | 0.17 | 0.19 | 3-5 | Failure in 1.6 min. | Failure in 1.9 min. | Failure in 1.5 min. |
| | 3-6 | 0.22 | 0.20 | 0.24 | 3-6 | Failure in 3.9 min. | Failure in 4.1 min. | Failure in 4.0 min. |
| | 3-7 | 0.21 | 0.18 | 0.18 | 3-7 | Failure in 1.2 min. | Failure in 1.1 min. | Failure in 1.3 min. |
| | 3-8 | 0.19 | 0.16 | 0.19 | 3-8 | Failure in 1.3 min. | Failure in 2.2 min. | Failure in 1.5 min. |
| | 3-9 | 0.19 | 0.17 | 0.19 | 3-9 | Failure in 0.9 min. | Failure in 1.0 min. | Failure in 1.9 min. |
| | 3-10 | 0.17 | 0.19 | 0.25 | 3-10 | Failure in 3.3 min. | Failure in 4.0 min. | Failure in 4.4 min. |

(Failure was caused by peeling of the wear-resistant coating layer.)

EXAMPLE 3-2

Cemented carbide substrates B3-1 to B3-8 for end mill, each having a size of 6 mm×13 mm, 10 mm×22 mm, and 20 mm×45 mm in diameter and length of the cutting edge portion, were produced in accordance with the combination shown in Table 3-6 by preparing a WC powder of medium coarse grains having an average grain size of 5.5 $\mu$m, a WC powder of fine grains having an average grain size of 0.8 $\mu$m, a TaC powder having an average grain size of 1.3 $\mu$m, a NbC powder having an average grain size of 1.2 $\mu$m, a ZrC powder having an average grain size of 1.2 $\mu$m, a $Cr_3C_2$ powder having an average grain size of 2.3 $\mu$m, a VC powder having an average grain size of 1.5 $\mu$m, a (Ti, W)C powder having an average grain size of 1.0 $\mu$m and a Co powder having an average grain size of 1.8 $\mu$m, compounding these raw powders according to each formulation in Table 3-6, adding a wax, mixing them in acetone in a ball mill for 24 hours, drying the mixture under reduced pressure, compacting the dried mixture under a pressure of 100 MPa to form green compacts, sintering these green compacts under the conditions of heating to a predetermined temperature within a range from 1370 to 1470° C. at a heating rate of 7° C./min. in a vacuum atmosphere of 6 Pa, and maintaining at this temperature for one hour and furnace-cooling, thereby forming three kinds of sintered round bars for forming cemented carbide substrate, each having a diameter of 8 mm, 13 mm, and 26 mm, and cutting three kinds of the sintered round bars.

These cemented carbide substrates B3-1 to B3-8 were subjected to ultrasonic cleaning in acetone, were dried, and were then charged in the same arc ion plating apparatus shown in FIG. 1 and the surface of each of these cemented carbide substrates was subjected to the pre-treatment and the arc ion plating surface treatment under the same conditions as in Example 1 to form an amorphous layer on the surface of the cemented carbide substrates B3-1 to B3-8. The depth of the amorphous layer formed from the surface thereof was also set by controlling the treating time of the arc ion plating surface treatment under the conditions described above.

The structure of the amorphous layer formed on the surface of the cemented carbide substrates B3-1 to B3-8 was observed by using an transmission electron microscope (magnification: 500,000) and the judgment and measurement were conducted based on the observed results. As a result, the average depth (average of depths measured at five points) from the surface is shown in Table 3-7, respectively.

Figure 3A:
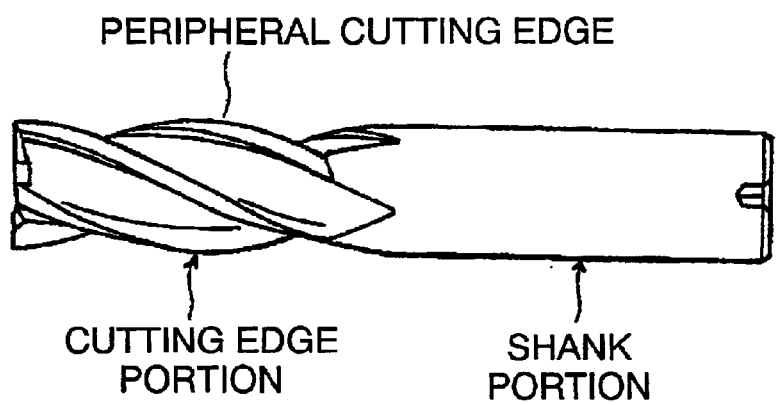
FIG. 3A and FIG. 3B show a coated cemented carbide end mill.
Figure 3B:
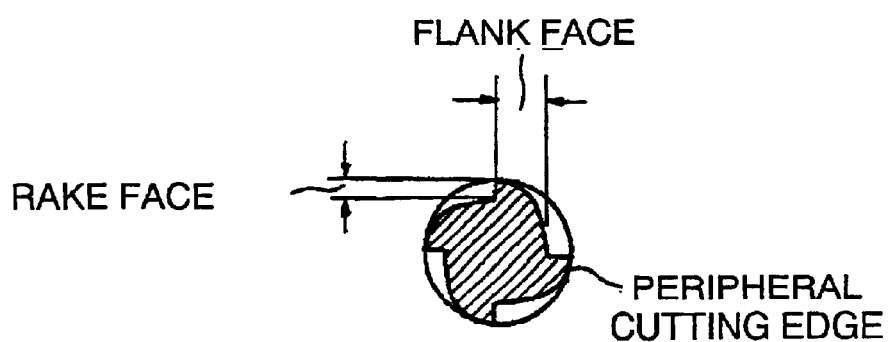

Using the same chemical deposition apparatus, a wear-resistant coating layer composed of a Ti compound layer (lower coating layer) having a target composition and a target thickness shown in Table 3-7 and an $Al_2O_3$ layer and/or an $Al_2O_3$—$ZrO_2$ mixed layer (upper coating layer) was formed on the surface of these cemented carbide substrates under the conditions shown in Table 3-2, thereby producing end mills made of a surface-coated carbide alloy of the present invention (hereinafter referred to as coated cemented carbide end mills of the present invention) 3-1' to 3-8' as the coated cemented carbide tool of the present invention, which has a shape shown in a schematic front view of FIG. 3A and a schematic transverse cross-sectional view of FIG. 3B of the cutting edge portion.

For comparison, as shown in Table 3-8, end mills made of a conventional coated cemented carbide (hereinafter referred to as conventional coated cemented carbide end mills) 3-1' to 3-8' as the conventional coated cemented carbide tool were respectively produced under the same conditions described above, except that the pre-treatment and the arc ion plating surface treatment under the above conditions to the surf ace of the cemented carbide substrates B3-1 to B3-8 in the arc ion plating apparatus were not conducted, and therefore, the amorphous layer was not formed on the surface of the cemented carbide substrates B3-1 to B3-8.

Then, the coated cemented carbide end mills 3-1' to 3-3' of the present invention and the conventional coated cemented carbide end mills 3-1' to 3-3', among the coated cemented carbide end mills 3-1' t o 3-8' of the present invention and the conventional coated cemented carbide end mills 3-1' to 3-8', were subjected to a wet type thick depth-of-cut side cutting test of a cast iron under the following conditions:

Workpiece: JIS•FC250 plate having a planar size of 100 mm×250 mm and a thickness of 50 mm,
Rotating speed: 5500 $min^{-1}$,
Depth of cut in axial direction: 12 mm,
Depth of cut in radial direction: 1.6 mm, and Feed: 590 mm/min.

The coated cemented carbide end mills 3-4' to 3-6' of the present invention and the conventional coated cemented carbide end mills 3-4' to 3-6' were subjected to a wet type thick depth-of-cut side cutting test of a carbon steel under the following conditions:

Workpiece: JIS•S10C plate having a planar size of 100 mm×250 mm and a thickness of 50 mm,
Rotating speed: 2200 $min^{-1}$,
Depth of cut in axial direction: 20 mm,
Depth of cut in radial direction: 2.5 mm, and
Feed: 260 mm/min.

The coated cemented carbide end mills 3-7' to 3-8' of the present invention and the conventional coated cemented carbide end mills 3-7' to 3-8' were subjected to a wet type thick depth-of-cut side cutting test of a hardened steel under the following conditions:

Workpiece: JIS•SKD61 (hardness: HRC52) plate having a planar size of 100 mm×250 mm and a thickness of 50 mm,
Rotating speed: 670 $min^{-1}$,
Depth of cut in axial direction: 26 mm,
Depth of cut in radial direction: 1.4 mm, and
Feed: 70 mm/min.

In all side cutting tests (water-soluble cutting oil was used in all tests), the cutting length until the flank wear amount of the peripheral edge reaches 0.1 mm as a criterion of the service life was measured. The measurement results are respectively shown in Table 3-7 and Table 3-8.

TABLE 3-6

| Classification | | Symbol | Co | (Ti, W) C | TaC | NbC | ZrC | $Cr_3C_2$ | VC | WC | Diameter × length (mm) of cutting edge portion |
|---|---|---|---|---|---|---|---|---|---|---|---|
| Cemented carbide substrates (end mills) | | B3-1 | 6 | 5 | — | — | — | — | — | Medium coarse grains: balance | 6 × 13 |
| | | B3-2 | 10 | — | 1 | 0.5 | — | — | — | Fine grains: balance | 6 × 13 |
| | | B3-3 | 10 | — | 1 | — | 1 | 0.5 | 0.5 | Fine grains: balance | 6 × 13 |
| | | B3-4 | 8 | — | — | — | — | 0.5 | 0.5 | Fine grains: balance | 10 × 22 |
| | | B3-5 | 9 | 10 | 9 | 1 | — | — | — | Medium coarse grains: balance | 10 × 22 |
| | | B3-6 | 10 | — | — | — | — | 1 | — | Fine grains: balance | 10 × 22 |
| | | B3-7 | 8 | 17 | 9 | 1 | — | — | — | Medium coarse grains: balance | 20 × 45 |
| | | B3-8 | 6 | — | 10 | 5 | 10 | — | — | Medium coarse grains: balance | 20 × 45 |

TABLE 3-7

| Classification | Symbol | Cemented carbide substrate Average depth from the surface of amorphous layer (nm) | Wear-resistant coating layer (Figure in parentheses means target thickness) | | | | | Cut length (m) |
|---|---|---|---|---|---|---|---|---|
| | | | First layer | Second layer | Third layer | Fourth layer | Fifth layer | |
| Coated cemented carbide end mills of the present invention | 3-1' | B3-1 / 20.5 | TiN (0.2) | 1-TiCN (2) | TiC (0.5) | TiCNO (0.5) | $\alpha Al_2O_3$ (1) | 383 |
| | 3-2' | B3-2 / 1.2 | TiN (0.2) | TiCN (3) | TiCO (0.5) | $\kappa Al_2O_3$ (0.5) | — | 398 |
| | 3-3' | B3-3 / 49.8 | TiN (0.5) | 1-TiCN (3) | TiCNO (0.5) | $\alpha Al_2O_3$ (1) | — | 392 |
| | 3-4' | B3-4 / 10.5 | TiC (0.5) | 1-TiCN (2) | TiCO (0.5) | $\kappa Al_2O_3$ (2) | — | 231 |
| | 3-5' | B3-5 / 3.3 | TiN (0.2) | TiC (3) | $\alpha Al_2O_3$ (3) | — | — | 242 |
| | 3-6' | B3-6 / 41.2 | TiN (0.2) | 1-TiCN (3) | TiCNO (0.5) | Mixed layer ② (1) | — | 225 |
| | 3-7' | B3-7 / 31.5 | TiC (0.5) | TiCN (1) | TiCNO (0.5) | Mixed layer ① (1) | $\kappa Al_2O_3$ (1) | 87 |
| | 3-8' | B3-8 / 5.5 | TiN (0.2) | 1-TiCN (2) | TiC (2) | TiCO (0.5) | — | 95 |

TABLE 3-8

| Classification | | Symbol | Cemented carbide substrate Average depth from the surface of amorphous layer (nm) | Wear-resistant coating layer (Figure in parentheses means target thickness) | | | | | Cut length (m) |
|---|---|---|---|---|---|---|---|---|---|
| | | | | First layer | Second layer | Third layer | Fourth layer | Fifth layer | |
| Conventional coated cemented carbide end mills | 3-1' | B3-1 | — | the same as the coated cemented carbide end mill 3-1' of the present invention | | | | | Failure at 55 m |
| | 3-2' | B3-2 | — | the same as the coated cemented carbide end mill 3-2' of the present invention | | | | | Failure at 59 m |
| | 3-3' | B3-3 | — | the same as the coated cemented carbide end mill 3-3' of the present invention | | | | | Failure at 69 m |
| | 3-4' | B3-4 | — | the same as the coated cemented carbide end mill 3-4' of the present invention | | | | | Failure at 42 m |
| | 3-5' | B3-5 | — | the same as the coated cemented carbide end mill 3-5' of the present invention | | | | | Failure at 28 m |
| | 3-6' | B3-6 | — | the same as the coated cemented carbide end mill 3-6' of the present invention | | | | | Failure at 36 m |
| | 3-7' | B3-7 | — | the same as the coated cemented carbide end mill 3-7' of the present invention | | | | | Failure at 7 m |
| | 3-8' | B3-8 | — | the same as the coated cemented carbide end mill 3-8' of the present invention | | | | | Failure at 8 m |

(Failure was caused by peeling of the wear-resistant coating layer.)

EXAMPLE 3-3

Using three kinds of sintered round bars, each having a diameter of 8 mm (for forming cemented carbide substrates B3-1 to B3-3), a diameter of 13 mm (for forming cemented carbide substrates B3-4 to B3-6) and 26 mm (for forming cemented carbide substrates B3-7 to B3-8), produced in Example 3-2, cemented carbide substrates C3-1 to C3-8 for drills, each having a size of 4 mm×13 mm (cemented carbide substrates C3-1 to C3-3), 8 mm×22 mm (cemented carbide substrates C3-4 to C3-6), and 16 mm×45 mm (cemented carbide substrates C3-7 to C3-8) in diameter and length of the flute, were produced from these three kinds of sintered round bars.

These cemented carbide substrates C3-1 to C3-8 were subjected to ultrasonic cleaning in acetone, were dried, and were then charged in the same arc ion plating apparatus shown in FIG. 1 and the surface of each of these cemented carbide substrates was subjected to the pre-treatment and the arc ion plating surface treatment under the same conditions as in Example 1 to form an amorphous layer on the surface of the cemented carbide substrates C3-1 to C3-8. The depth of the amorphous layer formed from the surface thereof was also set by controlling the treating time of the arc ion plating surface treatment under the conditions described above.

The structure of the amorphous layer formed on the surface of the cemented carbide substrates C3-1 to C3-8 was observed by using an transmission electron microscope (magnification: 500,000) and the judgment and measurement were conducted based on the observed results. As a result, the average depths (average of depths measured at five points) from the surface are shown in Table 3-9, respectively.

Figure 4A:
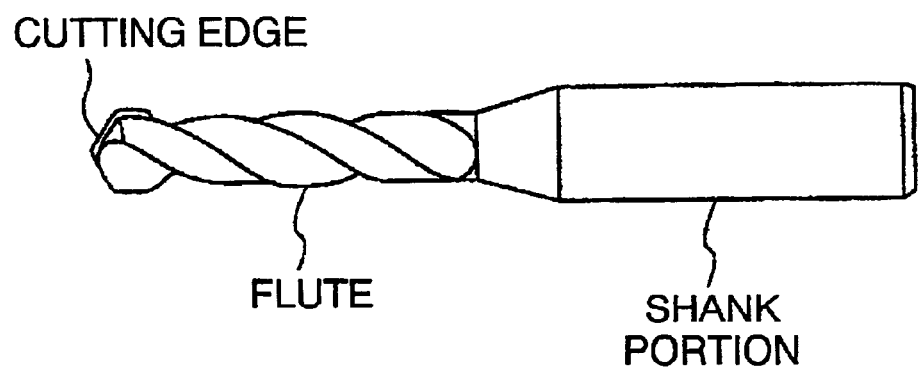
FIG. 4A and FIG. 4B show a coated cemented carbide drill.
Figure 4B:
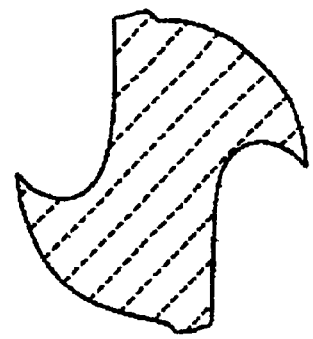

Using the same conventional chemical deposition apparatus, a wear-resistant coating layer composed of a Ti compound layer (lower coating layer) having a target composition and a target thickness shown in Table 3-9 and an $Al_2O_3$ layer and/or an $Al_2O_3$—$ZrO_2$ mixed layer (upper coating layer) was formed on the surface of these cemented carbide substrates under the conditions shown in Table 3-2, thereby producing drills made of a surface-coated carbide alloy of the present invention (hereinafter referred to as coated cemented carbide drills of the present invention) 3-1 to 3-8 as the coated cemented carbide tool of the present invention, which has a shape shown in a schematic front view of FIG. 4A and a schematic transverse cross-sectional view of FIG. 4B of the flute.

For comparison, as shown in Table 3-10, end drills made of a conventional coated cemented carbide (hereinafter referred to as conventional coated cemented carbide drills) 3-1" to 3-8" as the conventional coated cemented carbide tool were respectively produced under the same conditions described above, except that the pre-treatment and the arc ion plating surface treatment under the above conditions on the surface of the cemented carbide substrates C3-1 to C3-8 in the arc ion plating apparatus were not conducted, and therefore, the amorphous layer was not formed on the surface of the cemented carbide substrates C3-1 to C3-8.

Then, the coated cemented carbide drills 3-1" to 3-3" of the present invention and the conventional coated cemented carbide drills 3-1" to 3-3", among the coated cemented carbide drills 3-1" to 3-8" of the present invention and the conventional coated cemented carbide drills 3-1" to 3-8", were subjected to a wet type high feed drilling test of a cast iron under the following conditions:

Workpiece: JIS•FC250 plate having a planar size of 100 mm×250 mm and a thickness of 50 mm,
Cutting speed: 48 m/min., and
Feed: 0.41 mm/div. The coated cemented carbide drills 3-4" to 3-6" of the present invention and the conventional coated cemented carbide drills 3-4" to 3-6" were subjected to a wet type high feed drilling test of a carbon steel under the following conditions:
Workpiece: JIS•S10C plate having a planar size of 100 mm×250 mm and a thickness of 50 mm,
Cutting speed: 50 m/min., and
Feed: 0.36 mm/div. The coated cemented carbide drills 3-7" and 3-8" of the present invention and the conventional coated cemented carbide drills 3-7" and 3-8" were subjected to a wet type high feed drilling test of an alloy steel under the following conditions:
Workpiece: JIS•SCM440 plate having a planar size of 100 mm×250 mm and a thickness of 50 mm,
Cutting speed: 65 m/min., and
Feed: 0.42 mm/div. In all wet type high feed drilling tests (water-soluble cutting oil was used in all tests), the number of drilled holes until the flank wear width of the tip edge face reaches 0.3 mm was measured. The measurement results are respectively shown in Table 3-9 and Table 3-10.

TABLE 3-9

| Classification | | Symbol | Cemented carbide substrate Average depth from the surface of amorphous layer (nm) | Wear-resistant coating layer (Figure in parentheses means target thickness) | | | | | Number of drilled holes |
|---|---|---|---|---|---|---|---|---|---|
| | | | | First layer | Second layer | Third layer | Fourth layer | Fifth layer | |
| Coated cemented carbide drills of the present invention | 3-1" | C3-1 | 10.8 | TiN (0.5) | 1-TiCN (5) | TiC (1) | TiCNO (0.5) | αAl$_2$O$_3$ (2) | 2215 |
| | 3-2" | C3-2 | 3.3 | TiN (0.2) | TiCN (2) | TiCO (1) | κAl$_2$O$_3$ (3) | — | 2012 |
| | 3-3" | C3-3 | 48.8 | TiN (1) | 1-TiCN (6) | TiCNO (0.5) | αAl$_2$O$_3$ (0.5) | — | 2110 |
| | 3-4" | C3-4 | 6.2 | TiC (0.5) | 1-TiCN (8) | TiCO (0.5) | κAl$_2$O$_3$ (3) | — | 1629 |
| | 3-5" | C3-5 | 21.2 | TiN (0.5) | TiC (5) | αAl$_2$O$_3$ (5) | — | — | 1556 |
| | 3-6" | C3-6 | 39.7 | TiN (1) | 1-TiCN (5) | TiCNO (0.5) | Mixed layer ② (1) | — | 1432 |
| | 3-7" | C3-7 | 1.5 | TiC (0.5) | TiCN (3) | TiCNO (1) | Mixed layer ① (2) | κAl$_2$O$_3$ (2) | 1139 |
| | 3-8" | C3-8 | 32.2 | TiN (1) | 1-TiCN (7) | TiC (3) | TiCO (1) | Mixed layer ① (2) | 1305 |

TABLE 3-10

| Classification | | Symbol | Cemented carbide substrate Average depth from the surface of amorphous layer (nm) | Wear-resistant coating layer (Figure in parentheses means target thickness) | | | | | Number of drilled holes |
|---|---|---|---|---|---|---|---|---|---|
| | | | | First layer | Second layer | Third layer | Fourth layer | Fifth layer | |
| Conventional coated cemented carbide drills | 3-1" | C3-1 | — | the same as the coated cemented carbide drill 3-1" of the present invention | | | | | Failure at 555 holes |
| | 3-2" | C3-2 | — | the same as the coated cemented carbide drill 3-2" of the present invention | | | | | Failure at 521 holes |
| | 3-3" | C3-3 | — | the same as the coated cemented carbide drill 3-3" of the present invention | | | | | Failure at 533 holes |
| | 3-4" | C3-4 | — | the same as the coated cemented carbide drill 3-4" of the present invention | | | | | Failure at 421 holes |
| | 3-5" | C3-5 | — | the same as the coated cemented carbide drill 3-5" of the present invention | | | | | Failure at 395 holes |
| | 3-6" | C3-6 | — | the same as the coated cemented carbide drill 3-6" of the present invention | | | | | Failure at 383 holes |
| | 3-7" | C3-7 | — | the same as the coated cemented carbide drill 3-7" of the present invention | | | | | Failure at 288 holes |
| | 3-8" | C3-8 | — | the same as the coated cemented carbide drill 3-8" of the present invention | | | | | Failure at 326 holes |

(Failure was caused by peeling of the wear-resistant coating layer.)

The composition and the thickness of the hard coating layer of the coated cemented carbide inserts 3-1 to 3-10 of the present invention, the coated cemented carbide end mills 3-1' to 3-8' of the present invention, and the coated cemented carbide drills 3-1" to 3-8" of the present invention as the coated cemented carbide tool of the present invention as well as the conventional coated cemented carbide inserts 3-1 to 3-10, the conventional coated cemented carbide end mills 3-1' to 3-8', and the conventional coated cemented carbide drills 3-1" to 3-8" as the conventional coated cemented carbide tool were measured by using an energy-dispersive X-ray measuring apparatus, an Auger spectrometer, and a scanning electron microscope. As a result, they exhibited the composition and average thickness (compared with an average value of thicknesses measured at five points), which are substantially the same as the target composition and the target average thickness in Table 3-3, Table 3-4 and Table 3-7 to Table 3-10.

Fourth Embodiment

In the fourth embodiment, in order to further improve the adhesion of a wear-resistant coating layer (surface hard layer), which constitutes the conventional coated cemented carbide tool, to the surface of the cemented carbide substrate, the adhesion was further improved based on the discovered points (a) to (c) described above. Using an arc ion plating apparatus shown in FIG. 1, tests were conducted and the following test results were obtained.

(a) When the cemented carbide substrate was charged in the arc ion plating apparatus and the surface of the cemented carbide substrate was subjected to a pre-treatment without using a cathode electrode under the following conditions of an atmospheric temperature in apparatus (temperature of cemented carbide substrate): 300 to 500° C., an atmospheric gas: Ar, an atmospheric pressure: 1 to 10 Pa, an arc discharge current: (Arc powder—OFF), a bias pressure applied to cemented carbide substrate: −800 to −1000 V, and a treating time: 2 to 10 min., and then the surface of the cemented carbide substrate is further subjected to an arc ion plating surface treatment using metallic Ti as the cathode electrode under the following conditions of an atmospheric temperature in the apparatus: 450 to 550° C., an atmospheric gas: Ar, an atmospheric pressure: 1 to 10 Pa, an arc discharge current: 100 to 200 A, and a bias pressure applied to cemented carbide substrate: −900 to −1200 V, a metallic Ti layer as a deposition layer is not formed on the surface of the cemented carbide substrate. The structure of the surface of the cemented carbide substrate itself is observed using a transmission electron microscope. As a result, formation of an amorphous layer is confirmed. Formation of the metallic Ti layer using the arc ion plating apparatus is conducted under the following condition of an atmospheric temperature in apparatus: 300 to 500° C., an atmospheric gas: (not used), an atmospheric pressure: vacuum at 0.1 Pa or less, a cathode electrode: metallic Ti, an arc discharge current: 50 to 100 A, and a bias pressure applied to cemented carbide substrate: −30 to −100 V.

(b) In the state where an amorphous layer is formed in an average depth of 1 to 50 nm from the surface, when a wear-resistant coating layer of the conventional coated cemented carbide tool is formed, when a (Ti, Al)N layer and a (Ti, Al)CN layer, which constitute a surface hard layer of the conventional coated cemented carbide tool, is formed on the surface of the cemented carbide substrate with the amorphous layer formed on the surface thereof through a titanium nitride (hereinafter referred to as TiN) having a Vickers hardness of 2000 to 2500 and markedly excellent toughness, using the same arc ion plating apparatus, since the amorphous layer has a high activity and a high reactivity, the amorphous layer reacts with the TiN layer on formation of it with deposition, thereby to ensure remarkably strong adhesion between the surface of the cemented carbide substrate and the TiN layer. Strong adhesion between the TiN layer and the surface coating layer is also ensured.

(c) As a result, the coated cemented carbide tool thus obtained is free from peeling of the wear-resistant coating layer composed of the TiN layer and the surface coating layer even when used in the interrupted cutting operation accompanied with high mechanical and thermal impacts under deep cutting conditions. Also the toughness of the wear-resistant coating layer itself is remarkably improved by the presence of the TiN layer and the occurrence of chipping of the cutting edge portion can be suppressed. Therefore, it becomes possible to satisfactorily exhibit excellent wear resistance of the wear-resistant coating layer.

This invention has been made based on the discovered point described above and is characterized by a coated cemented carbide tool, a wear-resistant coating layer of which excellent adhesion and resistance against chipping, comprising: a tungsten carbide-based cemented carbide substrate having an amorphous layer formed by an arc ion plating surface treatment in an average depth of 1 to 50 nm from the surface; and a wear-resistant coating layer deposited physically on the surface of the tungsten carbide-based cemented carbide substrate, wherein wear-resistant coating layer is composed of: (a) a primary tough layer which is made of a TiN layer and has an average thickness of 0.1 to 5 μm; and (b) a single-layered or multi-layered surface hard layer which is made of either or both of a (Ti, Al)N layer and a (Ti, Al)CN layer, which respectively satisfy the composition formula: $(Ti_{1-X}Al_X)N$ and the composition formula: $(Ti_{1-X}Al_X)C_{1-Y}N_Y$ (wherein X represents 0.15 to 0.65 and Y represents 0.5 to 0.99 in terms of an atomic ratio), and has an average thickness of 0.5 to 15 μm.

The average thickness of the amorphous layer formed on the surface of the cemented carbide substrate, which constitutes the coated cemented carbide tool of the present invention, was set within a range from 1 to 50 nm for the following reasons. That is, when the depth is less than 1 nm, desired excellent adhesion between it and the TiN layer as the primary tough layer can be ensured. On the other hand, the effect of improving the adhesion of the TiN layer to the surface of the cemented carbide substrate is satisfactory when the average depth from the surface is 50 nm.

In the coated cemented carbide tool of this invention, Al in the (Ti, Al)N layer and the (Ti, Al)CN layer, which constitute the hard coating layer, is incorporated into TiCN in the form of a solid solution for the purpose of enhancing the hardness, thereby improving the wear resistance. Therefore, the X value was set within a range from 0.15 to 0.65 (atomic ratio) for the following reason. That is, when the X value in the composition formula: $(Ti_{1-X}Al_X)N$ and the composition formula: $(Ti_{1-X}Al_X)C_{1-Y}N_Y$ is less than 0.15, desired wear resistance cannot be ensured. On the other hand, when the X value exceeds 0.65, chipping is liable to occur in the cutting edge. Since the component C in the (Ti, Al)CN layer has an action of enhancing the hardness, the (Ti, Al)CN layer has a relatively high hardness as compared with the (Ti, Al)N layer. When the amount of the component C is less than 0.01, that is, the Y value exceeds 0.99, a predetermined effect of improving the hardness cannot be obtained. On the other hand, when the amount of the component C exceeds 0.5, that is, the Y value is less than 0.5, the toughness is rapidly lowered. Therefore, the Y value was set within a range from 0.5 to 0.99, and preferably from 0.55 to 0.9.

The reason why the average thickness of the surface hard layer was set within a range from 0.5 to 15 μm is as follows. That is, when the thickness is less than 0.5 μm, desired excellent wear resistance cannot be ensured. On the other hand, when the thickness exceeds 15 μm, chipping is liable to occur at the cutting edge.

The reason why the average thickness of the lower tough layer was set within a range from 0.1 to 5 μm is as follows. That is, when the thickness is less than 0.1 μm, desired toughness cannot be ensured in the wear-resistant coating layer. On the other hand, when the thickness exceeds 5 μm, plastic deformation, which is likely to cause biased wear, is liable to occur in the wear-resistant coating layer in the interrupted cutting operation under deep cutting conditions.

The coated cemented carbide tool of this embodiment will be described in detail.

EXAMPLE 4-1

Cemented carbide substrates A4-1 to A4-6, each having a shape of an insert defined in ISO•SNGA120412, and cemented carbide substrates A4-7 to A4-10, each having a shape of an insert defined in ISO•SNMA120412, were produced by preparing a WC powder, a TiC powder, a ZrC powder, a VC powder, a TaC powder, a NbC powder, a $Cr_3C_2$ powder, a TiN powder, a TaN powder and a Co powder, each having a predetermined average grain size of 1 to 3 μm, compounding these raw powders according to each formulation in Table 1, wet-mixing them in a ball mill for 72 hours, drying the mixture, compacting the dried mixture under a pressure of 100 MPa to form green compacts, vacuum-sintering these green compacts under the conditions of a vacuum degree of 6 Pa, a temperature of 1400° C. for one hour, and subjecting the cutting edge portion to honing (R: 0.05).

These cemented carbide substrates A4-1 to A4-10 were subjected to ultrasonic cleaning in acetone, were dried, and were then charged in a conventional arc ion plating apparatus shown in FIG. 1 and the surface of each of the cemented carbide substrates A4-1 to A4-10 was subjected to a pre-treatment under the following conditions:

Atmospheric temperature in apparatus (temperature of cemented carbide substrate): 400° C.,
Atmospheric gas: Ar,
Atmospheric pressure: 3 Pa,
Cathode electrode: (not used)
Arc discharge current: (Arc powder—OFF),
Bias pressure applied to cemented carbide substrate: −900 V, and
Treating time: 3 min., and then subjected to an arc ion plating surface treatment under the following conditions:

Atmospheric temperature in apparatus: 500° C.,
Atmospheric gas: Ar,
Atmospheric pressure: 3 Pa,
Cathode electrode: metallic Ti,
Arc discharge current: 150 A, and
Bias pressure applied to cemented carbide substrate: −1000 V, thereby to form an amorphous layer on the surface of the cemented carbide substrates A4-1 to A4-10. The depth of the amorphous layer formed from the surface thereof was set by controlling the treating time of the arc ion plating surface treatment under the conditions described above.

The structure of the amorphous layer formed on the surface of the cemented carbide substrates A4-1 to A4-10 was observed by using an transmission electron microscope (magnification: 500,000) and the judgment and measurement were conducted based on the observed results. As a result, the average depths (average of depths measured at five points) from the surface are shown in Table 4-2 and Table 4-3, respectively.

(A) Using the same arc ion coating apparatus, a TiN layer, as the primary tough layer, having a target thickness shown in Table 4-2 and Table 4-3 was deposited on each surface of the cemented carbide substrates A4-1 to A4-10 with the amorphous layer formed on the surface thereof under the following conditions:

Atmospheric temperature in oven: 500° C.,
Atmospheric gas: nitrogen gas,
Atmospheric pressure: 6 Pa,
Cathode electrode: metallic Ti,
Arc discharge current: 70 A, and
Bias pressure applied to cemented carbide substrate: −50 V, and then, (B) a single-layered or multi-layered layer of either or both of a (Ti, Al)N layer and a (Ti, Al)CN layer, which have a target composition and a target thickness shown in Table 4-2 and Table 4-3, was deposited on the surface of the TiN layer under the following conditions:

Atmospheric temperature in oven: 500° C.,
Atmospheric gas: nitrogen gas, methane gas, or mixed gas of nitrogen gas and methane gas in a predetermined ratio,
Atmospheric pressure: 6 Pa,
Cathode electrode: Ti—Al alloy with various compositions,
Arc discharge current: 70 A, and
Bias pressure applied to cemented carbide substrate: −90 V, thereby to produce throw-away inserts made of a coated cemented carbide (hereinafter referred to as coated cemented carbide inserts of the present invention) 4-1 to 4-20 having a shape shown in a schematic perspective view of FIG. 2A and a schematic longitudinal cross-sectional view of FIG. 2B of the present invention.

For comparison, as shown in Table 4-4 and Table 4-5, throw-away inserts made of a conventional coated cemented carbide (hereinafter referred to as conventional coated cemented carbide inserts) 4-1 to 4-20 were respectively produced under the same conditions described above, except that the pre-treatment and the arc ion plating surface treatment under the above conditions to the surface of the cemented carbide substrates A4-1 to A4-10 in the arc ion plating apparatus were not conducted, and therefore, the amorphous layer did not exist on the surface of the cemented carbide substrates A4-1 to A4-10 and the TiN layer as the primary tough layer was not formed.

Then, the coated cemented carbide inserts 4-1 to 4-20 of the present invention and the conventional coated cemented carbide inserts 4-1 to 4-20 were subjected to a dry type thick depth-of-cut interrupted cutting test of an alloy steel under the following conditions:

Workpiece: JIS•SCM439 round bar with four longitudinal grooves equally spaced,
Cutting speed: 110 m/min.,
Depth of cut: 5.0 mm,
Feed: 0.2 mm/rev., and
Cutting time: 5 min., a dry type high feed interrupted cutting test of an alloy steel under the following conditions:

Workpiece: JIS•SKD61 round bar with four longitudinal grooves equally spaced,
Cutting speed: 30 m/min.,
Depth of cut: 1.4 mm,
Feed: 0.45 mm/rev., and
Cutting time: 2 min., and a dry type high speed interrupted cutting test of a die steel under the following conditions:

Workpiece: JIS•FC300 round bar with four longitudinal grooves equally spaced,
Cutting speed: 150 m/min.,
Depth of cut: 7 mm,
Feed: 0.2 mm/rev., and
Cutting time: 3 min., in the state of being screwed into the tip portion of a tool steel bit using a fixing jig. In all cutting tests, the flank wear width of the cutting edge was measured. The measurement results are shown in Table 4-6 and Table 4-7.

TABLE 4-1

| Classification | | Co | TiC | ZrC | VC | TaC | NbC | Cr₃C₂ | TiN | TaN | WC |
|---|---|---|---|---|---|---|---|---|---|---|---|
| Cemented | A4-1 | 9.0 | 8.0 | — | — | 8.0 | 1.5 | — | — | — | balance |
| carbide | A4-2 | 7.5 | — | — | — | — | — | — | — | — | balance |
| substrates | A4-3 | 6.0 | — | — | — | 0.5 | 0.5 | — | — | — | balance |
| (inserts) | A4-4 | 10.0 | — | — | — | — | — | 0.8 | — | — | balance |
| | A4-5 | 14.0 | — | — | 0.4 | — | — | 0.6 | — | — | balance |
| | A4-6 | 9.0 | 9.0 | — | — | 5.0 | 4.0 | — | — | — | balance |
| | A4-7 | 10.5 | — | — | — | — | — | 1.0 | — | — | balance |
| | A4-8 | 8.5 | 2.0 | 4.0 | — | — | 2.0 | — | — | — | balance |
| | A4-9 | 12.0 | 15.0 | — | 0.4 | 3.0 | 3.0 | 0.4 | — | — | balance |
| | A4-10 | 10.0 | 4.0 | — | — | 1.0 | 1.0 | 0.3 | 1.0 | 1.5 | balance |

TABLE 4-2

| | | Cemented carbide substrate Average depth from the surface of amorphous layer (nm) | Primary tough layer Target thickness (μm) | Surface hard layer | | | | | | | | |
|---|---|---|---|---|---|---|---|---|---|---|---|---|
| | | | | First layer | | | | | Second layer | | | |
| | | | | Target composition (atomic ratio) | | | | Target thickness (μm) | Target composition (atomic ratio) | | | | Target thickness (μm) |
| Classification | Symbol | | | Ti | Al | C | N | | Ti | Al | C | N | |
| Coated | 4-1 | A4-1 | 5.8 | 0.5 | 0.50 | 0.50 | — | 1.00 | 3.0 | — | — | — | — | — |
| cemented | 4-2 | A4-2 | 1.2 | 0.1 | 0.40 | 0.60 | — | 1.00 | 5.0 | — | — | — | — | — |
| carbide | 4-3 | A4-3 | 26.3 | 3.0 | 0.80 | 0.20 | — | 1.00 | 12.0 | — | — | — | — | — |
| inserts | 4-4 | A4-4 | 8.9 | 0.1 | 0.35 | 0.65 | — | 1.00 | 15.0 | — | — | — | — | — |
| of the | 4-5 | A4-5 | 14.6 | 2.0 | 0.65 | 0.35 | — | 1.00 | 8.0 | — | — | — | — | — |
| present | 4-6 | A4-6 | 4.8 | 0.5 | 0.60 | 0.40 | 0.15 | 0.85 | 1.0 | — | — | — | — | — |
| invention | 4-7 | A4-7 | 6.9 | 1.0 | 0.45 | 0.55 | 0.30 | 0.70 | 4.5 | — | — | — | — | — |
| | 4-8 | A4-8 | 32.7 | 4.0 | 0.70 | 0.30 | 0.01 | 0.99 | 7.0 | — | — | — | — | — |
| | 4-9 | A4-9 | 9.8 | 0.5 | 0.55 | 0.45 | 0.50 | 0.50 | 0.5 | — | — | — | — | — |
| | 4-10 | A4-10 | 49.2 | 5.0 | 0.85 | 0.15 | 0.40 | 0.60 | 10.0 | — | — | — | — | — |

TABLE 4-3

| | | Cemented carbide substrate Average depth from the surface of amorphous layer (nm) | Primary tough layer Target thickness (μm) | Surface hard layer | | | | | | | | |
|---|---|---|---|---|---|---|---|---|---|---|---|---|
| | | | | First layer | | | | | Second layer | | | |
| | | | | Target composition (atomic ratio) | | | | Target thickness (μm) | Target composition (atomic ratio) | | | | Target thickness (μm) |
| Classification | Symbol | | | Ti | Al | C | N | | Ti | Al | C | N | |
| Coated | 4-11 | A4-1 | 1.5 | 0.5 | 0.50 | 0.50 | — | 1.00 | 0.3 | 0.80 | 0.20 | — | 1.00 | 2.0 |
| cemented | 4-12 | A4-2 | 3.2 | 2.0 | 0.60 | 0.40 | — | 1.00 | 0.5 | 0.40 | 0.60 | — | 1.00 | 4.5 |
| carbide | 4-13 | A4-3 | 22.9 | 2.5 | 0.80 | 0.20 | — | 1.00 | 5.0 | 0.70 | 0.30 | 0.01 | 0.99 | 4.0 |
| inserts | 4-14 | A4-4 | 8.4 | 0.1 | 0.85 | 0.15 | — | 1.00 | 0.3 | 0.50 | 0.50 | — | 1.00 | 0.2 |
| of the | 4-15 | A4-5 | 18.5 | 1.0 | 0.35 | 0.65 | — | 1.00 | 4.0 | 0.75 | 0.25 | 0.50 | 0.50 | 4.5 |
| present | 4-16 | A4-6 | 5.7 | 0.5 | 0.40 | 0.60 | 0.01 | 0.99 | 1.5 | 0.40 | 0.60 | 0.10 | 0.90 | 1.5 |
| invention | 4-17 | A4-7 | 7.1 | 0.1 | 0.45 | 0.55 | 0.55 | 0.45 | 2.0 | 0.85 | 0.15 | — | 1.00 | 3.0 |
| | 4-18 | A4-8 | 47.4 | 4.5 | 0.55 | 0.45 | 0.15 | 0.85 | 4.5 | 0.50 | 0.50 | 0.35 | 0.65 | 6.0 |
| | 4-19 | A4-9 | 12.3 | 1.5 | 0.75 | 0.25 | 0.05 | 0.95 | 8.0 | 0.45 | 0.55 | 0.25 | 0.75 | 4.0 |
| | 4-20 | A4-10 | 38.6 | 3.5 | 0.70 | 0.30 | 0.40 | 0.60 | 5.0 | 0.65 | 0.35 | — | 1.00 | 5.0 |

TABLE 4-4

| Classification | | Symbol | Cemented carbide substrate Average depth from the surface of amorphous layer (nm) | Primary tough layer Target thickness (μm) | Surface hard layer | | | | | | | | | |
|---|---|---|---|---|---|---|---|---|---|---|---|---|---|---|
| | | | | | First layer | | | | | Second layer | | | | |
| | | | | | Target composition (atomic ratio) | | | | Target thickness (μm) | Target composition (atomic ratio) | | | | Target thickness (μm) |
| | | | | | Ti | Al | C | N | | Ti | Al | C | N | |
| Conventional coated cemented carbide inserts | 4-1 | A4-1 | — | — | the same as the coated cemented carbide insert 4-1 of the present invention | | | | | | | | | |
| | 4-2 | A4-2 | — | — | the same as the coated cemented carbide insert 4-2 of the present invention | | | | | | | | | |
| | 4-3 | A4-3 | — | — | the same as the coated cemented carbide insert 4-3 of the present invention | | | | | | | | | |
| | 4-4 | A4-4 | — | — | the same as the coated cemented carbide insert 4-4 of the present invention | | | | | | | | | |
| | 4-5 | A4-5 | — | — | the same as the coated cemented carbide insert 4-5 of the present invention | | | | | | | | | |
| | 4-6 | A4-6 | — | — | the same as the coated cemented carbide insert 4-6 of the present invention | | | | | | | | | |
| | 4-7 | A4-7 | — | — | the same as the coated cemented carbide insert 4-7 of the present invention | | | | | | | | | |
| | 4-8 | A4-8 | — | — | the same as the coated cemented carbide insert 4-8 of the present invention | | | | | | | | | |
| | 4-9 | A4-9 | — | — | the same as the coated cemented carbide insert 4-9 of the present invention | | | | | | | | | |
| | 4-10 | A4-10 | — | — | the same as the coated cemented carbide insert 4-10 of the present invention | | | | | | | | | |

TABLE 4-5

| Classification | | Symbol | Cemented carbide substrate Average depth from the surface of amorphous layer (nm) | Primary tough layer Target thickness (μm) | Surface hard layer | | | | | | | | | |
|---|---|---|---|---|---|---|---|---|---|---|---|---|---|---|
| | | | | | First layer | | | | | Second layer | | | | |
| | | | | | Target composition (atomic ratio) | | | | Target thickness (μm) | Target composition (atomic ratio) | | | | Target thickness (μm) |
| | | | | | Ti | Al | C | N | | Ti | Al | C | N | |
| Conventional coated cemented carbide inserts | 4-11 | A4-1 | — | — | the same as the coated cemented carbide insert 4-11 of the present invention | | | | | | | | | |
| | 4-12 | A4-2 | — | — | the same as the coated cemented carbide insert 4-12 of the present invention | | | | | | | | | |
| | 4-13 | A4-3 | — | — | the same as the coated cemented carbide insert 4-13 of the present invention | | | | | | | | | |
| | 4-14 | A4-4 | — | — | the same as the coated cemented carbide insert 4-14 of the present invention | | | | | | | | | |
| | 4-15 | A4-5 | — | — | the same as the coated cemented carbide insert 4-15 of the present invention | | | | | | | | | |
| | 4-16 | A4-6 | — | — | the same as the coated cemented carbide insert 4-16 of the present invention | | | | | | | | | |
| | 4-17 | A4-7 | — | — | the same as the coated cemented carbide insert 4-17 of the present invention | | | | | | | | | |
| | 4-18 | A4-8 | — | — | the same as the coated cemented carbide insert 4-18 of the present invention | | | | | | | | | |
| | 4-19 | A4-9 | — | — | the same as the coated cemented carbide insert 4-19 of the present invention | | | | | | | | | |
| | 4-20 | A4-10 | — | — | the same as the coated cemented carbide insert 4-20 of the present invention | | | | | | | | | |

TABLE 4-6

| Classification | | Flank wear width (mm) | | | Classification | | Cutting test results | | |
|---|---|---|---|---|---|---|---|---|---|
| | | Interrupted thick depth-of-cut of alloy steel | Interrupted high feed of die steel | Interrupted high speed of cast iron | | | Interrupted thick depth-of-cut of alloy steel | Interrupted high feed of die steel | Interrupted high speed of cast iron |
| Coated cemented carbide inserts | 4-1 | 0.04 | 0.10 | 0.08 | Conventional coated cemented | 4-1 | Failure in 1.4 min.** | Failure in 1.1 min.** | Failure in 1.8 min.** |
| | 4-2 | 0.05 | 0.09 | 0.08 | | 4-2 | Failure in 1.3 min.** | Failure in 0.9 min.** | Failure in 2.0 min.** |

TABLE 4-6-continued

| | | Flank wear width (mm) | | | | | Cutting test results | | |
|---|---|---|---|---|---|---|---|---|---|
| Classification | | Interrupted thick depth-of-cut of alloy steel | Interrupted high feed of die steel | Interrupted high speed of cast iron | Classification | | Interrupted thick depth-of-cut of alloy steel | Interrupted high feed of die steel | Interrupted high speed of cast iron |
| of the present invention | 4-3 | 0.05 | 0.11 | 0.10 | carbide inserts | 4-3 | Failure in 0.7 min.* | Failure in 0.4 min. | Failure in 1.4 min. |
| | 4-4 | 0.07 | 0.12 | 0.10 | | 4-4 | Failure in 0.4 min.* | Failure in 0.2 min.* | Failure in 1.2 min.* |
| | 4-5 | 0.05 | 0.09 | 0.09 | | 4-5 | Failure in 0.8 min.* | Failure in 0.5 min.* | Failure in 2.0 min.* |
| | 4-6 | 0.04 | 0.10 | 0.15 | | 4-6 | Failure in 1.7 min.* | Failure in 1.6 min.* | Failure in 2.1 min.* |
| | 4-7 | 0.05 | 0.10 | 0.09 | | 4-7 | Failure in 1.3 min.** | Failure in 1.0 min.** | Failure in 1.9 min.** |
| | 4-8 | 0.06 | 0.12 | 0.11 | | 4-8 | Failure in 1.1 min.** | Failure in 0.5 min.** | Failure in 1.9 min.** |
| | 4-9 | 0.07 | 0.14 | 0.14 | | 4-9 | Failure in 1.8 min.** | Failure in 1.5 min.** | Failure in 2.3 min.** |
| | 4-10 | 0.07 | 0.09 | 0.12 | | 4-10 | Failure in 0.6 min.* | Failure in 0.3 min.* | Failure in 1.2 min.* |

*indicates that failure was caused by chipping at the cutting edge, and
**indicates that failure was caused by peeling in the wear-resistant coating layer

TABLE 4-7

| | | Flank wear width (mm) | | | | | Cutting test results | | |
|---|---|---|---|---|---|---|---|---|---|
| Classification | | Interrupted thick depth-of-cut of alloy steel | Interrupted high feed of die steel | Interrupted high speed of cast iron | Classification | | Interrupted thick depth-of-cut of alloy steel | Interrupted high feed of die steel | Interrupted high speed of cast iron |
| Coated cemented carbide inserts of the present invention | 4-11 | 0.06 | 0.13 | 0.11 | Conventional coated cemented carbide inserts | 4-11 | Failure in 1.3 min.** | Failure in 1.1 min.** | Failure in 1.8 min.** |
| | 4-12 | 0.04 | 0.12 | 0.10 | | 4-12 | Failure in 1.4 min.** | Failure in 1.0 min.** | Failure in 1.6 min.** |
| | 4-13 | 0.04 | 0.13 | 0.90 | | 4-13 | Failure in 1.0 min.* | Failure in 0.7 min. | Failure in 1.1 min. |
| | 4-14 | 0.07 | 0.15 | 0.15 | | 4-14 | Failure in 1.7 min.* | Failure in 1.5 min.* | Failure in 2.0 min.* |
| | 4-15 | 0.06 | 0.12 | 0.90 | | 4-15 | Failure in 1.1 min.* | Failure in 0.9 min.* | Failure in 1.2 min.* |
| | 4-16 | 0.05 | 0.14 | 0.11 | | 4-16 | Failure in 1.5 min.* | Failure in 1.3 min.* | Failure in 1.5 min.* |
| | 4-17 | 0.05 | 0.12 | 0.12 | | 4-17 | Failure in 1.4 min.** | Failure in 1.0 min.** | Failure in 1.7 min.** |
| | 4-18 | 0.06 | 0.11 | 0.90 | | 4-18 | Failure in 0.9 min.** | Failure in 0.8 min.** | Failure in 1.2 min.** |
| | 4-19 | 0.07 | 0.10 | 0.90 | | 4-19 | Failure in 0.7 min.** | Failure in 0.5 min.** | Failure in 0.9 min.** |
| | 4-40 | 0.07 | 0.11 | 1.00 | | 4-40 | Failure in 0.9 min.* | Failure in 0.8 min.* | Failure in 1.3 min.* |

*indicates that failure was caused by chipping at the cutting edge, and
**indicates that failure was caused by peeling in the wear-resistant coating layer

EXAMPLE 4-2

Cemented carbide substrates B4-1 to B4-8 for end mill, each having a size of 6 mm×13 mm, 10 mm×22 mm, and 20 mm×45 mm in diameter and length of the cutting edge portion, were produced in accordance with the combination shown in Table 4-8 by preparing a WC powder of medium coarse grains having an average grain size of 5.5 μm, a WC powder of fine grains having an average grain size of 0.8 μm, a TaC powder having an average grain size of 1.3 μm, a NbC powder having an average grain size of 1.2 μm, a ZrC powder having an average grain size of 1.2 μm, a $Cr_3C_2$ powder having an average grain size of 2.3 μm, a VC powder having an average grain size of 1.5 μm, a (Ti, W)C powder having an average grain size of 1.0 μm and a Co powder having an average grain size of 1.8 μm, compounding these raw powders according to each formulation in Table 4-8, adding a wax, mixing them in acetone in a ball mill for 24 hours, drying the mixture under reduced pressure, compacting the dried mixture under a pressure of 100 MPa to form green compacts, sintering these green compacts under the conditions of heating to a predetermined temperature within a range from 1370 to 1470° C. at a heating rate of 7° C./min. in a vacuum atmosphere of 6 Pa, maintaining at this temperature for one hour and furnace-cooling, thereby forming three kinds of sintered round bars for forming cemented carbide substrate, each having a diameter of 8 mm, 13 mm, and 26 mm, and cutting three kinds of the sintered round bars.

These cemented carbide substrates B4-1 to B4-8 were subjected to ultrasonic cleaning in acetone, were dried, and were then charged in the same arc ion plating apparatus shown in FIG. 1, and the surface of each of these cemented carbide substrates was subjected to the pre-treatment and the arc ion plating surface treatment under the same conditions as in Example 1 to form an amorphous layer on the surface of the cemented carbide substrates B4-1 to B4-8. The depth of the amorphous layer formed from the surface thereof was also set by controlling the treating time of the arc ion plating surface treatment under the conditions described above.

The structure of the amorphous layer formed on the surface of the cemented carbide substrates B4-1 to B4-8 was observed by using a transmission electron microscope (magnification: 500,000) and the judgment and measurement were conducted based on the observation results. As a result, the average depths (average of depths measured at five points) from the surface are shown in Table 4-9 and Table 4-10, respectively.

Using the same arc ion plating apparatus, a TiN layer, as the primary tough layer, having a target thickness shown in Table 4-9 and Table 4-10 was deposited on the surface of these cemented carbide substrates, and then a single-layered or multi-layered surface hard layer of either or both of a (Ti, Al)N layer and a (Ti, Al)CN layer, which have a target composition and a target thickness shown in Table 4-9 and 4-10, was formed thereon, thereby producing end mills made of a surface-coated carbide alloy of the present invention (hereinafter referred to as coated cemented carbide end mills of the present invention) 4-1' to 4-16' as the coated cemented carbide tool of the present invention, which has a shape shown in a schematic front view of FIG. 3A and a schematic transverse cross-sectional view of FIG. 3B of the cutting edge portion.

For comparison, as shown in Table 4-11 and Table 4-12, end mills made of a conventional coated cemented carbide (hereinafter referred to as conventional coated cemented carbide end mills) 4-1' to 4-16' as the conventional coated cemented carbide tool were respectively produced under the same conditions described above, except that the pre-treatment and the arc ion plating surface treatment under the above conditions to the surface of the cemented carbide substrates B4-1 to B4-8 in the arc ion plating apparatus were not conducted, and therefore, the amorphous layer did not exist on the surface of the cemented carbide substrates B4-1 to B4-8 and the TiN layer as the primary tough layer was not formed.

Then, the coated cemented carbide end mills 4-1' to 4-3' and 4-9' to 4-11' of the present invention and the conventional coated cemented carbide end mills 4-1' to 4-3' and 4-9' to 4-11', among the coated cemented carbide end mills 4-1' to 4-16' of the present invention and the conventional coated cemented carbide end mills 4-1' to 4-16', were subjected to a wet type thick depth-of-cut side cutting test of a cast iron under the following conditions:

Workpiece: JIS•FC300 plate having a planar size of 100 mm×250 mm and a-thickness of 50 mm,
Rotating speed: 5150 $min^{-1}$,
Depth of cut in axial direction: 12 mm,
Depth of cut in radial direction: 1.6 mm, and
Feed: 600 mm/min.

The coated cemented carbide end mills 4-4' to 4-6' and 4-12' to 4-14' of the present invention and the conventional coated cemented carbide end mills 4-4' to 4-6' and 4-12' to 4-14' were subjected to a wet type thick depth-of-cut side cutting test of a cast iron under the following conditions:

Workpiece: JIS•SNCM439 plate having a planar size of 100 mm×250 mm and a thickness of 50 mm,
Rotating speed: 1900 $min^{-1}$,
Depth of cut in axial direction: 20 mm,
Depth of cut in radial direction: 2.6 mm, and
Feed: 270 mm/min.

The coated cemented carbide end mills 4-7', 4-8', 4-15' and 4-16' of the present invention and the conventional coated cemented carbide end mills 4-7', 4-8', 4-15' and 4-16' were subjected to a wet type thick depth-of-cut side cutting test of a hardened steel under the following conditions:

Workpiece: JIS•SKD61 (hardness: HRC52) plate having a planar size of 100 mm×250 mm and a thickness of 50 mm,
Rotating speed: 625 $min^{-1}$,
Depth of cut in axial direction: 26 mm,
Depth of cut in radial direction: 1.4 mm, and
Feed: 71 mm/min.

In all side cutting tests (water-soluble cutting oil was used in all tests), the cutting length until the flank wear amount of the peripheral edge reaches 0.1 mm as a criterion of the service life was measured. The measurement results are respectively shown in Table 4-9 and Table 4-12.

TABLE 4-8

| Classification | | Co | (Ti, W) C | TaC | NbC | ZrC | $Cr_3C_2$ | VC | WC | Diameter × length (mm) of cutting edge portion |
|---|---|---|---|---|---|---|---|---|---|---|
| Cemented carbide substrates (end mills) | B4-1 | 6 | — | — | — | — | 0.2 | — | Medium coarse grains: balance | 6 × 13 |
| | B4-2 | 8 | — | 1 | 0.5 | — | — | — | Fine grains: balance | 6 × 13 |
| | B4-3 | 10 | — | 1 | — | 1 | 0.5 | 0.5 | Fine grains: balance | 6 × 13 |
| | B4-4 | 7 | — | — | — | — | 0.5 | 0.5 | Fine grains: balance | 10 × 22 |
| | B4-5 | 9 | 20 | 10 | 1 | — | — | — | Medium coarse grains: balance | 10 × 22 |
| | B4-6 | 10 | — | — | — | — | 1 | — | Fine grains: balance | 10 × 22 |

TABLE 4-8-continued

| Classification | Composition formula (% by weight) | | | | | | | Diameter × length (mm) of cutting edge portion |
|---|---|---|---|---|---|---|---|---|
| | Co | (Ti, W) C | TaC | NbC | ZrC | Cr₃C₂ | VC WC | |
| B4-7 | 12 | 17 | 9 | 1 | — | — | — Medium coarse grains: balance | 20 × 45 |
| B4-8 | 9 | 8 | 3 | 5 | 10 | — | — Medium coarse grains: balance | 20 × 45 |

TABLE 4-9

| | | Cemented carbide substrate | | Surface hard layer | | | | | | | | | |
|---|---|---|---|---|---|---|---|---|---|---|---|---|---|
| | | Average depth from the surface of amorphous | Primary tough layer | First layer | | | | | Second layer | | | | |
| Classification | Symbol | layer (nm) | Target thickness (μm) | Target composition (atomic ratio) | | | | Target thickness (μm) | Target composition (atomic ratio) | | | | Target thickness (μm) | Cut length (m) |
| | | | | Ti | Al | C | N | | Ti | Al | C | N | | |
| Coated cemented carbide end mills of the present invention | 4-1' | B4-1 | 5.4 | 0.5 | 0.50 | 0.50 | 0.01 | 0.99 | 5 | — | — | — | — | — | 388 |
| | 4-2' | B4-2 | 15.1 | 1.5 | 0.80 | 0.20 | 0.50 | 0.50 | 3 | — | — | — | — | — | 345 |
| | 4-3' | B4-3 | 30.4 | 1.0 | 0.35 | 0.65 | — | 1.00 | 2 | — | — | — | — | — | 312 |
| | 4-4' | B4-4 | 1.1 | 1.3 | 0.65 | 0.35 | — | 1.00 | 1.5 | — | — | — | — | — | 101 |
| | 4-5' | B4-5 | 21.2 | 0.8 | 0.60 | 0.40 | 0.15 | 0.85 | 2 | — | — | — | — | — | 115 |
| | 4-6' | B4-6 | 48.4 | 0.1 | 0.45 | 0.55 | 0.30 | 0.70 | 0.5 | — | — | — | — | — | 86 |
| | 4-7' | B4-7 | 40.5 | 2.0 | 0.75 | 0.25 | — | 1.00 | 3 | — | — | — | — | — | 89 |
| | 4-8' | B4-8 | 10.3 | 1.8 | 0.55 | 0.45 | — | 1.00 | 1.5 | — | — | — | — | — | 77 |

TABLE 4-10

| | | Cemented carbide substrate | | Surface hard layer | | | | | | | | | |
|---|---|---|---|---|---|---|---|---|---|---|---|---|---|
| | | Average depth from the surface of amorphous | Primary tough layer | First layer | | | | | Second layer | | | | |
| Classification | Symbol | layer (nm) | Target thickness (μm) | Target composition (atomic ratio) | | | | Target thickness (μm) | Target composition (atomic ratio) | | | | Target thickness (μm) | Cut length (m) |
| | | | | Ti | Al | C | N | | Ti | Al | C | N | | |
| Coated cemented carbide end mills of the present invention | 4-9' | B4-1 | 49.2 | 1 | 0.50 | 0.50 | — | 1.00 | 2 | 0.80 | 0.20 | — | 1.00 | 2 | 373 |
| | 4-10' | B4-2 | 19.6 | 0.5 | 0.60 | 0.40 | — | 1.00 | 0.5 | 0.40 | 0.60 | — | 1.00 | 5 | 405 |
| | 4-11' | B4-3 | 13.3 | 1.5 | 0.85 | 0.15 | 0.55 | 0.45 | 1.5 | 0.50 | 0.50 | 0.15 | 0.85 | 1.5 | 348 |
| | 4-12' | B4-4 | 28.7 | 0.7 | 0.35 | 0.65 | — | 1.00 | 1 | 0.75 | 0.25 | 0.50 | 0.50 | 1 | 118 |
| | 4-13' | B4-5 | 1.5 | 2.0 | 0.40 | 0.60 | 0.01 | 0.99 | 3 | 0.40 | 0.60 | 0.10 | 0.90 | 3 | 225 |
| | 4-14' | B4-6 | 5.6 | 0.3 | 0.45 | 0.55 | — | 1.00 | 3 | 0.85 | 0.15 | — | 1.00 | 1.5 | 142 |
| | 4-15' | B4-7 | 39.7 | 1.5 | 0.55 | 0.45 | — | 1.00 | 2 | 0.50 | 0.50 | 0.35 | 0.65 | 1 | 85 |
| | 4-16' | B4-8 | 8.9 | 1 | 0.70 | 0.30 | 0.40 | 0.60 | 5 | 0.65 | 0.35 | — | 1.00 | 0.5 | 77 |

TABLE 4-11

| Classification | Symbol | Cemented carbide substrate Average depth from the surface of amorphous layer (nm) | Primary tough layer Target thickness (μm) | Surface hard layer First layer Target composition (atomic ratio) Ti Al C N | First layer Target thickness (μm) | Second layer Target composition (atomic ratio) Ti Al C N | Second layer Target thickness (μm) | Cut length (m) |
|---|---|---|---|---|---|---|---|---|
| Conventional coated cemented carbide end mills | 4-1' B4-1 | — | — | the same as the coated cemented carbide end mill 4-1' of the present invention | | | | Failure at 20 m* |
| | 4-2' B4-2 | — | — | the same as the coated cemented carbide end mill 4-2' of the present invention | | | | Failure at 25 m* |
| | 4-3' B4-3 | — | — | the same as the coated cemented carbide end mill 4-3' of the present invention | | | | Failure at 35 m** |
| | 4-4' B4-4 | — | — | the same as the coated cemented carbide end mill 4-4' of the present invention | | | | Failure at 14 m** |
| | 4-5' B4-5 | — | — | the same as the coated cemented carbide end mill 4-5' of the present invention | | | | Failure at 9 m** |
| | 4-6' B4-6 | — | — | the same as the coated cemented carbide end mill 4-6' of the present invention | | | | Failure at 10 m** |
| | 4-7' B4-7 | — | — | the same as the coated cemented carbide end mill 4-7' of the present invention | | | | Failure at 3 m* |
| | 4-8' B4-8 | — | — | the same as the coated cemented carbide end mill 4-8' of the present invention | | | | Failure at 6 m* |

*indicates that failure was caused by chipping at the cutting edge, and
**indicates that failure was caused by peeling in the wear-resistant coating layer

TABLE 4-12

| Classification | Symbol | Cemented carbide substrate Average depth from the surface of amorphous layer (nm) | Primary tough layer Target thickness (μm) | Hard coating layer First layer Target composition (atomic ratio) Ti Al C N | First layer Target thickness (μm) | Second layer Target composition (atomic ratio) Ti Al C N | Second layer Target thickness (μm) | Cut length (m) |
|---|---|---|---|---|---|---|---|---|
| Conventional coated cemented carbide end mills | 4-9' B4-1 | — | — | the same as the coated cemented carbide end mill 4-9' of the present invention | | | | Failure at 22 m* |
| | 4-10' B4-2 | — | — | the same as the coated cemented carbide end mill 4-10' of the present invention | | | | Failure at 18 m* |
| | 4-11' B4-3 | — | — | the same as the coated cemented carbide end mill 4-11' of the present invention | | | | Failure at 26 m* |
| | 4-12' B4-4 | — | — | the same as the coated cemented carbide end mill 4-12' of the present invention | | | | Failure at 13 m** |
| | 4-13' B4-5 | — | — | the same as the coated cemented carbide end mill 4-13' of the present invention | | | | Failure at 5 m* |
| | 4-14' B4-6 | — | — | the same as the coated cemented carbide end mill 4-14' of the present invention | | | | Failure at 6 m** |
| | 4-15' B4-7 | — | — | the same as the coated cemented carbide end mill 4-15' of the present invention | | | | Failure at 5 m** |
| | 4-16' B4-8 | — | — | the same as the coated cemented carbide end mill 4-16' of the present invention | | | | Failure at 3 m* |

*indicates that failure was caused by chipping at the cutting edge, and
**indicates that failure was caused by peeling in the wear-resistant coating layer

EXAMPLE 4-3

Using three kinds of sintered round bars, each having a diameter of 8 mm (for forming cemented carbide substrates B4-1 to B4-3), a diameter of 13 mm (for forming cemented carbide substrates B4-4 to B4-6), and 26 mm (for forming cemented carbide substrates B4-7 to B4-8), produced in Example 4-2, cemented carbide substrates C4-1 to C4-8 for drills, each having a size of 4 mm×13 mm (cemented carbide substrates C4-1 to C4-3), 8 mm×22 mm (cemented carbide substrates C4-4 to C4-6), and 16 mm×45 mm (cemented carbide substrates C4-7 to C4-8) in diameter and length of the flute, were produced from these three kinds of sintered round bars.

These cemented carbide substrates C4-1 to C4-8 were subjected to ultrasonic cleaning in acetone, were dried, and were then charged in the same arc ion plating apparatus shown in FIG. 1, and the surface of each of these cemented carbide substrates was subjected to the pre-treatment and the arc ion plating surface treatment under the same conditions as in Example 1 to form an amorphous layer on the surface of the cemented carbide substrates C4-1 to C4-8. The depth of the amorphous layer formed from the surface thereof was also set by controlling the treating time of the arc ion plating surface treatment under the conditions described above.

The structure of the amorphous layer formed on the surface of the cemented carbide substrates C4-1 to C4-8 was observed by using a transmission electron microscope (magnification: 500,000) and the judgment and measurement were conducted based on the observation results. As a result, the average depths (average of depths measured at five points) from the surface are shown in Table 4-13 and Table 4-14, respectively.

Using the same arc ion plating apparatus, a TiN layer, as the primary tough layer, having a target thickness shown in Table 4-13 and Table 4-14 was deposited on the surface of these cemented carbide substrates under the same conditions as in Example 1, and then a single-layered or multi-layered surface hard layer of either or both of a (Ti, Al)N layer and a (Ti, Al)CN layer, which have a target composition and a target thickness shown in Table 4-13 and 4-14, was formed thereon, thereby producing drills made of a surface-coated carbide alloy of the present invention (hereinafter referred to as coated cemented carbide drills of the present invention) 4-1" to 4-16" as the coated cemented carbide tool of the present invention, which has a shape shown in a schematic front view of FIG. 4A and a schematic transverse cross-sectional view of FIG. 4B of the flute.

For comparison, as shown in Table 4-15 and Table 4-16, end drills made of a conventional coated cemented carbide (hereinafter referred to as conventional coated cemented carbide drills) 4-1" to 4-16" as the conventional coated cemented carbide tool were respectively produced under the same conditions described above, except that the pre-treatment and the arc ion plating surface treatment under the above conditions to the surface of the cemented carbide substrates C4-1 to C4-8 in the arc ion plating apparatus were not conducted, and therefore, the amorphous layer did not exist on the surface of the cemented carbide substrates C1-1 to C1-8 and the TiN layer as the primary tough layer was not formed.

Then, the coated cemented carbide drills 4-1" to 4-3" and 4-9" to 4-11" of the present invention and the conventional coated cemented carbide drills 4-1" to 4-3" and 4-9" to 4-11", among the coated cemented carbide drills 4-1" to 4-16" of the present invention and the conventional coated cemented carbide drills 4-1" to 4-16", were subjected to a wet type high feed drilling test of a cast iron under the following conditions:

Workpiece: JIS•FC300 plate having a planar size of 100 mm×250 mm and a thickness of 50 mm,
Cutting speed: 40 m/min., and
Feed: 0.42 mm/div.

The coated cemented carbide drills 4-4" to 4-6" and 4-12" to 4-14" of the present invention and the conventional coated cemented carbide drills 4-4" to 4-6" and 4-12" to 4-14" were subjected to a wet type high feed drilling test of an alloy steel under the following conditions:

Workpiece: JIS•SSNCM439 plate having a planar size of 100 mm×250 mm and a thickness of 50 mm,
Cutting speed: 40 m/min., and
Feed: 0.37 mm/div.

The coated cemented carbide drills 4-7", 4-8", 4-15" and 4-16" of the present invention and the conventional coated cemented carbide drills 4-7", 4-8", 4-15" and 4-16" were subjected to a wet type high feed drilling test of a hardened steel under the following conditions:

Workpiece: JIS•SKD61 (hardness: HRC53) plate having a planar size of 100 mm×250 mm and a thickness of 50 mm,
Cutting speed: 24 m/min., and
Feed: 0.36 mm/div.

In all wet type high feed drilling tests (water-soluble cutting oil is used in all tests), the number of drilled holes until the flank wear width of the tip edge face reached 0.3 mm was measured. The measurement results are respectively shown in Table 4-13 and Table 4-16.

TABLE 4-13

| Classification | | Symbol | Cemented carbide substrate Average depth from the surface of amorphous layer (nm) | Primary tough layer Target thickness (μm) | Hard coating layer | | | | | | | | | | Number of drilled holes |
|---|---|---|---|---|---|---|---|---|---|---|---|---|---|---|---|
| | | | | | First layer | | | | | Second layer | | | | | |
| | | | | | Target composition (atomic ratio) | | | | Target thickness | Target composition (atomic ratio) | | | | Target thickness | |
| | | | | | Ti | Al | C | N | (μm) | Ti | Al | C | N | (μm) | |
| Coated | 4-1" | C4-1 | 39.2 | 0.5 | 0.50 | 0.50 | — | 1.00 | 5 | — | — | — | — | — | 1926 |
| cemented | 4-2" | C4-2 | 4.9 | 0.2 | 0.65 | 0.35 | — | 1.00 | 7 | — | — | — | — | — | 2052 |
| carbide | 4-3" | C4-3 | 48.6 | 1 | 0.40 | 0.60 | 0.15 | 0.85 | 6 | — | — | — | — | — | 2008 |
| drills of | 4-4" | C4-4 | 20.8 | 2 | 0.75 | 0.25 | — | 1.00 | 8 | — | — | — | — | — | 1034 |
| the | 4-5" | C4-5 | 9.8 | 0.1 | 0.70 | 0.30 | 0.01 | 0.99 | 5 | — | — | — | — | — | 889 |
| present | 4-6" | C4-6 | 30.6 | 3 | 0.55 | 0.45 | 0.30 | 0.70 | 8 | — | — | — | — | — | 1121 |
| invention | 4-7" | C4-7 | 14.3 | 2 | 0.35 | 0.65 | — | 1.00 | 4 | — | — | — | — | — | 455 |
| | 4-8" | C4-8 | 1.1 | 3 | 0.85 | 0.15 | 0.50 | 0.50 | 10 | — | — | — | — | — | 503 |

TABLE 4-14

| | | Cemented carbide substrate | | Primary tough layer | Hard coating layer | | | | | | | | | | | |
|---|---|---|---|---|---|---|---|---|---|---|---|---|---|---|---|---|
| | | Average depth from the surface of amorphous | | | First layer | | | | | Second layer | | | | | | Number of drilled |
| | | | | Target thickness | Target composition (atomic ratio) | | | | Target thickness | Target composition (atomic ratio) | | | | Target thickness | |
| Classification | Symbol | layer (nm) | | (μm) | Ti | Al | C | N | (μm) | Ti | Al | C | N | (μm) | holes |
| Coated cemented carbide drills of the present invention | 4-9" | C4-1 | 32.1 | 1 | 0.80 | 0.20 | — | 1.00 | 3 | 0.45 | 0.55 | — | 1.00 | 8 | 2215 |
| | 4-10" | C4-2 | 1.5 | 0.5 | 0.70 | 0.30 | — | 1.00 | 1 | 0.55 | 0.45 | — | 1.00 | 10 | 2180 |
| | 4-11" | C4-3 | 5.3 | 2 | 0.60 | 0.40 | 0.20 | 0.80 | 4 | 0.70 | 0.30 | 0.35 | 0.65 | 5 | 2148 |
| | 4-12" | C4-4 | 21.2 | 3 | 0.50 | 0.50 | — | 1.00 | 3 | 0.80 | 0.20 | 0.50 | 0.50 | 4 | 1016 |
| | 4-13" | C4-5 | 40.2 | 0.2 | 0.35 | 0.65 | 0.01 | 0.99 | 2 | 0.40 | 0.60 | — | 1.00 | 7 | 967 |
| | 4-14" | C4-6 | 9.8 | 1 | 0.45 | 0.55 | 0.15 | 0.85 | 1.5 | 0.85 | 0.15 | — | 1.00 | 6 | 928 |
| | 4-15" | C4-7 | 14.6 | 0.5 | 0.60 | 0.40 | — | 1.00 | 0.5 | 0.50 | 0.50 | 0.20 | 0.80 | 10 | 486 |
| | 4-16" | C4-8 | 49.0 | 5 | 0.85 | 0.15 | 0.50 | 0.50 | 3.5 | 0.35 | 0.65 | — | 1.00 | 5.5 | 516 |

TABLE 4-15

| | | Cemented carbide substrate | Primary tough layer | Hard coating layer | | | | | | | | | | Number of drilled holes |
|---|---|---|---|---|---|---|---|---|---|---|---|---|---|---|
| | | Average depth from the surface of amorphous | Target thickness | First layer | | | | | Second layer | | | | | |
| | | | | Target composition (atomic ratio) | | | | Target thickness | Target composition (atomic ratio) | | | | Target thickness | |
| Classification | Symbol | layer (nm) | (μm) | Ti | Al | C | N | (μm) | Ti | Al | C | N | (μm) | |
| Conventional coated cemented carbide drills | 4-1" | C4-1 | — | — | the same as the coated cemented carbide drill 4-1" of the present invention | | | | | | | | | Failure at 516 holes** |
| | 4-2" | C4-2 | — | — | the same as the coated cemented carbide drill 4-2" of the present invention | | | | | | | | | Failure at 505 holes* |
| | 4-3" | C4-3 | — | — | the same as the coated cemented carbide drill 4-3" of the present invention | | | | | | | | | Failure at 492 holes** |
| | 4-4" | C4-4 | — | — | the same as the coated cemented carbide drill 4-4" of the present invention | | | | | | | | | Failure at 214 holes* |
| | 4-5" | C4-5 | — | — | the same as the coated cemented carbide drill 4-5" of the present invention | | | | | | | | | Failure at 251 holes* |
| | 4-6" | C4-6 | — | — | the same as the coated cemented carbide drill 4-6" of the present invention | | | | | | | | | Failure at 201 holes* |
| | 4-7" | C4-7 | — | — | the same as the coated cemented carbide drill 4-7" of the present invention | | | | | | | | | Failure at 102 holes** |
| | 4-8" | C4-8 | — | — | the same as the coated cemented carbide drill 4-8" of the present invention | | | | | | | | | Failure at 87 holes** |

*indicates that failure was caused by chipping at the cutting edge, and
**indicates that failure was caused by peeling in the wear-resistant coating layer

TABLE 4-16

| | | Cemented carbide substrate | Primary tough layer | Hard coating layer | | | | | | | | | | Number of drilled holes |
|---|---|---|---|---|---|---|---|---|---|---|---|---|---|---|
| | | Average depth from the surface of amorphous | Target thickness | First layer | | | | | Second layer | | | | | |
| | | | | Target composition (atomic ratio) | | | | Target thickness | Target composition (atomic ratio) | | | | Target thickness | |
| Classification | Symbol | layer (nm) | (μm) | Ti | Al | C | N | (μm) | Ti | Al | C | N | (μm) | |
| Coventional coated cemented carbide | 4-9" | C4-1 | — | — | the same as the coated cemented carbide drill 4-9" of the present invention | | | | | | | | | Failure at 423 holes* |
| | 4-10" | C4-2 | — | — | the same as the coated cemented carbide drill 4-10" of the present invention | | | | | | | | | Failure at 445 holes* |

TABLE 4-16-continued

| | | Cemented carbide substrate | Primary tough layer | Hard coating layer | | | | | | | | | |
|---|---|---|---|---|---|---|---|---|---|---|---|---|---|
| | | Average depth from the surface of amorphous | Target thickness | First layer | | | | | Second layer | | | | Number of drilled |
| | | | | Target composition (atomic ratio) | | | | Target thickness | Target composition (atomic ratio) | | | | Target thickness |
| Classification | Symbol | layer (nm) | (μm) | Ti | Al | C | N | (μm) | Ti | Al | C | N | (μm) | holes |
| dirlls | 4-11" | C4-3 | — | — | the same as the coated cemented carbide drill 4-11" of the present invention | | | | | | | | | Failure at 448 holes* |
| | 4-12" | C4-4 | — | — | the same as the coated cemented carbide drill 4-12" of the present invention | | | | | | | | | Failure at 222 holes* |
| | 4-13" | C4-5 | — | — | the same as the coated cemented carbide drill 4-13" of the present invention | | | | | | | | | Failure at 233 holes* |
| | 4-14" | C4-6 | — | — | the same as the coated cemented carbide drill 4-14" of the present invention | | | | | | | | | Failure at 236 holes** |
| | 4-15" | C4-7 | — | — | the same as the coated cemented carbide drill 4-15" of the present invention | | | | | | | | | Failure at 98 holes* |
| | 4-16" | C4-8 | — | — | the same as the coated cemented carbide drill 4-16" of the present invention | | | | | | | | | Failure at 105 holes* |

*indicates that failure was caused by chipping at the cutting edge, and
**indicates that failure was caused by peeling in the wear-resistant coating layer The composition and the thickness of the hard coating layer of the coated cemented carbide inserts 4-1 to 4-20 of the present invention, the coated cemented carbide end mills 4-1' to 4-16' of the present invention and the coated cemented carbide drills 4-1" to 4-16" of the present invention as the coated cemented carbide tool of the present invention as well as the conventional coated cemented carbide inserts 4-1 to 4-20, the conventional coated cemented carbide end mills 4-1' to 4-16' and the conventional coated cemented carbide drills 4-1" to 4-16" as the conventional coated cemented carbide tool were measured by using an energy-dispersive X-ray measuring apparatus, an Auger spectrometer and a scanning electron microscope. As a result, they exhibited the composition and average thickness (compared with an average value of thicknesses measured at five points), which are substantially the same as the target composition and the target average thickness in Table 4-2 to Table 4-5 and Table 4-9 to Table 4-16.

Fifth Embodiment

The fifth embodiment was carried out to produce a cutting tool for a surface-coated carbide alloy, wherein the adhesion of a wear-resistant layer to a cemented carbide has been improved further, based on the discovered points (a) to (c) described above.

This embodiment is characterized by a coated cemented carbide tool, a wear-resistant coating layer of which has excellent adhesion and resistance against chipping, comprising:

a tungsten carbide-based cemented carbide substrate having an amorphous layer formed by an arc ion plating surface treatment to an average depth of 1 to 50 nm from the surface;

and a wear-resistant coating layer deposited physically and/or chemically on the surface of the tungsten carbide-based cemented carbide substrate, wherein wear-resistant coating layer is composed of:

(a) a primary tough layer which is made of a TiN layer and has an average thickness of 0.1 to 5 μm;

(b) a single-layered or multi-layered lower hard layer which is made of either or both of a (Ti, Al)N layer and a (Ti, Al)CN layer, which respectively satisfy the composition formula: $(Ti_{1-x}Al_x)N$ and the composition formula: $(Ti_{1-x}Al_x)C_{1-y}N_y$, and has an average thickness of 0.5 to 15 μm; and (c) a single-layered or multi-layered upper hard layer which is made of either or both of an $Al_2O_3$ layer and an $Al_2O_3$—$ZrO_2$ mixed layer made of a matrix of $Al_2O_3$ and a $ZrO_2$ phase dispersed and distributed therein, and has an average thickness of 0.5 to 10 μm.

The reason why numerical limitation was conducted as described above with respect to the amorphous layer formed on the surface of the cemented carbide substrate and the wear-resistant coating layer in the coated cemented carbide tool of this invention will be explained below.

(1) Amorphous Layer on the Surface of Cemented Carbide Substrate

The amorphous layer has an action of imparting excellent adhesion between it and the wear-resistant coating layer (primary tough layer), as described above. However, when the depth is less than 1 nm, desired excellent adhesion between it and the TiN layer as the primary tough layer cannot be ensured. On the other hand, the effect of improving the adhesion of the wear-resistant layer to the surface of the cemented carbide substrate is satisfactory when the average depth from the surface is 50 nm. Therefore, the average depth was set within a range from 1 to 50 nm.

(2) Primary Tough Layer

The primary tough layer has an action of improving the toughness of the wear-resistant coating layer, thereby remarkably suppressing chipping from occurring in the wear-resistant coating layer even in the interrupted cutting operation accompanied with high mechanical and thermal impacts under deep cutting conditions, as described above. However, when the average thickness is less than 0.1 μm, desired toughness cannot be ensured in the wear-resistant coating layer. On the other hand, when the average thickness exceeds 5 μm, plastic deformation, which is likely to cause biased wear, is liable to occur in the wear-resistant coating layer in the interrupted cutting operation under deep cutting conditions. Therefore, the average depth was set within a range from 0.1 to 5 μm.

(3) Lower Hard Layer

The (Ti, Al)N layer and the (Ti, Al)CN layer, which constitute the lower hard coating layer, have an action of imparting the hardness and toughness to the wear-resistant coating layer, thereby exhibiting excellent wear resistance without causing chipping in the co-existence of the lower coating layer. That is, Al in the lower hard layer is incorporated into TiN having high toughness in the form of a solid solution for the purpose of enhancing the hardness, thereby improveing the wear resistance. Therefore, the X value was set within a range from 0.15 to 0.65 (atomic ratio) for the following reason. That is, when the X value in the composition formula: $(Ti_{1-x}Al_x)N$ and the composition formula: $(Ti_{1-x}Al_x)C_{1-y}N_y$ is less than 0.15, desired wear resistance cannot be ensured. On the other hand, when the X value exceeds 0.65, chipping is liable to occur at the cutting edge. Since the component C in the (Ti, Al)CN layer has an action of enhancing the hardness, the (Ti, Al)CN layer has a relatively high hardness as compared with the (Ti, Al)N layer. When the amount of the component C is less than 0.01, that is, the Y value exceeds 0.99, a predetermined effect of improving the hardness cannot be obtained. On the other hand, when the amount of the component C exceeds 0.5, that is, the Y value is less than 0.5, the toughness is rapidly lowered. Therefore, the Y value was set within a range from 0.5 to 0.99, and preferably from 0.55 to 0.9.

When the average thickness is less than 0.5 μm, desired excellent wear resistance cannot be ensured. On the other hand, when the thickness exceeds 15 μm, chipping is liable to occur at the cutting edge. Therefore, the average thickness was set within a range from 0.5 to 15 μm.

(4) Upper Hard Layer

The $Al_2O_3$ layer and the $Al_2O_3$—$ZrO_2$ mixed layer, which constitute the upper hard layer, have excellent hardness at high temperature and heat resistance and also have an action of noticeably improving the wear-resistant coating layer in the co-existence of the lower coating layer described above. When the average thickness is less than 0.5 μm, desired excellent wear resistance cannot be ensured. On the other hand, when the average thickness exceeds 10 μm, chipping is liable to occur at the wear-resistant coating layer. Therefore, the average depth was set within a range from 0.5 to 10 μm.

The coated cemented carbide tool of this embodiment will be described in detail.

EXAMPLE 5-1

Cemented carbide substrates A5-1 to A5-10, each having a shape of an insert defined in ISO•SNGA120412, were produced by preparing a WC powder, a TiC powder, a ZrC powder, a VC powder, a TaC powder, a NbC powder, a $Cr_3C_2$ powder, a TiN powder, a TaN powder and a Co powder, each having a predetermined average grain size of 1 to 3 μm, compounding these raw powders according to each formulation in Table 5-1, wet-mixing them in a ball mill for 72 hours, drying the mixture, compacting the dried mixture under a pressure of 100 MPa to form green compacts, vacuum-sintering these green compacts under the conditions of a vacuum degree of 6 Pa, a temperature of 1400° C. for one hour, and subjecting the cutting edge portion to honing (R: 0.05).

These cemented carbide substrates A5-1 to A5-10 were subjected to ultrasonic cleaning in acetone, were dried, and were then charged in a conventional arc ion plating apparatus shown in FIG. 1 and the surface of each of the cemented carbide substrates A5-1 to A5-10 was subjected to a pre-treatment under the following conditions:

Atmospheric temperature in apparatus (temperature of cemented carbide substrate): 400° C.,
Atmospheric gas: Ar,
Atmospheric pressure: 3 Pa,
Cathode electrode: (not used)
Arc discharge current: (Arc powder—OFF),
Bias pressure applied to cemented carbide substrate: −900 V, and
Treating time: 3 min., and then subjected to an arc ion plating surface treatment under the following conditions:
Atmospheric temperature in apparatus: 500° C.,
Atmospheric gas: Ar,
Atmospheric pressure: 3 Pa,
Cathode electrode: metallic Ti,
Arc discharge current: 150 A, and
Bias pressure applied to cemented carbide substrate: −1000 V, thereby to form an amorphous layer on the surface of the cemented carbide substrates A5-1 to A5-10. The depth of the amorphous layer formed from the surface thereof was set by controlling the treating time of the arc ion plating surface treatment under the conditions described above.

The structure of the amorphous layer formed on the surface of the cemented carbide substrates A5-1 to A5-10 was observed by using a transmission electron microscope (magnification: 500,000) and the judgment and measurement were conducted based on the observation results. As a result, the average depth (average of depths measured at five points) from the surface are shown in Table 5-3 and Table 5-5, respectively.

(A) Using the same arc ion coating apparatus, a TiN layer, as the primary tough layer, having a target thickness shown in Table 5-3 and Table 5-5 was deposited on each surface of the cemented carbide substrates A5-1 to A5-10 with the amorphous layer formed on the surface thereof under the following conditions:

Atmospheric temperature in oven: 500° C.,
Atmospheric gas: nitrogen gas,
Atmospheric pressure: 6 Pa,
Cathode electrode: metallic Ti,
Arc discharge current: 70 A, and
Bias pressure applied to cemented carbide substrate: −50 V, and then, (B) a single-layered or multi-layered layer of either or both of a (Ti, Al)N layer and a (Ti, Al)CN layer, which have a target composition and a target thickness shown in Table 5-3 and Table 5-5, was deposited on the surface of the TiN layer under the following conditions:

Atmospheric temperature in oven: 500° C.,
Atmospheric gas: nitrogen gas, methane gas, or mixed gas of nitrogen gas and methane gas in a predetermined ratio,
Atmospheric pressure: 6 Pa,
Cathode electrode: Ti—Al alloy with various compositions,
Arc discharge current: 70 A, and
Bias pressure applied to cemented carbide substrate: −90 V, and furthermore, (C) an α- or κ-type crystal structure $Al_2O_3$ layer having a target structure shown in Table 5-4 and Table 5-6 or an $Al_2O_3$—$ZrO_2$ mixed layer, as the upper hard layer, was deposited on the surface of the lower hard layer under the same conditions as shown in Table 5-2, using a conventional chemical deposition apparatus, thereby to produce throw-away inserts made of a coated cemented carbide (hereinafter referred to as coated cemented carbide inserts of the present invention) 5-1 to 5-20 having a shape shown in a schematic perspective view of FIG. 2A and a schematic longitudinal cross-sectional view of FIG. 2B of the present invention.

For comparison, as shown in Table 5-7 to Table 5-10, throw-away inserts made of a conventional coated cemented carbide (hereinafter referred to as conventional coated cemented carbide inserts) 5-1 to 5-20 were respectively produced under the same conditions described above, except that the pre-treatment and the arc ion plating surface treatment under the above conditions to the surface of the cemented carbide substrates A5-1 to A5-10 in the arc ion plating apparatus were not conducted, and therefore, the amorphous layer was not formed on the surface of the cemented carbide substrates A5-1 to A5-10 and also the TiN layer as the primary tough layer was not formed.

Then, the coated cemented carbide inserts 5-1 to 5-20 of the present invention and the conventional coated cemented carbide inserts 5-1 to 5-20 were subjected to a dry type thick depth-of-cut interrupted cutting test of an alloy steel under the following conditions:

Workpiece: JIS•SNCM439 round bar with four longitudinal grooves equally spaced,
Cutting speed: 130 m/min.,
Depth of cut: 5 mm,
Feed: 0.19 mm/rev., and
Cutting time: 5 min., a dry type high feed interrupted cutting test of a die steel under the following conditions:

Workpiece: JIS•SKD61 round bar with four longitudinal grooves equally spaced,
Cutting speed: 35 m/min.,
Depth of cut: 1.6 mm,
Feed: 0.45 mm/rev., and
Cutting time: 5 min., and a dry type thick depth-of-cut interrupted cutting test of a ductile cast iron under the following conditions:

Workpiece: JIS•FCD500 round bar with four longitudinal grooves equally spaced,
Cutting speed: 160 m/min.,
Depth of cut: 7 mm,
Feed: 0.15 mm/rev., and
Cutting time: 5 min., in the state of being screwed into the tip portion of a tool steel bit using a fixing jig. In all cutting tests, the flank wear width of the cutting edge was measured. The measurement results are shown in Table 5-4, Table 5-6, Table 5-8 and Table 5-10.

TABLE 5-1

| | | Composition formula (% by weight) | | | | | | | | |
|---|---|---|---|---|---|---|---|---|---|---|
| Classification | | Co | TiC | ZrC | VC | TaC | NbC | $Cr_3C_2$ | TiN | TaN | WC |
| Cemented | A5-1 | 9 | 8.5 | — | — | 8 | 1.5 | — | — | — | balance |
| carbide | A5-2 | 7.5 | — | — | — | — | — | — | — | — | balance |
| substrates | A5-3 | 6 | — | — | — | 1.3 | 0.7 | — | — | — | balance |
| (inserts) | A5-4 | 10 | — | — | — | — | — | 0.7 | — | — | balance |
| | A5-5 | 14 | — | — | 0.5 | — | — | 0.8 | — | — | balance |
| | A5-6 | 9 | 9.5 | — | — | 5 | 4 | — | — | — | balance |
| | A5-7 | 10.5 | — | — | — | — | — | 0.8 | — | — | balance |
| | A5-8 | 8.5 | 4 | 4 | — | — | 2 | — | — | — | balance |
| | A5-9 | 12 | 14 | — | 0.5 | 3 | 3 | 0.5 | — | — | balance |
| | A5-10 | 10 | 5 | — | — | 1 | 1 | 0.3 | 1 | 1.5 | balance |

TABLE 5-2

| | | Forming conditions | | |
|---|---|---|---|---|
| Upper hard layer | | | Reactive atmosphere | |
| Classification | Composition of reactive gas (% by volume) | | Pressure (kPa) | Temperature (° C.) |
| $\alpha Al_2O_3$ | $AlCl_3$: 4%, $CO_2$: 3%, HCl: 1%, $H_2S$: 0.2%, $H_2$: balance | | 7 | 1040 |
| $\kappa Al_2O_3$ | $AlCl_3$: 3.3%, $CO_2$: 5.5%, HCl: 2.2%, $H_2S$: 0.2%, $H_2$: balance | | 7 | 950 |
| Mixed layer ① (matrix: $\alpha$-$Al_2O_3$, $ZrO_2$: target 3 mol %) | $AlCl_3$: 3.3%, $ZrCl_4$: 1.1%, $CO_2$: 5%, HCl: 2.2%, $H_2$: balance | | 7 | 1000 |
| Mixed layer ② (matrix: $\kappa$-$Al_2O_3$, $ZrO_2$: target 10 mol %) | $AlCl_3$: 1.1%, $ZrCl_4$: 3.3%, $CO_2$: 4%, HCl: 2.2%, $H_2$: balance | | 7 | 950 |

TABLE 5-3

| | | Cemented carbide substrate | | Lower hard layer | | | | | | | | | |
|---|---|---|---|---|---|---|---|---|---|---|---|---|---|
| | | | Average depth from | Primary tough | First layer | | | | | Second layer | | | |
| | Symbol of cemented | the surface of amorphous | layer Target thickness | Target composition (atomic ratio) | | | | Target thickness | Target composition (atomic ratio) | | | | Target thickness |
| Classification | carbide substrate | layer (nm) | (μm) | Ti | Al | C | N | (μm) | Ti | Al | C | N | (μm) |
| Coated | 5-1 A5-1 | 7.8 | 0.3 | 0.65 | 0.35 | — | 1.00 | 0.5 | — | — | — | — | — |
| cemented | 5-2 A5-2 | 49.6 | 5 | 0.80 | 0.20 | — | 1.00 | 10 | — | — | — | — | — |
| carbide | 5-3 A5-3 | 5.5 | 0.1 | 0.40 | 0.60 | — | 1.00 | 5 | — | — | — | — | — |
| inserts of | 5-4 A5-4 | 10.7 | 1.5 | 0.35 | 0.65 | — | 1.00 | 3 | — | — | — | — | — |
| the | 5-5 A5-5 | 3.2 | 0.4 | 0.50 | 0.50 | — | 1.00 | 6 | — | — | — | — | — |
| present | 5-6 A5-6 | 13.8 | 1 | 0.70 | 0.30 | 0.15 | 0.85 | 15 | — | — | — | — | — |
| invention | 5-7 A5-7 | 26.7 | 3 | 0.55 | 0.45 | 0.30 | 0.70 | 13 | — | — | — | — | — |
| | 5-8 A5-8 | 19.9 | 2 | 0.45 | 0.55 | 0.01 | 0.99 | 12 | — | — | — | — | — |
| | 5-9 A5-9 | 39.8 | 4 | 0.70 | 0.30 | 0.50 | 0.50 | 8 | — | — | — | — | — |
| | 5-10 A5-10 | 1.2 | 2.5 | 0.85 | 0.15 | 0.40 | 0.60 | 4 | — | — | — | — | — |

TABLE 5-4

| | | Upper hard layer | | Flank wear width (mm) | | |
|---|---|---|---|---|---|---|
| | | | | Interrupted thick depth-of-cut of alloy steel | Interrupted high feed of die steel | Interrupted thick depth-of-cut of ductile cast iron |
| Classification | | Composition | Target thickness (μm) | | | |
| Coated | 5-1 | α-Al$_2$O$_3$ | 10 | 0.15 | 0.20 | 0.12 |
| cemented | 5-2 | κ-Al$_2$O$_3$ | 3 | 0.12 | 0.17 | 0.18 |
| carbide | 5-3 | Mixed layer ① | 0.5 | 0.10 | 0.16 | 0.21 |
| inserts of the | 5-4 | Mixed layer ② | 5 | 0.13 | 0.17 | 0.16 |
| present | 5-5 | α-Al$_2$O$_3$ | 8 | 0.14 | 0.18 | 0.14 |
| invention | 5-6 | κ-Al$_2$O$_3$ | 1 | 0.10 | 0.15 | 0.20 |
| | 5-7 | α-Al$_2$O$_3$ | 2 | 0.11 | 0.16 | 0.19 |
| | 5-8 | Mixed layer ① | 5 | 0.13 | 0.17 | 0.16 |
| | 5-9 | Mixed layer ② | 3 | 0.12 | 0.16 | 0.18 |
| | 5-10 | κ-Al$_2$O$_3$ | 4 | 0.12 | 0.17 | 0.17 |

TABLE 5-5

| | | Cemented carbide substrate | | Lower hard layer | | | | | | | | | |
|---|---|---|---|---|---|---|---|---|---|---|---|---|---|
| | | | Average depth from | Primary tough | First layer | | | | | Second layer | | | |
| | Symbol of cemented | the surface of amorphous | layer Target thickness | Target composition (atomic ratio) | | | | Target thickness | Target composition (atomic ratio) | | | | Target thickness |
| Classification | carbide substrate | layer (nm) | (μm) | Ti | Al | C | N | (μm) | Ti | Al | C | N | (μm) |
| Coated | 5-11 A5-1 | 10.2 | 0.1 | 0.50 | 0.50 | — | 1.00 | 3 | 0.80 | 0.20 | — | 1.00 | 2 |
| cemented | 5-12 A5-2 | 15.4 | 1 | 0.60 | 0.40 | — | 1.00 | 10 | 0.40 | 0.60 | — | 1.00 | 2 |
| carbide | 5-13 A5-3 | 3.3 | 0.4 | 0.40 | 0.60 | — | 1.00 | 5 | 0.70 | 0.30 | 0.01 | 0.99 | 5 |
| inserts of | 5-14 A5-4 | 48.5 | 5 | 0.70 | 0.30 | — | 1.00 | 8 | 0.50 | 0.50 | — | 1.00 | 1 |
| the | 5-15 A5-5 | 6.4 | 0.3 | 0.55 | 0.45 | — | 1.00 | 7 | 0.75 | 0.25 | 0.50 | 0.50 | 3 |
| present | 5-16 A5-6 | 9.6 | 3.5 | 0.80 | 0.20 | 0.01 | 0.99 | 5 | 0.40 | 0.60 | 0.10 | 0.90 | 10 |
| invention | 5-17 A5-7 | 37.1 | 4 | 0.45 | 0.55 | 0.55 | 0.45 | 5 | 0.85 | 0.15 | — | 1.00 | 5 |
| | 5-18 A5-8 | 22.8 | 1.5 | 0.35 | 0.65 | 0.15 | 0.85 | 2 | 0.50 | 0.50 | 0.35 | 0.65 | 3 |
| | 5-19 A5-9 | 25.4 | 0.2 | 0.85 | 0.15 | 0.05 | 0.95 | 0.3 | 0.45 | 0.55 | 0.25 | 0.75 | 0.2 |
| | 5-20 A5-10 | 30.5 | 3 | 0.75 | 0.25 | 0.40 | 0.60 | 1 | 0.65 | 0.35 | — | 1.00 | 4 |

TABLE 5-6

| Classification | | Upper hard layer | | Flank wear width (mm) | | |
|---|---|---|---|---|---|---|
| | | Composition | Target thickness (μm) | Interrupted thick depth-of-cut of alloy steel | Interrupted high feed of die steel | Interrupted thick depth-of-cut of ductile cast iron |
| Coated cemented carbide inserts of the present invention | 5-11 | Mixed layer ① | 1 | 0.10 | 0.15 | 0.19 |
| | 5-12 | α-Al₂O₃ | 3 | 0.12 | 0.17 | 0.20 |
| | 5-13 | κ-Al₂O₃ | 2 | 0.11 | 0.16 | 0.17 |
| | 5-14 | Mixed layer ② | 6 | 0.13 | 0.18 | 0.16 |
| | 5-15 | κ-Al₂O₃ | 4 | 0.12 | 0.17 | 0.18 |
| | 5-16 | α-Al₂O₃ | 0.5 | 0.09 | 0.15 | 0.19 |
| | 5-17 | Mixed layer ① | 5 | 0.13 | 0.18 | 0.18 |
| | 5-18 | α-Al₂O₃ | 7 | 0.15 | 0.19 | 0.15 |
| | 5-19 | κ-Al₂O₃ | 10 | 0.15 | 0.20 | 0.15 |
| | 5-20 | Mixed layer ② | 8 | 0.14 | 0.19 | 0.13 |

TABLE 5-7

| Classification | | Cemented carbide substrate Symbol of cemented carbide substrate | Average depth from the surface of amorphous layer (nm) | Primary tough layer Target thickness (μm) | Lower hard layer | | | | | | | | | |
|---|---|---|---|---|---|---|---|---|---|---|---|---|---|---|
| | | | | | First layer | | | | | Second layer | | | | |
| | | | | | Target composition (atomic ratio) | | | | Target thickness | Target composition (atomic ratio) | | | | Target thickness |
| | | | | | Ti | Al | C | N | (μm) | Ti | Al | C | N | (μm) |
| Conventional coated cemented carbide inserts | 5-1 | A5-1 | — | the same as the coated cemented carbide insert 5-1 of the present invention | | | | | | | | | | |
| | 5-2 | A5-2 | — | the same as the coated cemented carbide insert 5-2 of the present invention | | | | | | | | | | |
| | 5-3 | A5-3 | — | the same as the coated cemented carbide insert 5-3 of the present invention | | | | | | | | | | |
| | 5-4 | A5-4 | — | the same as the coated cemented carbide insert 5-4 of the present invention | | | | | | | | | | |
| | 5-5 | A5-5 | — | the same as the coated cemented carbide insert 5-5 of the present invention | | | | | | | | | | |
| | 5-6 | A5-6 | — | the same as the coated cemented carbide insert 5-6 of the present invention | | | | | | | | | | |
| | 5-7 | A5-7 | — | the same as the coated cemented carbide insert 5-7 of the present invention | | | | | | | | | | |
| | 5-8 | A5-8 | — | the same as the coated cemented carbide insert 5-8 of the present invention | | | | | | | | | | |
| | 5-9 | A5-9 | — | the same as the coated cemented carbide insert 5-9 of the present invention | | | | | | | | | | |
| | 5-10 | A5-10 | — | the same as the coated cemented carbide insert 5-10 of the present invention | | | | | | | | | | |

TABLE 5-8

| Classification | | Upper hard layer | | Cutting test results | | |
|---|---|---|---|---|---|---|
| | | Compositon | Target thickness (μm) | Interrupted thick depth-of-cut of alloy steel | Interrupted high feed of die steel | Interrupted thick depth-of-cut of ductile cast iron |
| Conventional coated cemented carbide inserts | 5-1 | the same as the coated cemented carbide insert 5-1 of the present invention | Failure at 2.0 min.** | Failure at 1.8 min.** | Failure at 3.1 min.* |
| | 5-2 | the same as the coated cemented carbide insert 5-2 of the present invention | Failure at 1.6 min.** | Failure at 0.8 min.* | Failure at 1.8 min.* |
| | 5-3 | the same as the coated cemented carbide insert 5-3 of the present invention | Failure at 2.5 min.** | Failure at 2.0 min.** | Failure at 4.0 min.** |
| | 5-4 | the same as the coated cemented carbide insert | Failure at 2.2 | Failure at 1.8 | Failure at 3.5 |

TABLE 5-8-continued

| | | | Cutting test results | | |
|---|---|---|---|---|---|
| | Upper hard layer | | Interrupted thick depth-of-cut of alloy steel | Interrupted high feed of die steel | Interrupted thick depth-of-cut of ductile cast iron |
| Classification | Compositon | Target thickness (μm) | | | |
| 5-5 | the same as the coated cemented carbide insert 5-4 of the present invention insert 5-5 of the present invention | | Failure at 1.8 min.* | Failure at 1.2 min.** | Failure at 2.1 min.** |
| 5-6 | the same as the coated cemented carbide insert 5-6 of the present invention | | Failure at 1.7 min.** | Failure at 0.7 min.* | Failure at 2.0 min.* |
| 5-7 | the same as the coated cemented carbide insert 5-7 of the present invention | | Failure at 2.3 min.* | Failure at 0.7 min.* | Failure at 1.8 min.** |
| 5-8 | the same as the coated cemented carbide insert 5-8 of the present invention | | Failure at 1.5 min.** | Failure at 0.6 min.* | Failure at 1.6 min.* |
| 5-9 | the same as the coated cemented carbide insert 5-9 of the present invention | | Failure at 1.7 min.** | Failure at 1.1 min.* | Failure at 2.2 min.** |
| 5-10 | the same as the coated cemented carbide insert 5-10 of the present invention | | Failure at 2.1 min.** | Failure at 1.6 min.* | Failure at 3.0 min.* |

*indicates that failure was caused by chipping at the cutting edge, and
**indicates that failure was caused by peeling in the wear-resistant coating layer

TABLE 5-9

| | Cemented carbide substrate | | Primary tough layer | Lower hard layer | | | | |
|---|---|---|---|---|---|---|---|---|
| | | Average depth from the surface of amorphous layer (nm) | | First layer | | Second layer | | |
| Classification | Symbol of cemented carbide substrate | | Target thickness (μm) | Target composition (atomic ratio) Ti Al C N | Target thickness (μm) | Target composition (atomic ratio) Ti Al C N | Target thickness (μm) | |
| Conventional coated cemented carbide inserts | 5-11 | A5-1 | — | the same as the coated cemented carbide insert 5-11 of the present invention | | | | |
| | 5-12 | A5-2 | — | the same as the coated cemented carbide insert 5-12 of the present invention | | | | |
| | 5-13 | A5-3 | — | the same as the coated cemented carbide insert 5-13 of the present invention | | | | |
| | 5-14 | A5-4 | — | the same as the coated cemented carbide insert 5-14 of the present invention | | | | |
| | 5-15 | A5-5 | — | the same as the coated cemented carbide insert 5-15 of the present invention | | | | |
| | 5-16 | A5-6 | — | the same as the coated cemented carbide insert 5-16 of the present invention | | | | |
| | 5-17 | A5-7 | — | the same as the coated cemented carbide insert 5-17 of the present invention | | | | |
| | 5-18 | A5-8 | — | the same as the coated cemented carbide insert 5-18 of the present invention | | | | |
| | 5-19 | A5-9 | — | the same as the coated cemented carbide insert 5-19 of the present invention | | | | |
| | 5-20 | A5-10 | — | the same as the coated cemented carbide insert 5-20 of the present invention | | | | |

TABLE 5-10

| | Cemented carbide substrate | | Cutting test results | | |
|---|---|---|---|---|---|
| Classification | Symbol of cemented carbide substrate | Average depth from the surface of amorphous layer (nm) | Interrupted thick depth-of-cut of alloy steel | Interrupted high feed of die steel | Interrupted thick depth-of-cut of ductile cast iron |
| Conventional coated | 5-11 | the same as the coated cemented carbide insert 5-11 of the present invention | Failure at 2.4 min.** | Failure at 1.9 min.** | Failure at 3.7 min.** |

TABLE 5-10-continued

| | | | Cutting test results | | |
|---|---|---|---|---|---|
| | | Cemented carbide substrate | | | Interrupted |
| Classification | Symbol of cemented carbide substrate | Average depth from the surface of amorphous layer (nm) | Interrupted thick depth-of-cut of alloy steel | Interrupted high feed of die steel | thick depth-of-cut of ductile cast iron |
| cemented carbide inserts | 5-12 | the same as the coated cemented carbide insert 5-12 of the present invention | Failure at 1.8 min.** | Failure at 0.9 min.* | Failure at 2.5 min.* |
| | 5-13 | the same as the coated cemented carbide insert 5-13 of the present invention | Failure at 1.9 min.* | Failure at 1.5 min.* | Failure at 2.4 min. |
| | 5-14 | the same as the coated cemented carbide insert 5-14 of the present invention | Failure at 1.3 min.** | Failure at 0.6 min.* | Failure at 1.5 min.* |
| | 5-15 | the same as the coated cemented carbide insert 5-15 of the present invention | Failure at 1.7 min.** | Failure at 1.3 min.* | Failure at 2.3 min.* |
| | 5-16 | the same as the coated cemented carbide insert 5-16 of the present invention | Failure at 1.5 min.* | Failure at 0.7 min.* | Failure at 1.7 min.* |
| | 5-17 | the same as the coated cemented carbide insert 5-17 of the present invention | Failure at 1.0 min.* | Failure at 0.4 min.* | Failure at 1.2 min.* |
| | 5-18 | the same as the coated cemented carbide insert 5-18 of the present invention | Failure at 1.0 min.** | Failure at 1.4 min.* | Failure at 2.2 min.** |
| | 5-19 | the same as the coated cemented carbide insert 5-19 of the present invention | Failure at 2.0 min.** | Failure at 1.7 min.* | Failure at 2.8 min.** |
| | 5-20 | the same as the coated cemented carbide insert 5-20 of the present invention | Failure at 1.8 min.** | Failure at 1.0 min.* | Failure at 1.9 min.** |

*indicates that failure was caused by chipping at the cutting edge, and
**indicates that failure was caused by peeling in the wear-resistant coating layer

EXAMPLE 5-2

Cemented carbide substrates B5-1 to B5-8 for end mill, each having a size of 6 mm×13 mm, 10 mm×22 mm, and 20 mm×45 mm in diameter and length of the cutting edge portion, were produced in accordance with the combination shown in Table 5-11 by preparing a WC powder of medium coarse grains having an average grain size of 5.5 μm, a WC powder of fine grains having an average grain size of 0.8 μm, a TaC powder having an average grain size of 1.3 μm, a NbC powder having an average grain size of 1.2 μm, a ZrC powder having an average grain size of 1.2 μm, a $Cr_3C_2$ powder having an average grain size of 2.3 μm, a VC powder having an average grain size of 1.5 μm, a (Ti, W)C powder having an average grain size of 1.0 μm and a Co powder having an average grain size of 1.8 μm, compounding these raw powders according to each formulation in Table 5-8, adding a wax, mixing them in acetone in a ball mill for 24 hours, drying the mixture under reduced pressure, compacting the dried mixture under a pressure of 100 MPa to form green compacts, sintering these green compacts under the conditions of heating to a predetermined temperature within a range from 1370 to 1470° C. at a heating rate of 7° C./min. in a vacuum atmosphere of 6 Pa, maintaining at this temperature for one hour and furnace-cooling, thereby forming three kinds of sintered round bars for forming cemented carbide substrate, each having a diameter of 8 mm, 13 mm and 26 mm, and cutting three kinds of the sintered round bars.

These cemented carbide substrates B5-1 to B5-8 were subjected to ultrasonic cleaning in acetone, were dried, and were then charged in the same arc ion plating apparatus shown in FIG. 1 and the surface of each of these cemented carbide substrates was subjected to the pre-treatment and the arc ion plating surface treatment under the same conditions as in Example 1 to form an amorphous layer on the surface of the cemented carbide substrates B5-1 to B5-8. The depth of the amorphous layer formed from the surface thereof was also set by controlling the treating time of the arc ion plating surface treatment under the conditions described above.

The structure of the amorphous layer formed on the surface of the cemented carbide substrates B5-1 to B5-8 was observed by using a transmission electron microscope (magnification: 500,000) and the judgment and measurement were conducted based on the observation results. As a result, the average depth (average in depths measured at five points) from the surface is shown in Table 5-12 and Table 5-14, respectively.

Using the same arc ion plating apparatus, a TiN layer, as the primary tough layer, having a target thickness shown in Table 5-12 and Table 5-14 was deposited on the surface of these cemented carbide substrates under the same conditions as in Example 1, and then a single-layered or multi-layered lower hard layer of either or both of a (Ti, Al)N layer and a (Ti, Al)CN layer, which have a target composition and a target thickness shown in Table 5-12 and 5-14, was formed on the surface thereof and, furthermore, an α- or κ-type crystal structure $Al_2O_3$ layer having a target structure shown in Table 5-13 and Table 5-15 or an $Al_2O_3$—ZrO2 mixed layer, as the upper hard layer, was deposited on the surface of the lower hard layer under the same conditions as shown in Table 5-2, using a conventional chemical deposition apparatus, thereby producing end mills made of a surface-coated carbide alloy of the present invention (hereinafter referred to as coated cemented carbide end mills of the present invention) 5-1' to 5-16' as the coated cemented carbide tool of the present invention, which has a shape shown in a schematic front view of FIG. 3A and a schematic transverse cross-sectional view of FIG. 3B of the cutting edge portion.

For comparison, as shown in Table 5-16 and Table 5-19, end mills made of a conventional coated cemented carbide (hereinafter referred to as conventional coated cemented carbide end mills) 5-1' to 5-16' as the conventional coated cemented carbide tool were respectively produced under the same conditions described above, except that the pre-treatment and the arc ion plating surface treatment under the above conditions to the surface of the cemented carbide substrates B5-1 to B5-8 in the arc ion plating apparatus were not conducted, and therefore, the amorphous layer did not exist on the surface of the cemented carbide substrates B5-1 to B5-8 and also the TiN layer as the primary tough layer was not formed.

Then, the coated cemented carbide end mills 5-1' to 5-3' and 5-9' to 5-11' of the present invention and the conventional coated cemented carbide end mills 5-1' to 5-3' and 5-9' to 5-11', among the coated cemented carbide end mills 5-1' to 5-16' of the present invention and the conventional coated cemented carbide end mills 5-1' to 5-16', were subjected to a wet type thick depth-of-cut side cutting test of a cast iron under the following conditions:

Workpiece: JIS•FC300 plate having a planar size of 100 mm×250 mm and a thickness of 50 mm,
Rotating speed: 5300 min$^{-1}$,
Depth of cut in axial direction: 12 mm,
Depth of cut in radial direction: 1.6 mm, and
Feed: 585 mm/min.

The coated cemented carbide end mills 5-4' to 5-6' and 5-12' to 5-14' of the present invention and the conventional coated cemented carbide end mills 5-4' to 5-6' and 5-12' to 5-14' were subjected to a wet type thick depth-of-cut side cutting test of an alloy steel under the following conditions:

Workpiece: JIS•SNCM439 plate having a planar size of 100 mm×250 mm and a thickness of 50 mm,
Rotating speed: 2100 min$^{-1}$,
Depth of cut in axial direction: 20 mm,
Depth of cut in radial direction: 2.6 mm, and
Feed: 250 mm/min.

The coated cemented carbide end mills 5-7', 5-8', 5-15' and 5-16' of the present invention and the conventional coated cemented carbide end mills 5-7', 5-8', 5-15' and 5-16' were subjected to a wet type thick depth-of-cut side cutting test of a hardened steel under the following conditions:

Workpiece: JIS•SKD61 (hardness: HRC52) plate having a planar size of 100 mm×250 mm and a thickness of 50 mm,
Rotating speed: 650 min$^{-1}$,
Depth of cut in axial direction: 26 mm,
Depth of cut in radial direction: 1.4 mm, and
Feed: 68 mm/min.

In all side cutting tests (water-soluble cutting oil was used in all tests), the cutting length until the flank wear amount of the peripheral edge reaches 0.1 mm as a criterion of the service life was measured. The measurement results are respectively shown in Table 5-13, Table 5-15, Table 5-17 and Table 5-19.

TABLE 5-11

| Classification | | Co | (Ti, W) C | TaC | NbC | ZrC | $Cr_3C_2$ | VC | WC | Diameter × length (mm) of cutting edge portion |
|---|---|---|---|---|---|---|---|---|---|---|
| Cemented carbide substrates (end mills) | B5-1 | 6 | — | — | — | — | 0.5 | — | Medium coarse grains: balance | 6 × 13 |
| | B5-2 | 10 | — | — | 2 | — | — | — | Fine grains: balance | 6 × 13 |
| | B5-3 | 10 | — | 1 | — | 1 | 0.5 | 0.5 | Fine grains: balance | 6 × 13 |
| | B5-4 | 8 | — | — | — | — | 0.4 | 0.4 | Fine grains: balance | 10 × 22 |
| | B5-5 | 9 | 10 | — | 5 | — | — | — | Medium coarse grains: balance | 10 × 22 |
| | B5-6 | 10 | — | — | — | — | 1 | — | Fine grains: balance | 10 × 22 |
| | B5-7 | 8 | 12 | 9 | 1 | — | — | — | Medium coarse grains: balance | 20 × 45 |
| | B5-8 | 6 | — | 5 | 5 | 5 | — | — | Medium coarse grains: balance | 20 × 45 |

TABLE 5-12

| | | Cemented carbide substrate | | Primary tough layer | Lower hard layer | | | | | |
|---|---|---|---|---|---|---|---|---|---|---|
| | | | Average depth from | | First layer | | Second layer | | | |
| | Symbol of cemented carbide | surface of amorphous | Target thickness | Target composition (atomic ratio) | | Target thickness | Target composition (atomic ratio) | | | Target thickness |
| Classification | | substrate | layer (nm) | (μm) | Ti | Al | C | N | (μm) | Ti | Al | C | N | (μm) |
| Coated cemented carbide end mills of the present | 5-1' | B5-1 | 7.6 | 0.1 | 0.65 | 0.35 | — | 1.00 | 0.5 | — | — | — | — | — |
| | 5-2' | B5-2 | 41.2 | 1 | 0.80 | 0.20 | — | 1.00 | 4 | — | — | — | — | — |
| | 5-3' | B5-3 | 5.4 | 1.5 | 0.85 | 0.15 | 0.50 | 0.50 | 3 | — | — | — | — | — |
| | 5-4' | B5-4 | 48.9 | 2 | 0.50 | 0.50 | — | 1.00 | 2.5 | — | — | — | — | — |
| | 5-5' | B5-5 | 15.9 | 0.3 | 0.70 | 0.30 | 0.15 | 0.85 | 2 | — | — | — | — | — |
| | 5-6' | B5-6 | 1.2 | 0.5 | 0.55 | 0.45 | 0.30 | 0.70 | 1 | — | — | — | — | — |

TABLE 5-12-continued

| | | Cemented carbide substrate | | Primary tough layer | Lower hard layer | | | | | | | | | |
|---|---|---|---|---|---|---|---|---|---|---|---|---|---|---|
| | | | Average depth from | | First layer | | | | | Second layer | | | | |
| | Symbol of | the | | | | | | | | | | | | |
| | cemented | surface of | Target | Target composition (atomic ratio) | | | | Target | Target composition (atomic ratio) | | | | Target | |
| Classification | carbide substrate | amorphous layer (nm) | thickness (μm) | Ti | Al | C | N | thickness (μm) | Ti | Al | C | N | thickness (μm) | |
| invention | 5-7' | B5-7 | 24.6 | 1 | 0.45 | 0.55 | 0.01 | 0.99 | 2 | — | — | — | — | — |
| | 5-8' | B5-8 | 33.2 | 0.7 | 0.35 | 0.65 | — | 1.00 | 1.5 | — | — | — | — | — |

TABLE 5-13

| | | Upper hard layer | | |
|---|---|---|---|---|
| Classification | | Composition | Target thickness (μm) | Cut length (m) |
| Coated | 5-1' | α-Al$_2$O$_3$ | 8 | 388 |
| cemented | 5-2' | κ-Al$_2$O$_3$ | 0.5 | 352 |
| carbide end | 5-3' | Mixed layer ① | 3 | 372 |
| mills of the | 5-4' | Mixed layer ② | 1 | 163 |
| present | 5-5' | α-Al$_2$O$_3$ | 2 | 155 |
| invention | 5-6' | κ-Al$_2$O$_3$ | 5 | 183 |
| | 5-7' | Mixed layer ① | 4 | 79 |
| | 5-8' | Mixed layer ② | 1.5 | 63 |

TABLE 5-14

| | | Cemented carbide substrate | | Primary tough layer | Lower hard layer | | | | | | | | | |
|---|---|---|---|---|---|---|---|---|---|---|---|---|---|---|
| | | | Average depth from | | First layer | | | | | Second layer | | | | |
| | Symbol of | the | | | | | | | | | | | | |
| | cemented | surface of | Target | Target composition (atomic ratio) | | | | Target | Target composition (atomic ratio) | | | | Target | |
| Classification | carbide substrate | amorphous layer (nm) | thickness (μm) | Ti | Al | C | N | thickness (μm) | Ti | Al | C | N | thickness (μm) | |
| Coated | 5-9' | B5-1 | 10.9 | 0.3 | 0.50 | 0.50 | — | 1.00 | 0.5 | 0.80 | 0.20 | — | 1.00 | 10 |
| cemented | 5-10' | B5-2 | 17.4 | 2 | 0.85 | 0.15 | 0.05 | 0.95 | 2 | 0.40 | 0.60 | — | 1.00 | 2 |
| carbide | 5-11' | B5-3 | 7.8 | 1 | 0.40 | 0.60 | — | 1.00 | 5 | 0.70 | 0.30 | 0.01 | 0.99 | 0.5 |
| end mills | 5-12' | B5-5 | 21.4 | 0.5 | 0.70 | 0.30 | — | 1.00 | 7 | 0.50 | 0.50 | — | 1.00 | 1 |
| of the | 5-13' | B5-4 | 5.5 | 1.5 | 0.45 | 0.55 | 0.55 | 0.45 | 1.5 | 0.85 | 0.15 | — | 1.00 | 0.5 |
| present | 5-14' | B5-6 | 48.8 | 1 | 0.35 | 0.65 | 0.20 | 0.80 | 1 | 0.50 | 0.50 | 0.35 | 0.65 | 1 |
| invention | 5-15' | B5-7 | 31.5 | 1 | 0.60 | 0.40 | — | 1.00 | 3 | 0.45 | 0.55 | 0.25 | 0.75 | 2 |
| | 5-16' | B5-8 | 1.4 | 0.1 | 0.75 | 0.25 | 0.40 | 0.60 | 0.5 | 0.65 | 0.35 | — | 1.00 | 0.5 |

TABLE 5-15

| | | Upper hard layer | | |
|---|---|---|---|---|
| Classification | | Composition | Target thickness (μm) | Cut length (m) |
| Coated | 5-9' | α-Al$_2$O$_3$ | 0.5 | 412 |
| cemented | 5-10' | κ-Al$_2$O$_3$ | 1 | 365 |
| carbide end | 5-11' | Mixed layer ① | 3 | 393 |
| mills of the | 5-12' | Mixed layer ② | 1 | 215 |
| present | 5-13' | α-Al$_2$O$_3$ | 3 | 185 |
| invention | 5-14' | κ-Al$_2$O$_3$ | 5 | 201 |
| | 5-15' | Mixed layer ① | 2 | 87 |
| | 5-16' | Mixed layer ② | 10 | 92 |

TABLE 5-16

| | | Cemented carbide substrate | | Primary tough layer | Lower hard layer | | | |
|---|---|---|---|---|---|---|---|---|
| | | | Average depth from | | First layer | | Second layer | |
| | Symbol of | the | | | | | |
| | cemented carbide | surface of amorphous | Target thickness | Target composition (atomic ratio) | Target thickness | Target composition (atomic ratio) | Target thickness |
| Classification | | substrate | layer (nm) | (μm) | Ti Al C N | (μm) | Ti Al C N | (μm) |
| Conventional coated cemented carbide end mills | 5-1' | B5-1 | — | — | the same as the coated cemented carbide end mill 5-1' of the present invention | | | |
| | 5-2' | B5-2 | — | — | the same as the coated cemented carbide end mill 5-2' of the present invention | | | |
| | 5-3' | B5-3 | — | — | the same as the coated cemented carbide end mill 5-3' of the present invention | | | |
| | 5-4' | B5-4 | — | — | the same as the coated cemented carbide end mill 5-4' of the present invention | | | |
| | 5-5' | B5-5 | — | — | the same as the coated cemented carbide end mill 5-5' of the present invention | | | |
| | 5-6' | B5-6 | — | — | the same as the coated cemented carbide end mill 5-6' of the present invention | | | |
| | 5-7' | B5-7 | — | — | the same as the coated cemented carbide end mill 5-7' of the present invention | | | |
| | 5-8' | B5-8 | — | — | the same as the coated cemented carbide end mill 5-8' of the present invention | | | |

TABLE 5-17

| | | Upper hard layer | | |
|---|---|---|---|---|
| Classification | | Composition | Target thickness (μm) | Cut length (m) |
| Conventional coated cemented carbide end mills | 5-1' | the same as the coated cemented carbide end mill 5-1' of the present invention | | Failure at 52 m* |
| | 5-2' | the same as the coated cemented carbide end mill 5-2' of the present invention | | Failure at 46 m** |
| | 5-3' | the same as the coated cemented carbide end mill 5-3' of the present invention | | Failure at 48 m* |
| | 5-4' | the same as the coated cemented carbide end mill 5-4' of the present invention | | Failure at 24 m** |
| | 5-5' | the same as the coated cemented carbide end mill 5-5' of the present invention | | Failure at 18 m** |
| | 5-6' | the same as the coated cemented carbide end mill 5-6' of the present invention | | Failure at 2.8 m** |
| | 5-7' | the same as the coated cemented carbide end mill 5-7' of the present invention | | Failure at 4 m* |
| | 5-8' | the same as the coated cemented carbide end mill 5-8' of the present invention | | Failure at 8 m** |

*indicates that failure was caused by chipping at the cutting edge, and
**indicates that failure was caused by peeling in the wear-resistant coating layer

TABLE 5-18

| | | Cemented carbide substrate | | Primary tough layer | Lower hard layer | | | |
|---|---|---|---|---|---|---|---|---|
| | | | Average depth from | | First layer | | Second layer | |
| | Symbol of | the | | | | | |
| | cemented carbide | surface of amorphous | Target thickness | Target composition (atomic ratio) | Target thickness | Target composition (atomic ratio) | Target thickness |
| Classification | | substrate | layer (nm) | (μm) | Ti Al C N | (μm) | Ti Al C N | (μm) |
| Conventional coated cemented | 5-9' | B5-1 | — | — | the same as the coated cemented carbide end mill 5-9' of the present invention | | | |
| | 5-10' | B5-2 | — | — | the same as the coated cemented carbide end mill 5-10' of the present invention | | | |

TABLE 5-18-continued

| | | Cemented carbide substrate | | Primary tough layer | Lower hard layer | | | |
|---|---|---|---|---|---|---|---|---|
| | | | Average depth from | | First layer | | Second layer | |
| | Symbol of | the | | | | | |
| | cemented | surface of | Target | Target composi- | Target | Target composi- | Target |
| | carbide | amorphous | thickness | tion (atomic ratio) | thickness | tion (atomic ratio) | thickness |
| Classification | substrate | layer (nm) | (μm) | Ti Al C N | (μm) | Ti Al C N | (μm) |
| carbide end mills | 5-11' | B5-3 | — | — | the same as the coated cemented carbide end mill 5-11' of the present invention | | | |
| | 5-12' | B5-4 | — | — | the same as the coated cemented carbide end mill 5-12' of the present invention | | | |
| | 5-13' | B5-5 | — | — | the same as the coated cemented carbide end mill 5-13' of the present invention | | | |
| | 5-14' | B5-6 | — | — | the same as the coated cemented carbide end mill 5-14' of the present invention | | | |
| | 5-15' | B5-7 | — | — | the same as the coated cemented carbide end mill 5-15' of the present invention | | | |
| | 5-16' | B5-8 | — | — | the same as the coated cemented carbide end mill 5-16' of the present invention | | | |

TABLE 5-19

| | | Upper hard layer | |
|---|---|---|---|
| Classification | | Composition | Target thickness (μm) | Cut length (m) |
| Conventional coated cemented carbide end mills | 5-9' | the same as the coated cemented carbide end mill 5-9' of the present invention | Failure at 55 m* |
| | 5-10' | the same as the coated cemented carbide end mill 5-10' of the present invention | Failure at 46 m** |
| | 5-11' | the same as the coated cemented carbide end mill 5-11' of the present invention | Failure at 38 m* |
| | 5-12' | the same as the coated cemented carbide end mill 5-12' of the present invention | Failure at 20 m* |
| | 5-13' | the same as the coated cemented carbide end mill 5-13' of the present invention | Failure at 17 m** |
| | 5-14' | the same as the coated cemented carbide end mill 5-14' of the present invention | Failure at 21 m* |
| | 5-15' | the same as the coated cemented carbide end mill 5-15' of the present invention | Failure at 10 m* |
| | 5-16' | the same as the coated cemented carbide end mill 5-16' of the present invention | Failure at 9 m* |

*indicates that failure was caused by chipping at the cutting edge, and
**indicates that failure was caused by peeling in the wear-resistant coating layer

EXAMPLE 5-3

Using three kinds of sintered round bars, each having a diameter of 8 mm (for forming cemented carbide substrates B5-1 to B5-3), a diameter of 13 mm (for forming cemented carbide substrates B5-4 to B5-6) and 26 mm (for forming cemented carbide substrates B5-7 to B5-8), produced in Example 5-2, cemented carbide substrates C5-1 to C5-8 for drills, each having a size of 4 mm×13 mm (cemented carbide substrates C5-1 to C5-3), 8 mm×22 mm (cemented carbide substrates C5-4 to C5-6), and 16 mm×45 mm (cemented carbide substrates C5-7 to C5-8) in diameter and length of the flute, were produced from these three kinds of sintered round bars.

These cemented carbide substrates C5-1 to C5-8 were subjected to ultrasonic cleaning in acetone, were dried, and were then charged in the same arc ion plating apparatus shown in FIG. 1 and the surface of each of these cemented carbide substrates was subjected to the pre-treatment and the arc ion plating surface treatment under the same conditions as in Example 1 to form an amorphous layer on the surface of the cemented carbide substrates C5-1 to C5-8. The depth of the amorphous layer formed from the surface thereof was also set by controlling the treating time of the arc ion plating surface treatment under the conditions described above.

The structure of the amorphous layer formed on the surface of the cemented carbide substrates C5-1 to C5-8 was observed by using a transmission electron microscope (magnification: 500,000) and the judgment and measurement were conducted based on the observation results. As a result, the average depth (average in depths measured at five points) from the surface is shown in Table 5-20 and Table 5-22, respectively.

Using the same arc ion plating apparatus, a TiN layer, as the primary tough layer, having a target thickness shown in Table 5-13 and Table 5-14 was deposited on the surface of these cemented carbide substrates under the same conditions as in Example 1, and then a single-layered or multi-layered lower hard layer of either or both of a (Ti, Al)N layer and a (Ti, Al)CN layer, which have a target composition and a target thickness shown in Table 5-20 and 5-22, was formed on the surface thereof and, furthermore, an α- or κ-type crystal structure $Al_2O_3$ layer having a target structure shown in Table 5-21 and Table 5-23 or an $Al_2O_3$—$ZrO_2$ mixed layer, as the upper hard layer, was deposited on the surface of the lower hard layer under the same conditions as shown in Table 5-2, using a conventional chemical deposition apparatus, thereby to produce drills made of a surface-coated carbide alloy of the present invention (hereinafter referred to as coated cemented carbide drills of the present invention) 5-1" to 5-16" as the coated cemented carbide tool of the present invention, which has a shape shown in a schematic front view of FIG. 4A and a schematic transverse cross-sectional view of FIG. 4B of the flute.

For comparison, as shown in Table 5-24 to Table 5-27, end drills made of a conventional coated cemented carbide (hereinafter referred to as conventional coated cemented carbide drills) 5-1" to 5-16" as the conventional coated cemented carbide tool were respectively produced under the same conditions described above, except that the pre-treatment and the arc ion plating surface treatment under the above conditions to the surface of the cemented carbide substrates C5-1 to C5-8 in the arc ion plating apparatus were not conducted, and therefore, the amorphous layer did not exist on the surface of the cemented carbide substrates C1-1 to C1-8 and the TiN layer as the primary tough layer was not formed.

Then, the coated cemented carbide drills 5-1" to 5-3" and 5-9" to 5-11" of the present invention and the conventional coated cemented carbide drills 5-11" to 5-3" and 5-9" to 5-11", among the coated cemented carbide drills 5-1" to 5-16" of the present invention and the conventional coated cemented carbide drills 5-1" to 5-16", were subjected to a wet type high feed drilling test of a cast iron under the following conditions:

Workpiece: JIS•FC300 plate having a planar size of 100 mm×250 mm and a thickness of 50 mm,
Cutting speed: 48 m/min., and
Feed: 0.40 mm/div.

The coated cemented carbide drills 5-4" to 5-6" and 5-12" to 5-14" of the present invention and the conventional coated cemented carbide drills 5-4" to 5-6" and 5-12" to 5-14" were subjected to a wet type high feed drilling test of an alloy steel under the following conditions:

Workpiece: JIS•SNCM439 plate having a planar size of 100 mm×250 mm and a thickness of 50 mm,
Cutting speed: 50 m/min., and
Feed: 0.38 mm/div.

The coated cemented carbide drills 5-7", 5-8", 5-15" and 5-16" of the present invention and the conventional coated cemented carbide drills 5-7", 5-8", 5-15" and 5-16" were subjected to a wet type high feed drilling test of a hardened steel under the following conditions:

Workpiece: JIS•SKD61 (hardness: HRC53) plate having a planar size of 100 mm×250 mm and a thickness of 50 mm,
Cutting speed: 30 m/min., and
Feed: 0.34 mm/div.

In all wet type high feed drilling tests (water-soluble cutting oil was used in all tests), the number of drilled holes until the flank wear width of the tip edge face reaches 0.3 mm was measured. The measurement results are respectively shown in Table 5-21, Table 5-23, Table 5-25 and Table 5-27.

TABLE 5-20

| Classification | | Cemented carbide substrate | | Primary tough layer | Lower hard layer | | | | | | | | | |
|---|---|---|---|---|---|---|---|---|---|---|---|---|---|---|
| | | | Average depth from the surface of amorphous layer (nm) | | First layer | | | | | Second layer | | | | |
| | | Symbol of cemented carbide substrate | | Target thickness (μm) | Target composition (atomic ratio) | | | | Target thickness (μm) | Target composition (atomic ratio) | | | | Target thickness (μm) |
| | | | | | Ti | Al | C | N | | Ti | Al | C | N | |
| Coated cemented carbide drills of the present invention | 5-1" | C5-1 | 1.4 | 2 | 0.65 | 0.35 | — | 1.00 | 7 | — | — | — | — | — |
| | 5-2" | C5-2 | 38.6 | 0.1 | 0.80 | 0.20 | — | 1.00 | 15 | — | — | — | — | — |
| | 5-3" | C5-3 | 18.7 | 0.3 | 0.55 | 0.45 | 0.35 | 0.70 | 10 | — | — | — | — | — |
| | 5-4" | C5-4 | 3.3 | 0.5 | 0.50 | 0.50 | — | 1.00 | 5 | — | — | — | — | — |
| | 5-5" | C5-5 | 28.9 | 3.5 | 0.70 | 0.30 | 0.15 | 0.85 | 6 | — | — | — | — | — |
| | 5-6" | C5-6 | 5.4 | 1 | 0.35 | 0.65 | — | 1.00 | 1 | — | — | — | — | — |
| | 5-7" | C5-7 | 49.7 | 0.7 | 0.45 | 0.55 | 0.01 | 0.99 | 4 | — | — | — | — | — |
| | 5-8" | C5-8 | 11.2 | 5 | 0.85 | 0.15 | 0.50 | 0.50 | 3 | — | — | — | — | — |

TABLE 5-21

| Classification | | Upper hard layer | | |
|---|---|---|---|---|
| | | Composition | Target thickness (μm) | Number of drilled holes |
| Coated cemented carbide drills of the present invention | 5-1" | α-$Al_2O_3$ | 2 | 2255 |
| | 5-2" | κ-$Al_2O_3$ | 0.5 | 2683 |
| | 5-3" | Mixed layer ① | 1 | 2311 |
| | 5-4" | Mixed layer ② | 3 | 985 |
| | 5-5" | α-$Al_2O_3$ | 2 | 1156 |
| | 5-6" | κ-$Al_2O_3$ | 10 | 1189 |
| | 5-7" | Mixed layer ① | 7 | 491 |
| | 5-8" | Mixed layer ② | 5 | 515 |

TABLE 5-22

| Classification | | Cemented carbide substrate | | Primary tough layer Target thickness (μm) | Lower hard layer | | | | | | | | | |
| --- | --- | --- | --- | --- | --- | --- | --- | --- | --- | --- | --- | --- | --- | --- |
| | Symbol of cemented carbide | Average depth from the surface of amorphous layer (nm) | | | First layer | | | | | Second layer | | | | |
| | | | | | Target composition (atomic ratio) | | | | Target thickness (μm) | Target composition (atomic ratio) | | | | Target thickness (μm) |
| | | | | | Ti | Al | C | N | | Ti | Al | C | N | |
| Coated cemented carbide drills of the present invention | 5-9" | C-1 | 2.2 | 1.5 | 0.50 | 0.50 | — | 1.00 | 2 | 0.80 | 0.20 | — | 1.00 | 2 |
| | 5-10" | C-2 | 21.4 | 4 | 0.60 | 0.40 | — | 1.00 | 5 | 0.40 | 0.60 | — | 1.00 | 6 |
| | 5-11" | C-3 | 48.6 | 0.5 | 0.35 | 0.65 | 0.20 | 0.80 | 1 | 0.70 | 0.30 | 0.01 | 0.99 | 15 |
| | 5-12" | C-5 | 4.6 | 3 | 0.70 | 0.30 | — | 1.00 | 4 | 0.50 | 0.50 | — | 1.00 | 3 |
| | 5-13" | C-4 | 31.2 | 0.3 | 0.45 | 0.55 | 0.55 | 0.45 | 1 | 0.85 | 0.15 | — | 1.00 | 1 |
| | 5-14" | C-6 | 11.8 | 4.5 | 0.35 | 0.65 | 0.05 | 0.95 | 5 | 0.50 | 0.50 | 0.35 | 0.65 | 3 |
| | 5-15" | C-7 | 40.4 | 0.8 | 0.85 | 0.15 | — | 1.00 | 3 | 0.45 | 0.55 | 0.25 | 0.75 | 7 |
| | 5-16" | C-8 | 7.7 | 2.5 | 0.75 | 0.25 | 0.40 | 0.60 | 5 | 0.65 | 0.35 | — | 1.00 | 0.5 |

TABLE 5-23

| Classification | | Upper hard layer | | Number of drilled holes |
| --- | --- | --- | --- | --- |
| | | Composition | Target thickness (μm) | |
| Coated cemented carbide drills of the present invention | 5-9" | α-$Al_2O_3$ | 4 | 2125 |
| | 5-10" | κ-$Al_2O_3$ | 1 | 2710 |
| | 5-11" | Mixed layer ① | 0.5 | 2849 |
| | 5-12" | Mixed layer ② | 2 | 1207 |
| | 5-13" | α-$Al_2O_3$ | 1 | 669 |
| | 5-14" | κ-$Al_2O_3$ | 1.5 | 1286 |
| | 5-15" | Mixed layer ① | 2 | 503 |
| | 5-16" | Mixed layer ② | 0.5 | 469 |

TABLE 5-24

| Classification | | Cemented carbide substrate | | Primary tough layer Target thickness (μm) | Lower hard layer | | | | |
| --- | --- | --- | --- | --- | --- | --- | --- | --- | --- |
| | Symbol of cemented carbide | Average depth from the surface of amorphous layer (nm) | | | First layer | | Second layer | | |
| | | | | | Target composition (atomic ratio) Ti Al C N | Target thickness (μm) | Target composition (atomic ratio) Ti Al C N | Target thickness (μm) | |
| Conventional coated cemented carbide drills | 5-1" | C5-1 | — | — | the same as the coated cemented carbide drill 5-1" of the present invention | | | | |
| | 5-2" | C5-2 | — | — | the same as the coated cemented carbide drill 5-2" of the present invention | | | | |
| | 5-3" | C5-3 | — | — | the same as the coated cemented carbide drill 5-3" of the present invention | | | | |
| | 5-4" | C5-4 | — | — | the same as the coated cemented carbide drill 5-4" of the present invention | | | | |
| | 5-5" | C5-5 | — | — | the same as the coated cemented carbide drill 5-5" of the present invention | | | | |
| | 5-6" | C5-6 | — | — | the same as the coated cemented carbide drill 5-6" of the present invention | | | | |
| | 5-7" | C5-7 | — | — | the same as the coated cemented carbide drill 5-7" of the present invention | | | | |
| | 5-8" | C5-8 | — | — | the same as the coated cemented carbide drill 5-8" of the present invention | | | | |

TABLE 5-25

| Classification | | Composition | Upper hard layer Target thickness (μm) | Number of drilled holes |
|---|---|---|---|---|
| Conventional coated cemented carbide drills | 5-1" | the same as the coated cemented carbide drill 5-1" of the present invention | | Failure at 451** |
| | 5-2" | the same as the coated cemented carbide drill 5-2" of the present invention | | Failure at 410* |
| | 5-3" | the same as the coated cemented carbide drill 5-3" of the present invention | | Failure at 422** |
| | 5-4" | the same as the coated cemented carbide drill 5-4" of the present invention | | Failure at 238** |
| | 5-5" | the same as the coated cemented carbide drill 5-5" of the present invention | | Failure at 246* |
| | 5-6" | the same as the coated cemented carbide drill 5-6" of the present invention | | Failure at 206* |
| | 5-7" | the same as the coated cemented carbide drill 5-7" of the present invention | | Failure at 97** |
| | 5-8" | the same as the coated cemented carbide drill 5-8" of the present invention | | Failure at 88* |

*indicates that failure was caused by chipping at the cutting edge, and
**indicates that failure was caused by peeling in the wear-resistant coating layer

TABLE 5-26

| Classification | | Cemented carbide substrate Symbol of cemented carbide substrate | Average depth from the surface of amorphous layer (nm) | Primary tough layer Target thickness (μm) | Lower hard layer | | | | | | | | | |
|---|---|---|---|---|---|---|---|---|---|---|---|---|---|---|
| | | | | | First layer | | | | | Second layer | | | | |
| | | | | | Target composition (atomic ratio) | | | | Target thickness (μm) | Target composition (atomic ratio) | | | | Target thickness (μm) |
| | | | | | Ti | Al | C | N | | Ti | Al | C | N | |
| Conventional coated cemented carbide drills | 5-9" | C5-1 | — | — | the same as the coated cemented carbide drill 5-9" of the present invention | | | | | | | | | |
| | 5-10" | C5-2 | — | — | the same as the coated cemented carbide drill 5-10" of the present invention | | | | | | | | | |
| | 5-11" | C5-3 | — | — | the same as the coated cemented carbide drill 5-11" of the present invention | | | | | | | | | |
| | 5-12" | C5-4 | — | — | the same as the coated cemented carbide drill 5-12" of the present invention | | | | | | | | | |
| | 5-13" | C5-5 | — | — | the same as the coated cemented carbide drill 5-13" of the present invention | | | | | | | | | |
| | 5-14" | C5-6 | — | — | the same as the coated cemented carbide drill 5-14" of the present invention | | | | | | | | | |
| | 5-15" | C5-7 | — | — | the same as the coated cemented carbide drill 5-15" of the present invention | | | | | | | | | |
| | 5-16" | C5-8 | — | — | the same as the coated cemented carbide drill 5-16" of the present invention | | | | | | | | | |

TABLE 5-27

| Classification | | Composition | Upper hard layer Target thickness (μm) | Number of drilled holes |
|---|---|---|---|---|
| Conventional coated cemented carbide drills | 5-9" | the same as the coated cemented carbide drill 5-9" of the present invention | | Failure at 473** |
| | 5-10" | the same as the coated cemented carbide drill 5-10" of the present invention | | Failure at 408* |
| | 5-11" | the same as the coated cemented carbide drill 5-11" of the present invention | | Failure at 396* |
| | 5-12" | the same as the coated cemented carbide drill 5-12" of the present invention | | Failure at 212* |
| | 5-13" | the same as the coated cemented carbide drill 5-13" of the present invention | | Failure at 302** |
| | 5-14" | the same as the coated cemented carbide drill 5-14" of the present invention | | Failure at 238* |

TABLE 5-27-continued

| Classification | Upper hard layer | | Number of drilled holes |
|---|---|---|---|
| | Composition | Target thickness (μm) | |
| 5-15" | the same as the coated cemented carbide drill 5-15" of the present invention | | Failure at 91* |
| 5-16" | the same as the coated cemented carbide drill 5-16" of the present invention | | Failure at 105** |

*indicates that failure was caused by chipping at the cutting edge, and
**indicates that failure was caused by peeling in the wear-resistant coating layer The composition and the thickness of the hard coating layer of the coated cemented carbide inserts 5-1 to 5-20 of the present invention, the coated cemented carbide end mills 5-1' to 5-16' of the present invention, and the coated cemented carbide drills 5-1" to 5-16" of the present invention as the coated cemented carbide tool of the present invention as well as the conventional coated cemented carbide inserts 5-1 to 5-20, the conventional coated cemented carbide end mills 5-1' to 5-16', and the conventional coated cemented carbide drills 5-1" to 5-16" as the conventional coated cemented carbide tool were measured by using an energy-dispersive X-ray measuring apparatus, an Auger spectrometer, and a scanning electron microscope. As a result, they exhibited the composition and average thickness (compared with an average value of thicknesses measured at five points), which are substantially the same as the target composition and the target average thickness in Table 5-3 to Table 5-10 and Table 5-12 to Table 5-27.

What is claimed is:

1. A cutting tool made of a surface-coated carbide alloy having a wear-resistant coating layer which has excellent adhesion, comprising:
    a tungsten carbide-based carbide alloy substrate having an amorphous layer formed by an arc ion plating surface treatment in an average depth of 1 to 50 nm from the surface; and
    a wear-resistant coating layer deposited chemically and/or physically on the surface of the tungsten carbide-based carbide alloy substrate,
    wherein the wear-resistant coating layer comprises one layer or a plurality of two or more layers selected from the group consisting of a layer of carbide of Ti, a layer of nitride of Ti, a layer of carbonitride of Ti, a layer of carboxide of Ti and a layer of carbonitroxide of Ti, and mixtures thereof; and
    wherein the amorphous layer comprises an amorphous substance formed from the tungsten carbide-based carbide alloy substrate, and
    wherein said wear-resistant coating layer has an average thickness of 1 to 15 μm.

2. The cutting tool according to claim 1, wherein said amorphous layer is formed by
    a first step of subjecting the surface of the tungsten carbide-based carbide alloy substrate to a pretreatment with using a cathode electrode under the conditions that an atmospheric gas is Ar and a bias pressure applied to the tungsten carbide-base carbide alloy substrate is −800 to −1000 V and
    a second step of subjecting the tungsten carbide-based carbide alloy substrate to said arc ionic surface treatment occurs in the presence of a metallic Ti cathode under the conditions that an atmospheric gas is Ar and a bias pressure applied to the tungsten carbide-based carbide alloy substrate is −900 to −1200 V.

3. A cutting tool made of a surface-coated carbide alloy having a hard coating layer which has excellent adhesion, comprising:
    a tungsten carbide-based carbide alloy substrate having an amorphous layer formed by an arc ion plating surface treatment to an average depth of 1 to 50 nm from the surface; and
    a single-layered or multi-layered hard coating layer deposited physically on the surface of the tungsten carbide-based carbide alloy substrate, and
    wherein the amorphous layer comprises an amorphous substance formed from the tungsten carbide-based carbide alloy substrate, and
    wherein the single-layered or multi-layered hard coating layer comprises either or both of a composite nitride layer of Ti and Al and a composite carbonitride layer of Ti and Al, which respectively satisfy the composition formula: $(Ti_{1-X}Al_X)N$ and the composition formula: $(Ti_{1-X}Al_X)C_{1-Y}N_Y$, wherein X represents 0.15 to 0.65 and Y represents 0.5 to 0.99 in terms of an atomic ratio, and said single-layered or multi-layered hard coating layer having average thickness of 0.5 to 15 μm.

4. The cutting tool according to claim 3, wherein said amorphous layer is formed by
    a first step of subjecting the surface of the tungsten carbide-based carbide alloy substrate to a pretreatment without using a cathode electrode under the conditions that an atmospheric gas is Ar and a bias pressure applied to the tungsten carbide-based carbide alloy substrate is −800 to −1000 V and
    a second step of subjecting the tungsten carbide-based carbide alloy substrate to said arc ionic surface treatment occurs in the presence of a metallic Ti cathode under the conditions that an atmospheric gas is Ar and a bias pressure applied to the tungsten carbide-based carbide alloy substrate is −900 to −1200 V.

5. A cutting tool made of a surface-coated carbide alloy having a wear-resistant coating layer which has excellent adhesion and chipping resistance, comprising:
    a tungsten carbide-based carbide alloy substrate having an amorphous layer formed by an arc ion plating surface treatment to an average depth of 1 to 50 nm from the surface; and
    a wear-resistant coating layer deposited physically on the surface of the tungsten carbide-based carbide alloy substrate,
    wherein the amorphous layer comprises an amorphous substance formed from the tungsten carbide-based carbide alloy substrate, and
    wherein said wear-resistant coating layer comprises:
    a primary tough layer which comprises a titanium nitride layer and has an average thickness of 0.1 to 5 μm; and a single-layered or multi-layered surface hard layer which comprises either or both of a composite nitride layer of Ti and Al and a composite carbonitride layer of Ti and Al, which respectively satisfy the composition formula: $(Ti_{1-X}Al_X)N$ and the composition formula: $(Ti_{1-X}Al_X)C_{1-Y}N_Y$, wherein X represents 0.15 to 0.65 and Y represents 0.5 to 0.99 in terms of an atomic ratio, and said single-layered or multi-layered hard coating layer having an average thickness of 0.5 to 15 µm.

6. A cutting tool made of a surface-coated carbide alloy having a wear-resistant coating layer which has excellent adhesion, comprising:

a tungsten carbide-based carbide alloy substrate having an amorphous layer formed by an arc ion plating surface treatment in an average depth of 1 to 50 nm from the surface; and a wear-resistant coating layer deposited physically and/or chemically on the surface of the tungsten carbide-based carbide alloy substrate, wherein the amorphous layer comprises an amorphous substance formed from the tungsten carbide-based carbide alloy substrate, and wherein the wear-resistant coating layer comprises:

a lower coating layer which comprises one layer or a plurality of two or more layers selected from the group consisting of a layer of carbide of Ti, a layer of nitride of Ti, a layer of carbonitride of Ti, a layer of carboxide of Ti a layer of carbonitroxide of Ti, and mixtures thereof;

and wherein said lower coating layer has an average thickness of 0.5 to 15 µm; and an upper coating layer which comprises either or both of an aluminum oxide layer and an aluminum oxide-zirconium oxide mixed layer comprising a matrix of aluminum oxide and a zirconium oxide phase dispersed and distributed therein, and wherein said upper coating layer has an average thickness of 0.5 to 15 µm.

7. The cutting tool according to claim 6, wherein said amorphous layer is formed by a first step of subjecting the surface of the tungsten carbide-based carbide alloy substrate to a pretreatment without using a cathode electrode under the conditions that an atmospheric gas is Ar and a bias pressure applied to the tungsten carbide-based carbide alloy substrate is −800 to −1000 V and a second step of subjecting the tungsten carbide-based carbide alloy substrate to said arc ionic surface treatment occurs in the presence of a metallic Ti cathode under the conditions that an atmospheric gas is Ar and a bias pressure applied to the tungsten carbide-based carbide alloy substrate is −900 to −1200 V.

8. A cutting tool made of a surface-coated carbide alloy having a wear-resistant coating layer which has excellent adhesion and chipping resistance, comprising:

a tungsten carbide-based carbide alloy substrate having an amorphous layer formed by an arc ion plating surface treatment in an average depth of 1 to 50 nm from the surface; and a wear-resistant coating layer deposited physically and/or chemically on the surface of the tungsten carbide-based carbide alloy substrate, wherein the amorphous layer comprises an amorphous substance formed from the tungsten carbide-based carbide alloy substrate, and wherein the wear-resistant coating layer comprises:

a primary tough layer which comprises a titanium nitride layer and has an average thickness of 0.1 to 5 µm;

a single-layered or multi-layered lower hard layer which comprises either or both of a composite nitride layer of Ti and Al and a composite carbonitride layer of Ti and Al, which respectively satisfy the composition formula: $(Ti_{1-X}Al_X)N$ and the composition formula: $(Ti_{1-X}Al_X)C_{1-Y}N_Y$, wherein X represents 0.15 to 0.65 and Y represents 0.5 to 0.99 in terms of an atomic ratio, and wherein the single-layered or multi-layered lower hard layer has an average thickness of 0.5 to 15 µm; and a single-layered or multi-layered upper hard layer which comprises either or both of an aluminum oxide layer and an aluminum oxide-zirconium oxide mixed layer made of a matrix of aluminum oxide and a zirconium oxide phase dispersed and distributed therein, and wherein the single-layered or multi-layered upper hard layer has an average thickness of 0.5 to 10 µm.

* * * * *